(12) United States Patent
Gray et al.

(10) Patent No.: US 11,914,812 B2
(45) Date of Patent: Feb. 27, 2024

(54) CURRENT REFERENCE OPERATIVE DRIVE-SENSE CIRCUIT (DSC)

(71) Applicant: SigmaSense, LLC., Wilmington, DE (US)

(72) Inventors: Patrick Troy Gray, Cedar Park, TX (US); Daniel Keith Van Ostrand, Leander, TX (US); Richard Stuart Seger, Jr., Belton, TX (US); Phuong Huynh, Fairfax, VA (US)

(73) Assignee: SigmaSense, LLC., Wilmington, DE (US)

( * ) Notice: Subject to any disclaimer, the term of this patent is extended or adjusted under 35 U.S.C. 154(b) by 135 days.

(21) Appl. No.: 17/488,626

(22) Filed: Sep. 29, 2021

(65) Prior Publication Data

US 2022/0018682 A1    Jan. 20, 2022

Related U.S. Application Data

(63) Continuation-in-part of application No. 17/301,784, filed on Apr. 14, 2021, which is a continuation of
(Continued)

(51) Int. Cl.
| G06F 3/041 | (2006.01) |
| G11C 16/26 | (2006.01) |
| G01R 27/16 | (2006.01) |

(52) U.S. Cl.
CPC ......... *G06F 3/04166* (2019.05); *G01R 27/16* (2013.01); *G11C 16/26* (2013.01)

(58) Field of Classification Search
CPC ...... G06F 3/04166; G01R 27/16; G11C 16/26
See application file for complete search history.

(56) References Cited

U.S. PATENT DOCUMENTS

| 5,437,178 A | 8/1995 | Esin et al. |
| 6,218,972 B1 | 4/2001 | Groshong |

(Continued)

FOREIGN PATENT DOCUMENTS

| CN | 103995626 A | 8/2014 |
| CN | 104182105 A | 12/2014 |

(Continued)

OTHER PUBLICATIONS

Baker; How delta-sigma ADCs work, Part 1; Analog Applications Journal; Oct. 1, 2011; 6 pgs.
(Continued)

*Primary Examiner* — Premal R Patel
(74) *Attorney, Agent, or Firm* — Garlick & Markison; Timothy W. Markison; Shayne X. Short

(57) ABSTRACT

A current reference operative drive-sense circuit (DSC) includes a current source operably coupled to a load and a voltage-mode analog to digital converter (ADC). When enabled, the current source configured to drive a sinusoidal current reference signal to the load thereby generating a load voltage that is based on the sinusoidal current reference signal and an impedance of the load. The voltage-mode ADC is operably coupled the load and to the current source. When enabled, the voltage-mode ADC configured to perform digital sampling of the load voltage and to generate a digital signal that is representative of the load voltage. In some implementations, one or more processing modules configured to execute operational instructions to process the digital signal that is representative of the load voltage in accordance with determining impedance of the load and/or change of impedance of the load.

20 Claims, 42 Drawing Sheets

Related U.S. Application Data application No. 16/113,379, filed on Aug. 27, 2018, now Pat. No. 11,099,032.

(56) References Cited

U.S. PATENT DOCUMENTS

| | | |
|---|---|---|
| 6,665,013 B1 | 12/2003 | Fossum et al. |
| 7,476,233 B1 | 1/2009 | Wiener et al. |
| 7,528,755 B2 | 5/2009 | Hammerschmidt |
| 8,031,094 B2 | 10/2011 | Hotelling et al. |
| 8,089,289 B1 | 1/2012 | Kremin et al. |
| 8,279,180 B2 | 10/2012 | Hotelling et al. |
| 8,537,110 B2 | 9/2013 | Kruglick |
| 8,547,114 B2 | 10/2013 | Kremin |
| 8,587,535 B2 | 11/2013 | Oda et al. |
| 8,625,726 B2 | 1/2014 | Kuan |
| 8,657,681 B2 | 2/2014 | Kim |
| 8,966,400 B2 | 2/2015 | Yeap |
| 8,982,097 B1 | 3/2015 | Kuzo et al. |
| 9,081,437 B2 | 7/2015 | Oda |
| 9,201,547 B2 | 12/2015 | Elias |
| 10,007,335 B2 | 6/2018 | Hyoung-Gon |
| 2003/0052657 A1 | 3/2003 | Koernle et al. |
| 2005/0235758 A1 | 10/2005 | Kowal et al. |
| 2011/0063154 A1 | 3/2011 | Hotelling et al. |
| 2011/0298745 A1 | 12/2011 | Souchkov |
| 2012/0278031 A1 | 11/2012 | Oda |
| 2013/0278447 A1 | 10/2013 | Kremin |
| 2013/0307616 A1 | 11/2013 | Berchtold |
| 2014/0327644 A1 | 11/2014 | Mohindra |
| 2015/0091847 A1 | 4/2015 | Chang |
| 2015/0346889 A1 | 12/2015 | Chen |
| 2016/0162002 A1 | 6/2016 | Liang |
| 2016/0188049 A1 | 6/2016 | Yang et al. |
| 2017/0205928 A1* | 7/2017 | Noguchi ............... H05K 1/147 |
| 2018/0157354 A1 | 6/2018 | Blondin et al. |
| 2018/0275824 A1 | 9/2018 | Li |
| 2019/0073060 A1* | 3/2019 | Wen .................... G06F 3/04166 |
| 2021/0303152 A1* | 9/2021 | Hosur .................... G06F 3/044 |

FOREIGN PATENT DOCUMENTS

| | | |
|---|---|---|
| CN | 104536627 A | 4/2015 |
| CN | 107771273 A | 3/2018 |
| EP | 2284637 A1 | 2/2011 |
| JP | 59135685 A | 8/1984 |
| KR | 102015002202 A | 1/2015 |

OTHER PUBLICATIONS

Brian Pisani, "Digital Filter Types in Delta-Sigma ADCs", Application Report SBAA230, May 2017, pp. 1-8, Texas Instruments Incorporated, Dallas, Texas.

International Search Authority; International Search Report and Written Opinion; Application No. PCT/US2019/048081; dated Dec. 12, 2019; 8 pgs.

European Patent Office; Extended European Search Report; Application No. 19853507.2; dated Jun. 13, 2023; 7 pgs.

* cited by examiner communication system 10 computing device 12 computing device 14 computing device 18

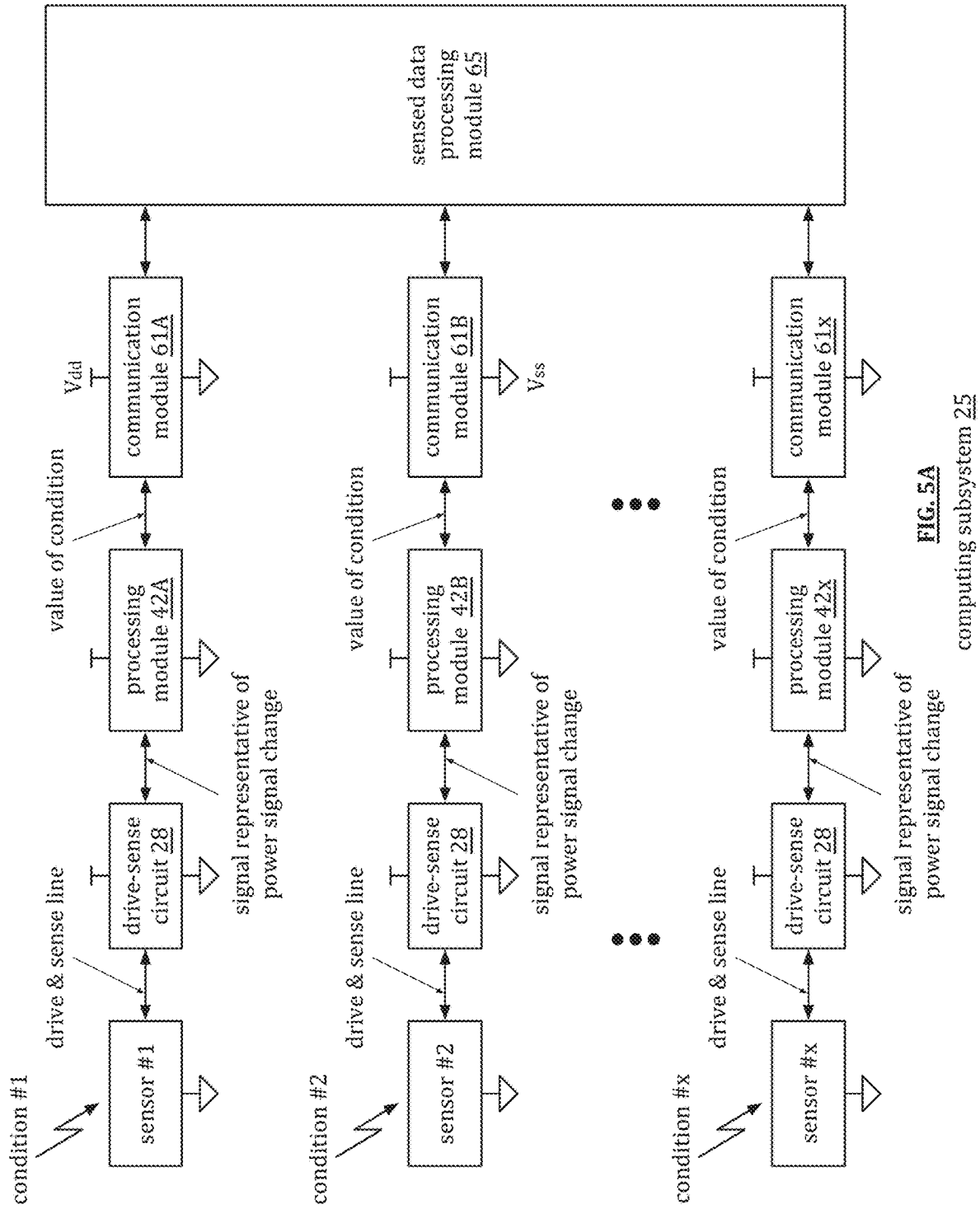

computing subsystem 25 computing subsystem 25

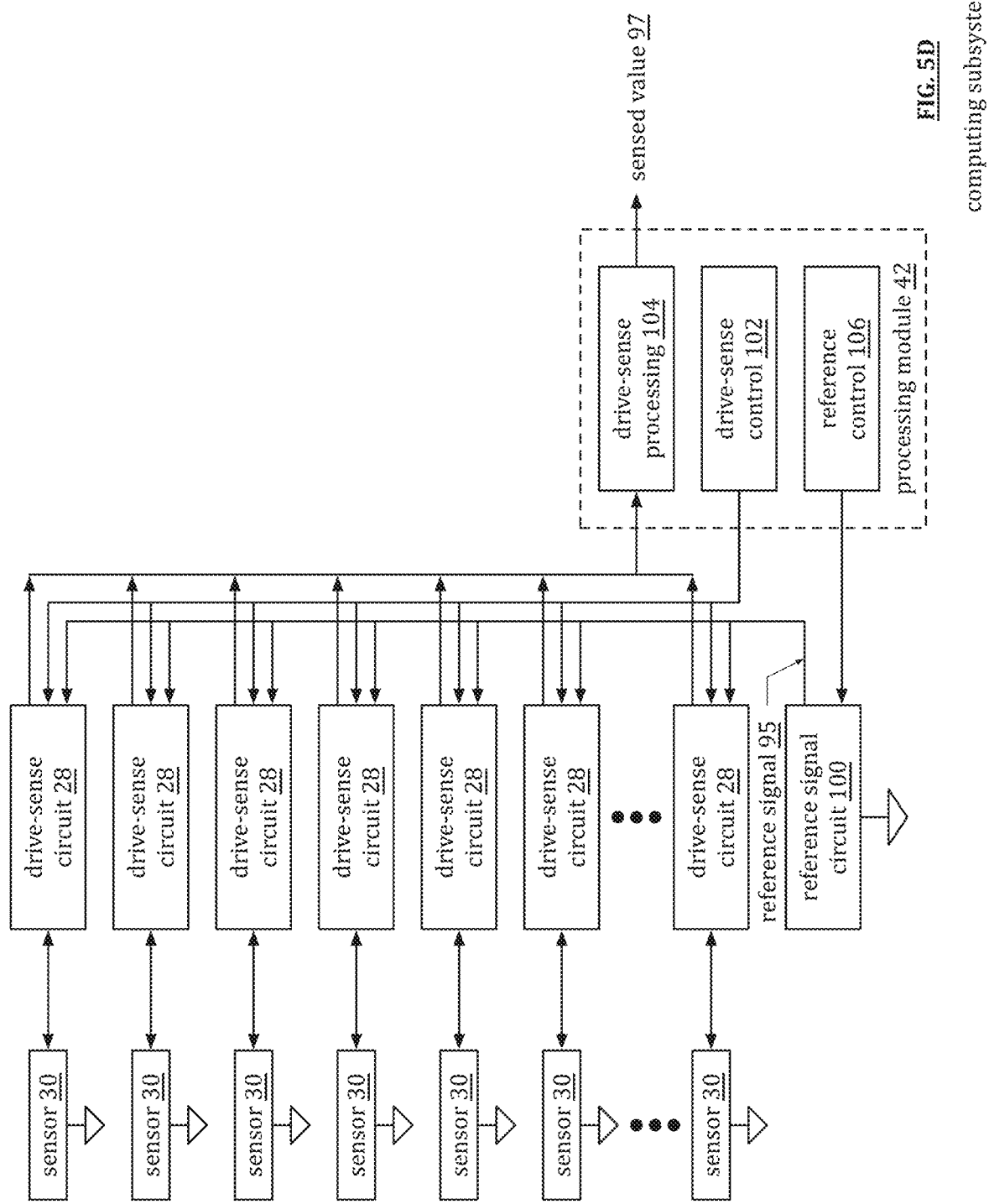

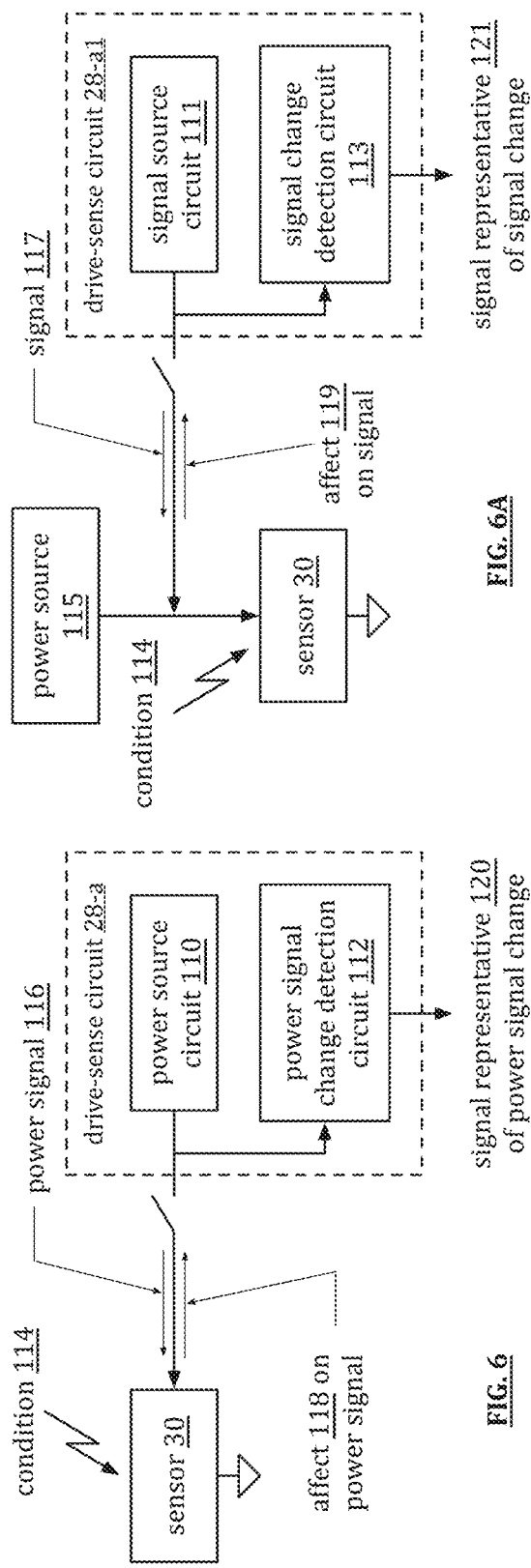
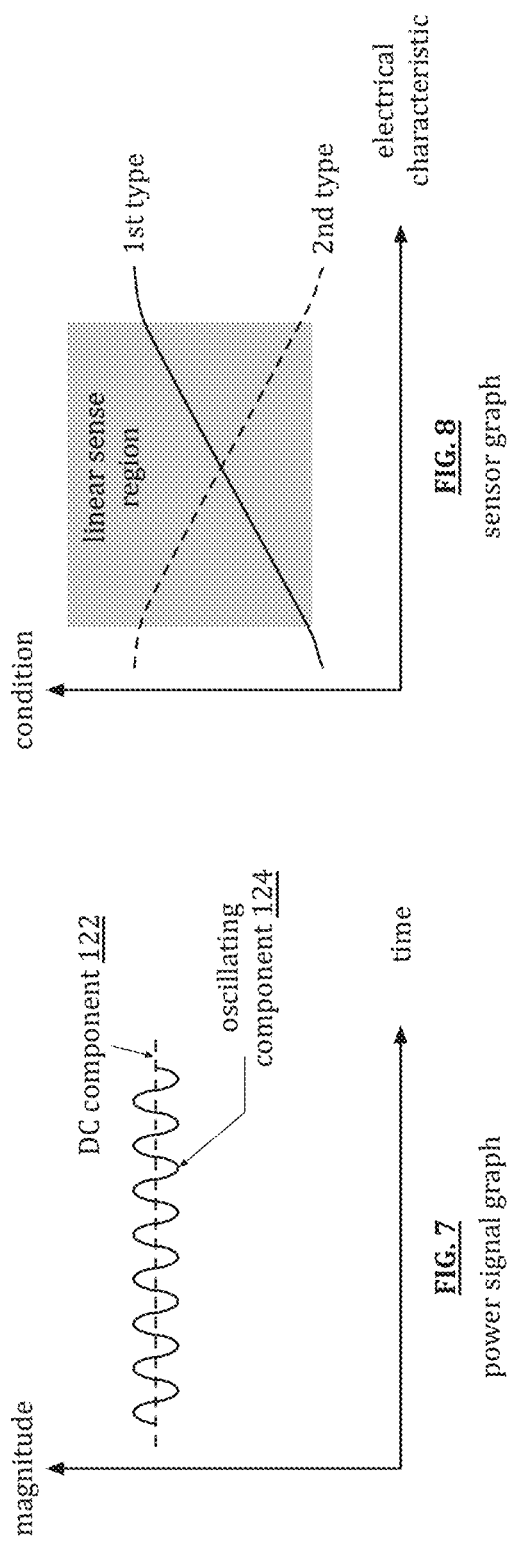

power signal graph power signal graph power signal graph power signal graph drive-sense circuit 28 drive-sense circuit 28 drive-sense circuit 28-g1 drive-sense circuit 28-g2 drive-sense circuit 28-h1 drive-sense circuit 28-h2

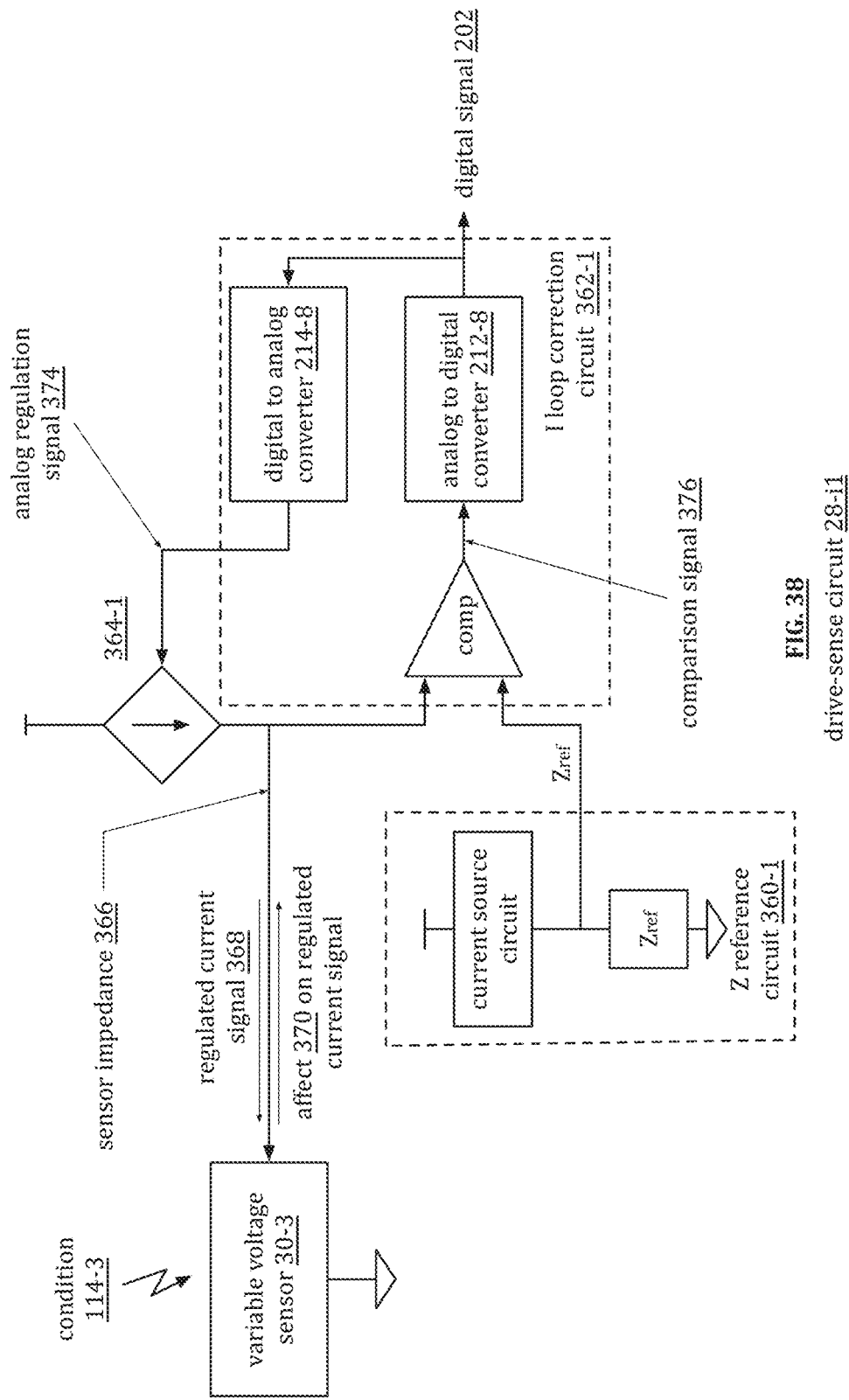

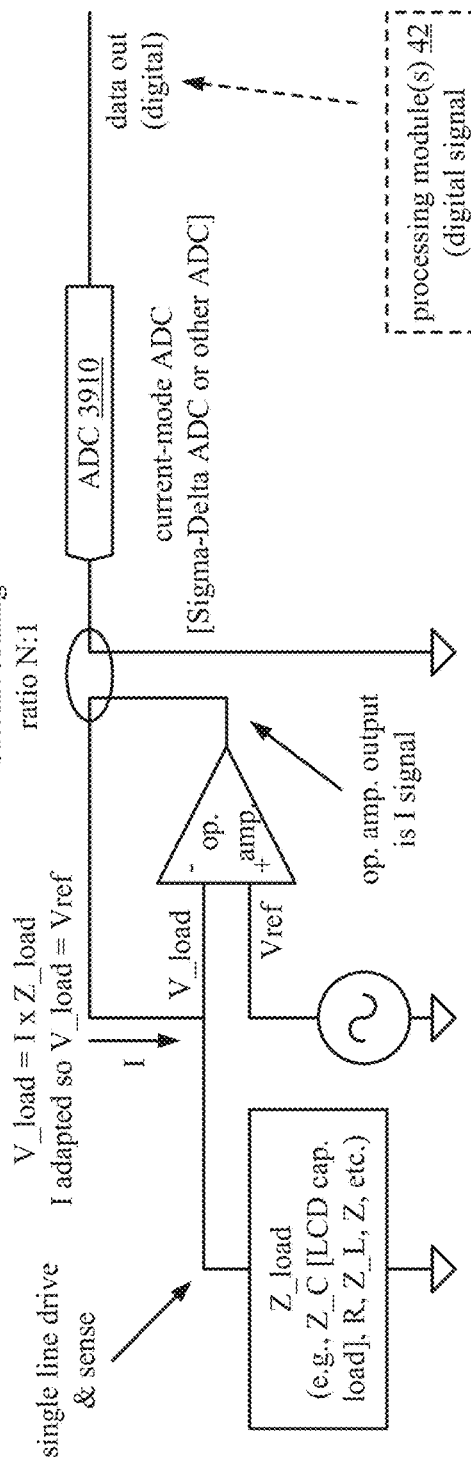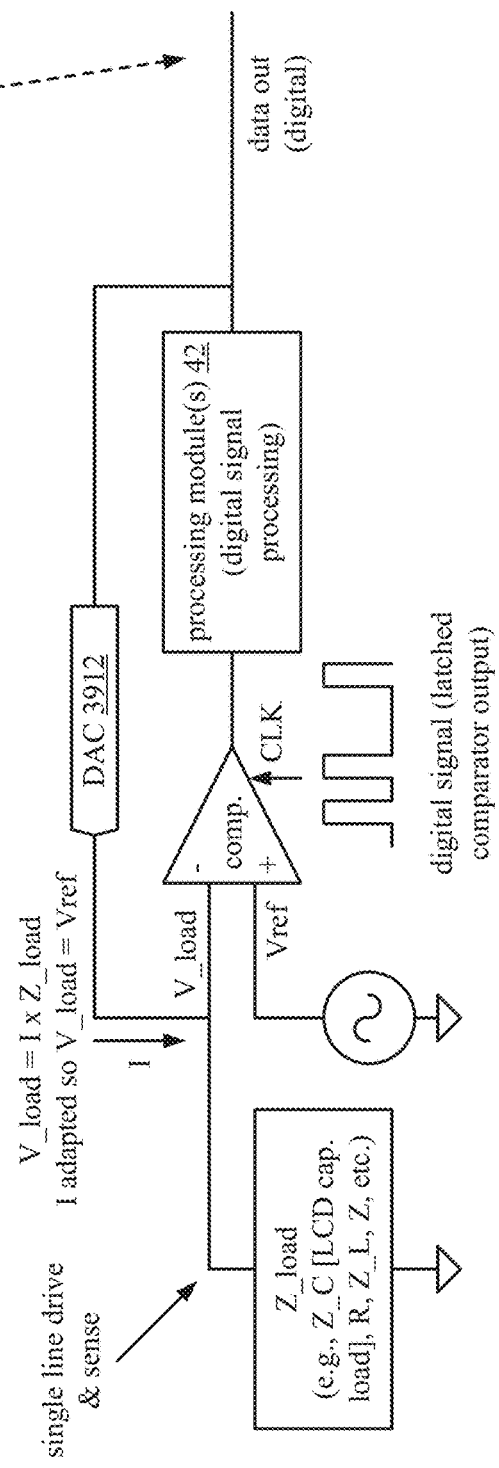

no feedback no feedback

4100

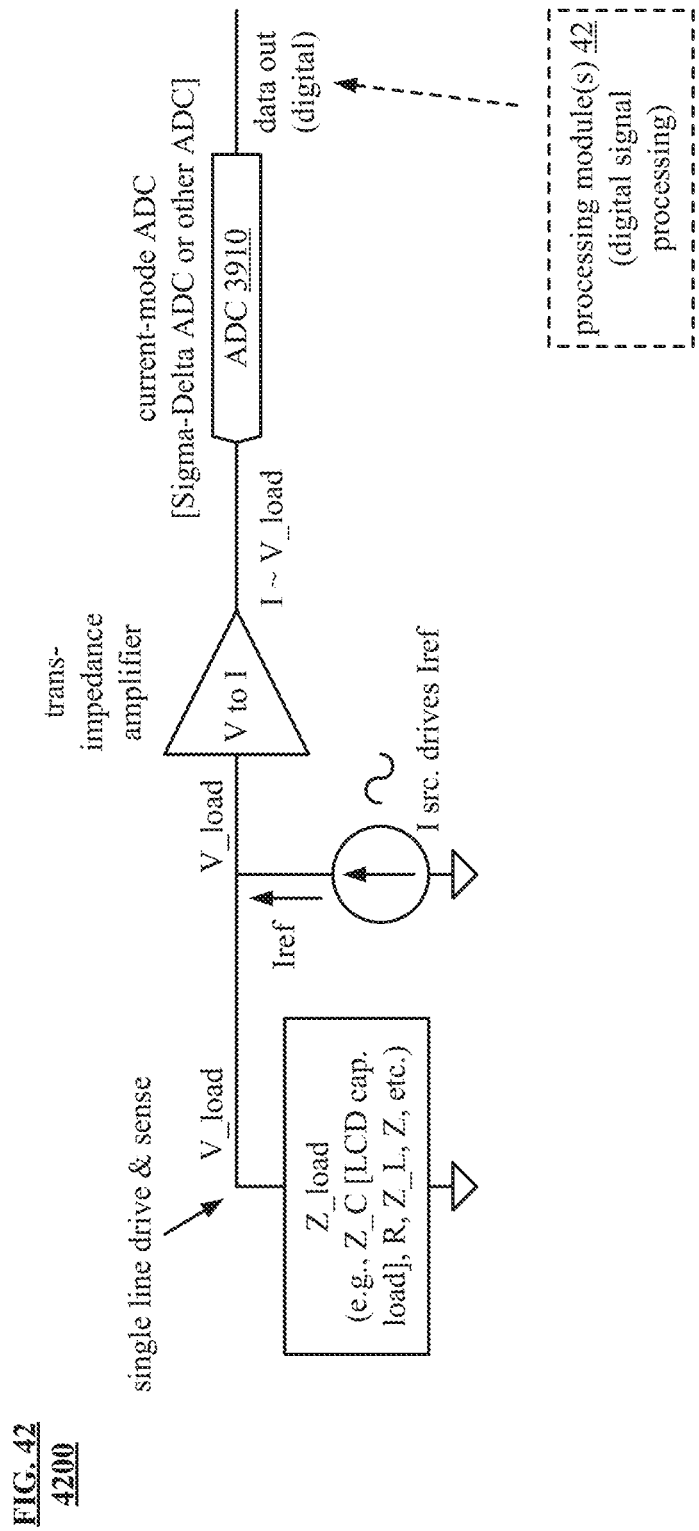

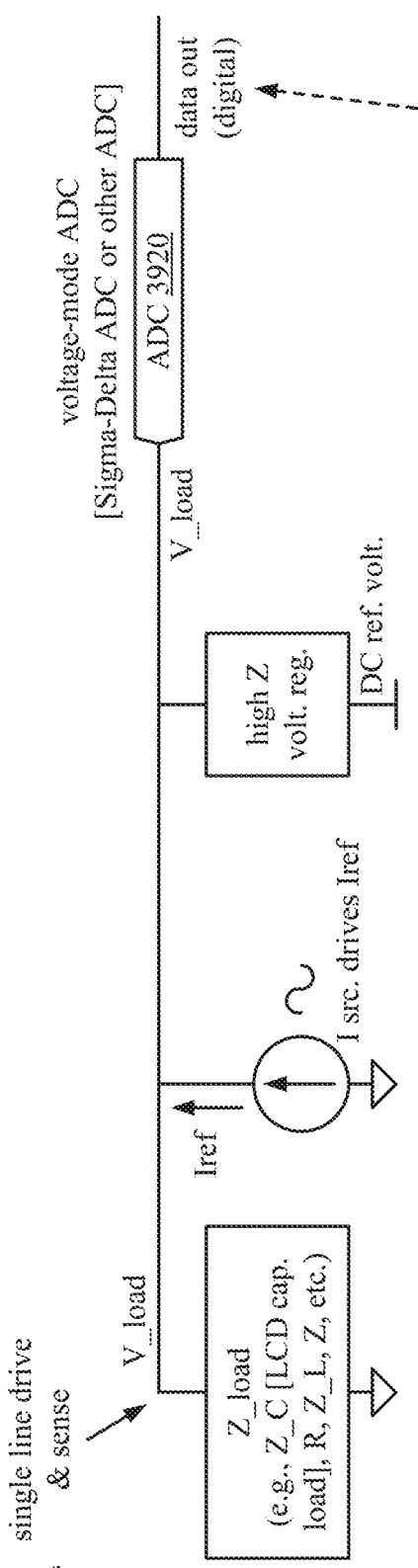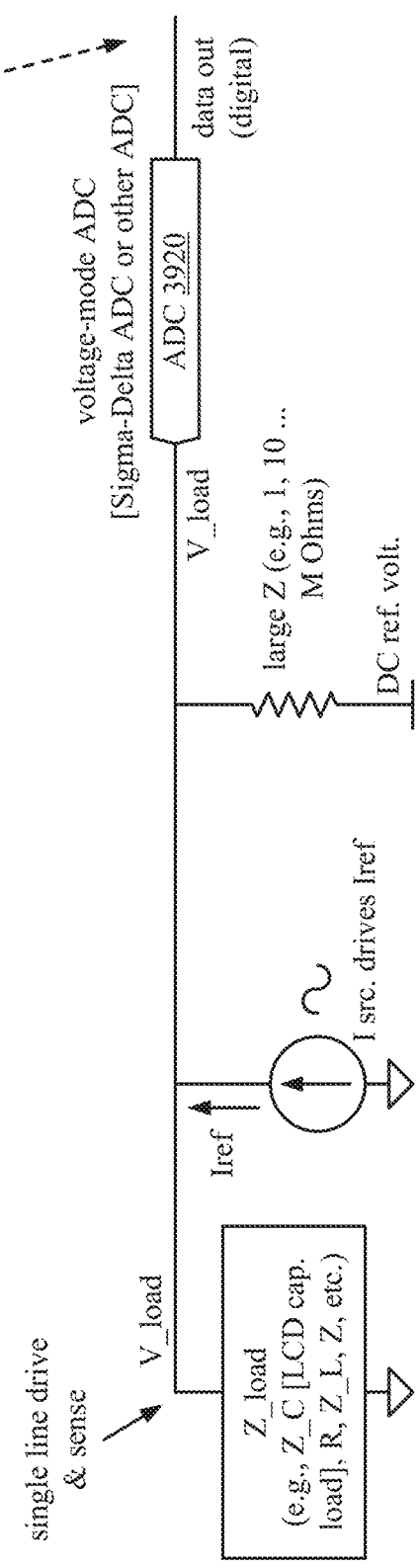

4400

CURRENT REFERENCE OPERATIVE DRIVE-SENSE CIRCUIT (DSC)

CROSS REFERENCE TO RELATED PATENTS/PATENT APPLICATIONS

The present U.S. Utility Patent Applications claims priority pursuant to 35 U.S.C. § 120 as a continuation-in-part (CIP) of U.S. Utility application Ser. No. 17/301,784, entitled "Voltage Detect Drive Sense Circuit," filed Apr. 14, 2021, pending, which claims priority pursuant to 35 U.S.C. § 120 as a continuation of U.S. Utility application Ser. No. 16/113,379, entitled "Drive Sense Circuit With Drive-Sense Line," filed Aug. 27, 2018, now issued as U.S. Pat. No. 11,099,032 on Aug. 24, 2021, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to data communication systems and more particularly to sensed data collection and/or communication.

Description of Related Art

Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touch-screens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touch screen. As yet another example, the computing device processes the sensor signals to determine various data points in a production line of a product.

BRIEF DESCRIPTION OF THE SEVERAL VIEWS OF THE DRAWING(S)

FIG. 5A is a schematic plot diagram of a computing subsystem in accordance with the present invention;

FIG. 5D is a schematic block diagram of another embodiment of a computing subsystem in accordance with the present invention;

FIG. 6 is a schematic block diagram of an embodiment of a drive sense circuit in accordance with the present invention;

FIG. 6A is a schematic block diagram of another embodiment of a drive sense circuit in accordance with the present invention;

FIG. 7 is an example of a power signal graph in accordance with the present invention;

FIG. 8 is an example of a sensor graph in accordance with the present invention;

FIG. 38 is a schematic block diagram of another embodiment of a drive sense circuit in accordance with the present invention;

FIG. 39A is a schematic block diagram of another embodiment of a drive sense circuit in accordance with the present invention;

FIG. 39B is a schematic block diagram of another embodiment of a drive sense circuit in accordance with the present invention;

FIG. 42 is a schematic block diagram of another embodiment of a drive sense circuit in accordance with the present invention;

FIG. 43A is a schematic block diagram of another embodiment of a drive sense circuit in accordance with the present invention;

FIG. 43B is a schematic block diagram of another embodiment of a drive sense circuit in accordance with the present invention.

DETAILED DESCRIPTION OF THE INVENTION

Figure 1:
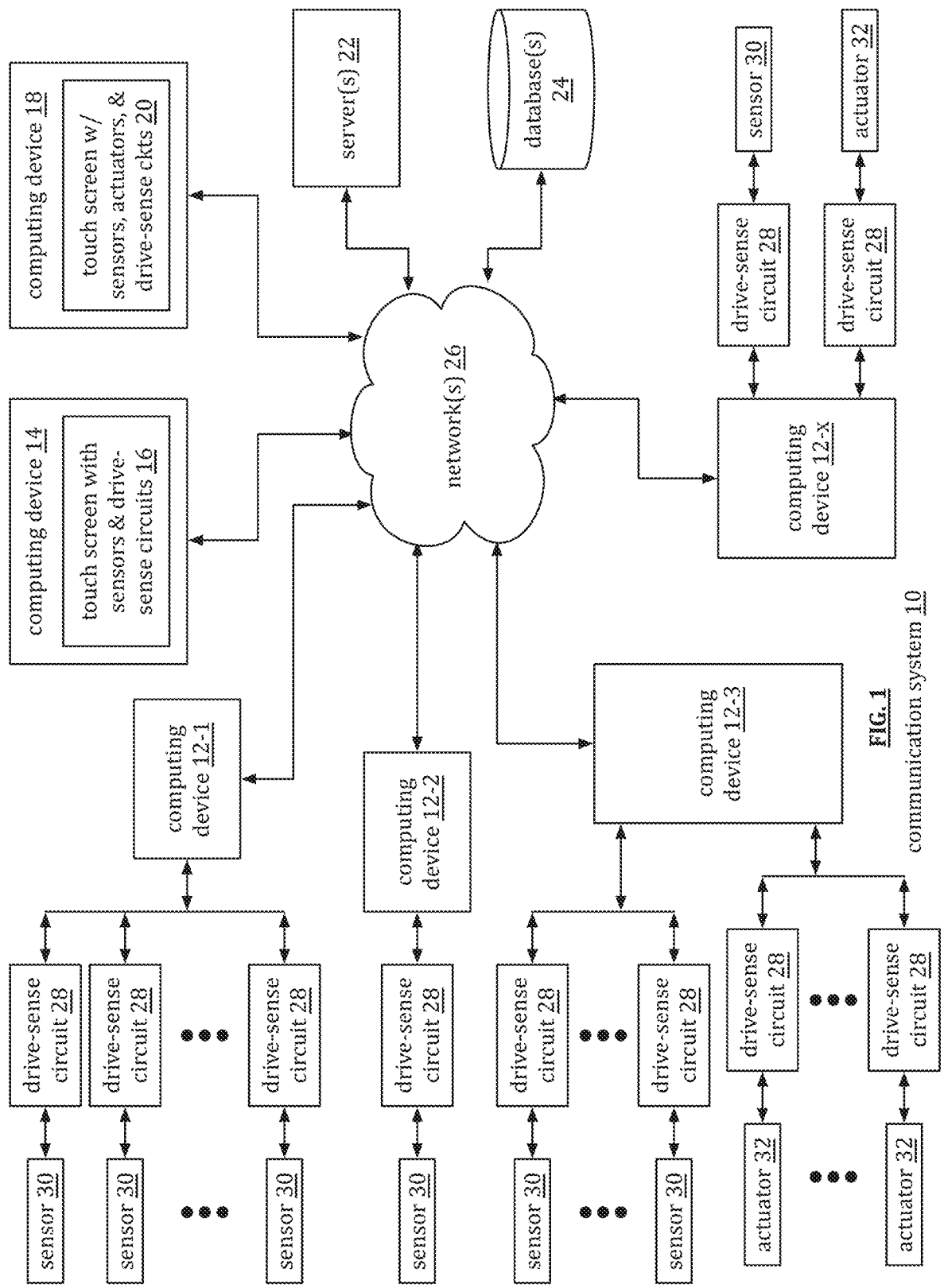
FIG. 1 is a schematic block diagram of an embodiment of a communication system in accordance with the present invention.

FIG. 1 is a schematic block diagram of an embodiment of a communication system 10 that includes a plurality of computing. devices 12-10, one or more servers 22, one or more databases 24, one or more networks 26, a plurality of drive-sense circuits 28, a plurality of sensors 30, and a plurality of actuators 32. Computing devices 14 include a touch screen 16 with sensors and drive-sensor circuits and computing devices 18 include a touch & tactic screen 20 that includes sensors, actuators, and drive-sense circuits.

A sensor 30 functions to convert a physical input into an electrical output and/or an optical output. The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, eclectic field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an eclectic signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

An actuator 32 converts an electrical input into a physical output. The physical output of an actuator may be one of a variety of physical output conditions. For example, the physical output condition includes one or more of, but is not limited to, acoustic waves (e.g., amplitude, phase, polarization, spectrum, and/or wave velocity); a magnetic condition (e.g., flux, permeability, magnetic field, which amplitude, phase, and/or polarization); a thermal condition (e.g., temperature, flux, specific heat, thermal conductivity, etc.); and a mechanical condition (e.g., position, velocity, acceleration, force, strain, stress, pressure, torque, etc.). As an example, a piezoelectric actuator converts voltage into force or pressure. As another example, a speaker converts electrical signals into audible acoustic waves.

An actuator 32 may be one of a variety of actuators. For example, an actuator 32 is one of a comb drive, a digital micro-mirror device, an electric motor, an electroactive polymer, a hydraulic cylinder, a piezoelectric actuator, a pneumatic actuator, a screw jack, a servomechanism, a solenoid, a stepper motor, a shape-memory allow, a thermal bimorph, and a hydraulic actuator.

The various types of actuators have a variety of actuators characteristics that are factors in providing power to the actuator and sending signals to the actuators for desired performance. The actuator characteristics include resistance, reactance, power requirements, sensitivity, range, stability, repeatability, linearity, error, response time, and/or frequency response. For example, the resistance, reactance, and power requirements are factors in determining drive circuit requirements. As another example, sensitivity, stability, and/or linear are factors for generating the signaling to send to the actuator to obtain the desired physical output condition.

The computing devices 12, 14, and 18 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12, 14, and 18 will be discussed in greater detail with reference to one or more of FIGS. 2-4.

A server 22 is a special type of computing device that is optimized for processing large amounts of data requests in parallel. A server 22 includes similar components to that of the computing devices 12, 14, and/or 18 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12, 14, and/or 18 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a standalone separate computing device and/or may be a cloud computing device.

The network 26 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12-1 communicates with a plurality of drive-sense circuits 28, which, in turn, communicate with a plurality of sensors 30. The sensors 30 and/or the drive-sense circuits 28 are within the computing device 12-1 and/or external to it. For example, the sensors 30 may be external to the computing device 12-1 and the drive-sense circuits are within the computing device 12-1. As another example, both the sensors 30 and the drive-sense circuits 28 are external to the computing device 12-1. When the drive-sense circuits 28 are external to the computing device, they are coupled to the computing device 12-1 via wired and/or wireless communication links as will be discussed in greater detail with reference to one or more of FIGS. 5A-5C.

The computing device 12-1 communicates with the drive-sense circuits 28 to; (a) turn them on, (b) obtain data from the sensors (individually and/or collectively), (c) instruct the drive sense circuit on how to communicate the sensed data to the computing device 12-1, (d) provide signaling attributes (e.g., DC level, AC level, frequency, power level, regulated current signal, regulated voltage signal, regulation of an impedance, frequency patterns for various sensors, different frequencies for different sensing applications, etc.) to use with the sensors, and/or (e) provide other commands and/or instructions.

As a specific example, the sensors 30 are distributed along a pipeline to measure flow rate and/or pressure within a section of the pipeline. The drive-sense circuits 28 have their own power source (e.g., battery, power supply, etc.) and are proximally located to their respective sensors 30. At desired time intervals (milliseconds, seconds, minutes, hours, etc.), the drive-sense circuits 28 provide a regulated source signal or a power signal to the sensors 30. An electrical characteristic of the sensor 30 affects the regulated source signal or power signal, which is reflective of the condition (e.g., the flow rate and/or the pressure) that sensor is sensing.

The drive-sense circuits 28 detect the effects on the regulated source signal or power signals as a result of the electrical characteristics of the sensors. The drive-sense circuits 28 then generate signals representative of change to the regulated source signal or power signal based on the detected effects on the power signals. The changes to the regulated source signals or power signals are representative of the conditions being sensed by the sensors 30.

The drive-sense circuits 28 provide the representative signals of the conditions to the computing device 12-1. A representative signal may be an analog signal or a digital signal. In either case, the computing device 12-1 interprets the representative signals to determine the pressure and/or flow rate at each sensor location along the pipeline. The computing device may then provide this information to the server 22, the database 24, and/or to another computing device for storing and/or further processing.

As another example of operation, computing device 12-2 is coupled to a drive-sense circuit 28, which is, in turn, coupled to a senor 30. The sensor 30 and/or the drive-sense circuit 28 may be internal and/or external to the computing device 12-2. In this example, the sensor 30 is sensing a condition that is particular to the computing device 12-2. For example, the sensor 30 may be a temperature sensor, an ambient light sensor, an ambient noise sensor, etc. As described above, when instructed by the computing device 12-2 (which may be a default setting for continuous sensing or at regular intervals), the drive-sense circuit 28 provides the regulated source signal or power signal to the sensor 30 and detects an effect to the regulated source signal or power signal based on an electrical characteristic of the sensor. The drive-sense circuit generates a representative signal of the affect and sends it to the computing device 12-2.

In another example of operation, computing device 12-3 is coupled to a plurality of drive-sense circuits 28 that are coupled to a plurality of sensors 30 and is coupled to a plurality of drive-sense circuits 28 that are coupled to a plurality of actuators 32. The generally functionality of the drive-sense circuits 28 coupled to the sensors 30 in accordance with the above description.

Since an actuator 32 is essentially an inverse of a sensor in that an actuator converts an electrical signal into a physical condition, while a sensor converts a physical condition into an electrical signal, the drive-sense circuits 28 can be used to power actuators 32. Thus, in this example, the computing device 12-3 provides actuation signals to the drive-sense circuits 28 for the actuators 32. The drive-sense circuits modulate the actuation signals on to power signals or regulated control signals, which are provided to the actuators 32. The actuators 32 are powered from the power signals or regulated control signals and produce the desired physical condition from the modulated actuation signals.

As another example of operation, computing device 12-x is coupled to a drive-sense circuit 28 that is coupled to a sensor 30 and is coupled to a drive-sense circuit 28 that is coupled to an actuator 32. In this example, the sensor 30 and the actuator 32 are for use by the computing device 12-x. For example, the sensor 30 may be a piezoelectric microphone and the actuator 32 may be a piezoelectric speaker.

Figure 2:
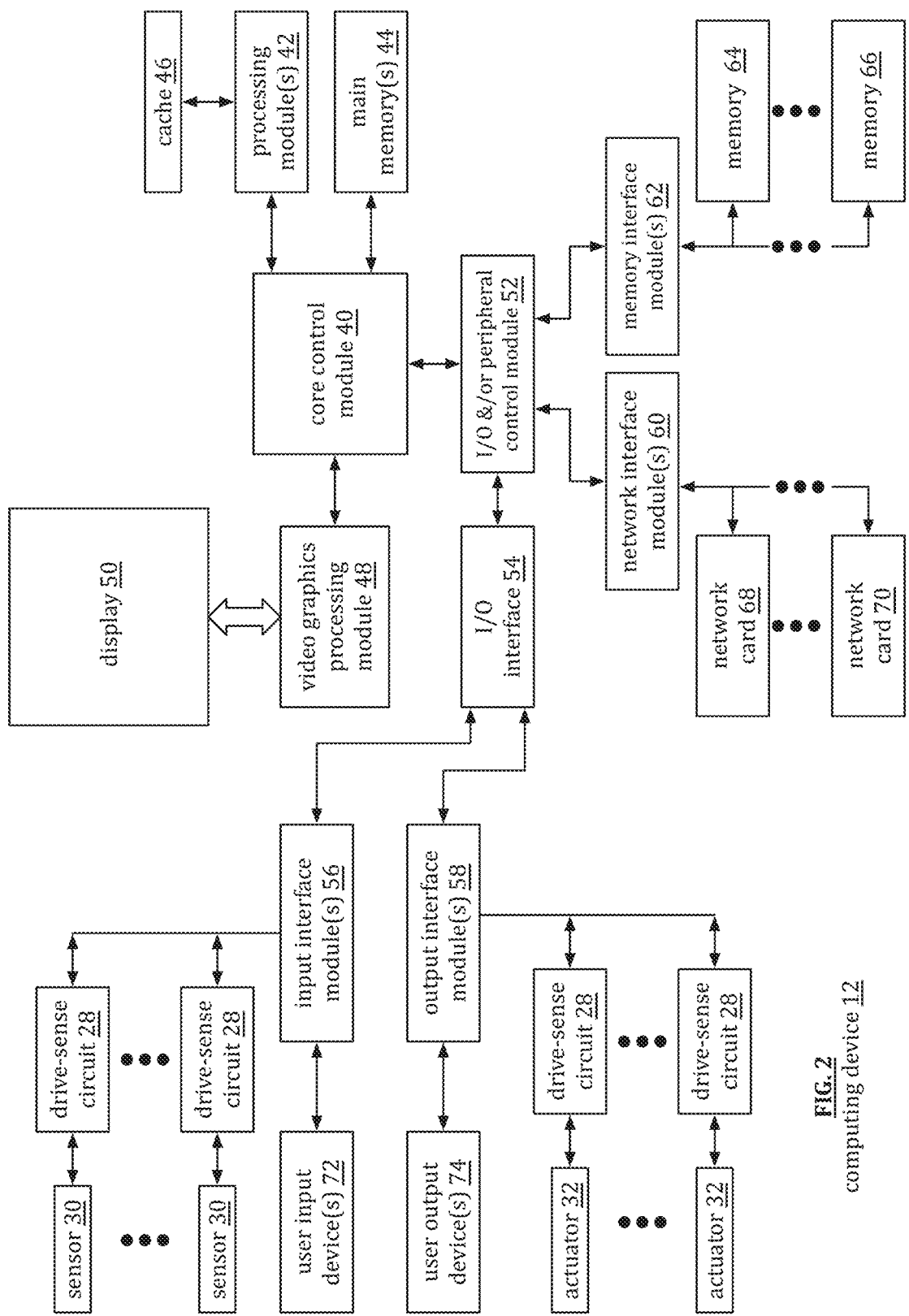
FIG. 2 is a schematic block diagram of an embodiment of a computing device in accordance with the present invention.

FIG. 2 is a schematic block diagram of an embodiment of a computing device 12 (e.g., any one of 12-1 through 12-x). The computing device 12 includes a core control module 40, one or more processing modules 42, one or more main memories 44, cache memory 46, a video graphics processing module 48, a display 50, an Input-Output (I/O) peripheral control module 52, one or more input interface modules 56, one or more output interface modules 58, one or more network interface modules 60, and one or more memory interface modules 62. A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 ($4^{th}$ generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50.

FIG. 2 further illustrates sensors 30 and actuators 32 coupled to drive-sense circuits 28, which are coupled to the input interface module 56 (e.g., USB port). Alternatively, one or more of the drive-sense circuits 28 is coupled to the computing device via a wireless network card (e.g., WLAN) or a wired network card (e.g., Gigabit LAN). While not shown, the computing device 12 further includes a BIOS (Basic Input Output System) memory coupled to the core control module 40.

Figure 3:
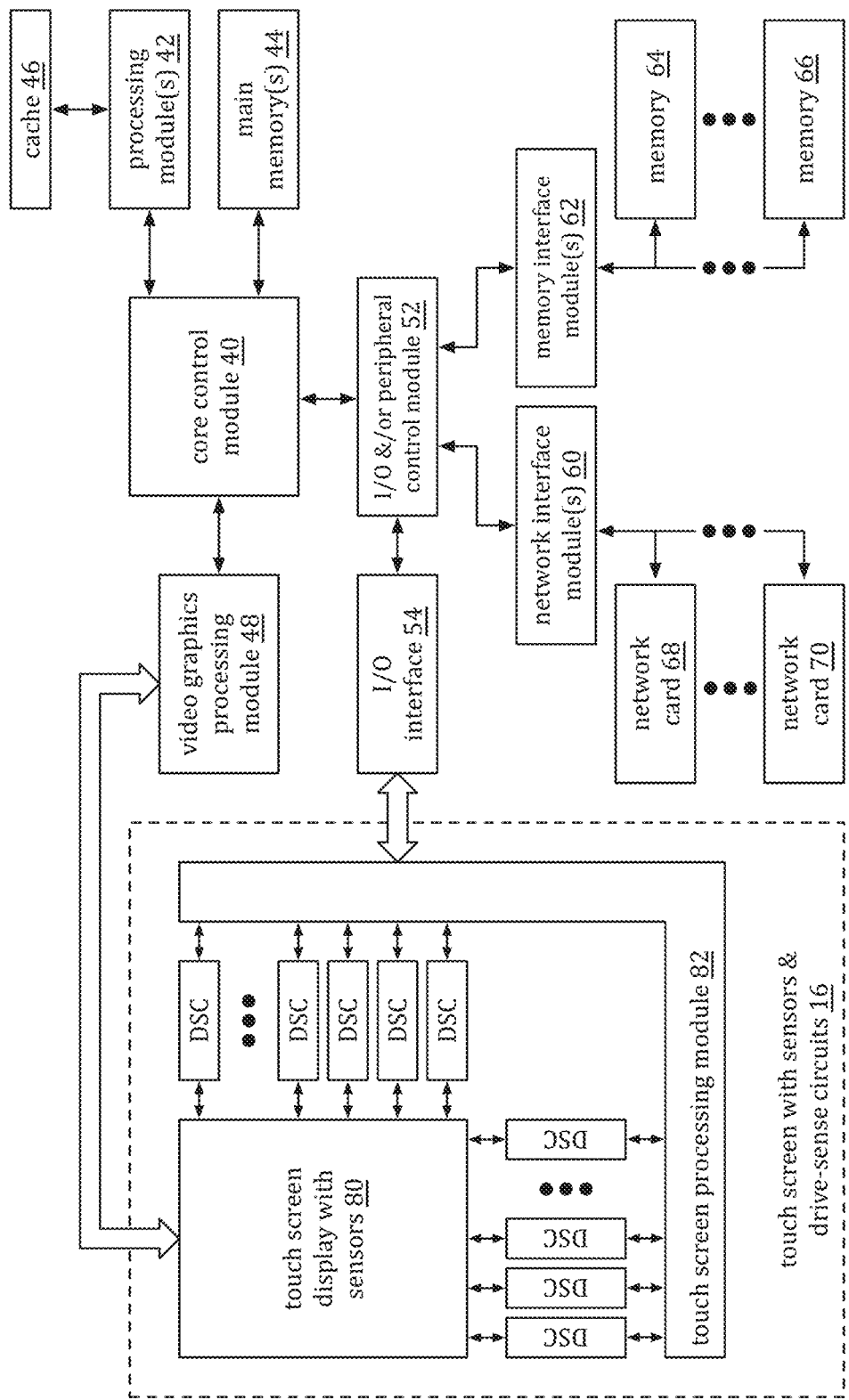
FIG. 3 is a schematic block diagram of another embodiment of a computing device in accordance with the present invention.

FIG. 3 is a schematic block diagram of another embodiment of a computing device 14 that includes a core control module 40, one or more processing modules 42, one or more main memories 44, cache memory 46, a video graphics processing module 48, a touch screen 16, an Input-Output (I/O) peripheral control module 52, one or more input interface modules 56, one or more output interface modules 58, one or more network interface modules 60, and one or more memory interface modules 62. The touch screen 16 includes a touch screen display 80, a plurality of sensors 30, a plurality of drive-sense circuits (DSC), and a touch screen processing module 82.

Computing device 14 operates similarly to computing device 12 of FIG. 2 with the addition of a touch screen as an input device. The touch screen includes a plurality of sensors (e.g., electrodes, capacitor sensing cells, capacitor sensors, inductive sensor, etc.) to detect a proximal touch of the screen. For example, when one or more fingers touches the screen, capacitance of sensors proximal to the touch(es) are affected (e.g., impedance changes). The drive-sense circuits (DSC) coupled to the affected sensors detect the change and provide a representation of the change to the touch screen processing module 82, which may be a separate processing module or integrated into the processing module 42.

The touch screen processing module 82 processes the representative signals from the drive-sense circuits (DSC) to determine the location of the touch(es). This information is inputted to the processing module 42 for processing as an input. For example, a touch represents a selection of a button on screen, a scroll function, a zoom in-out function, etc.

Figure 4:
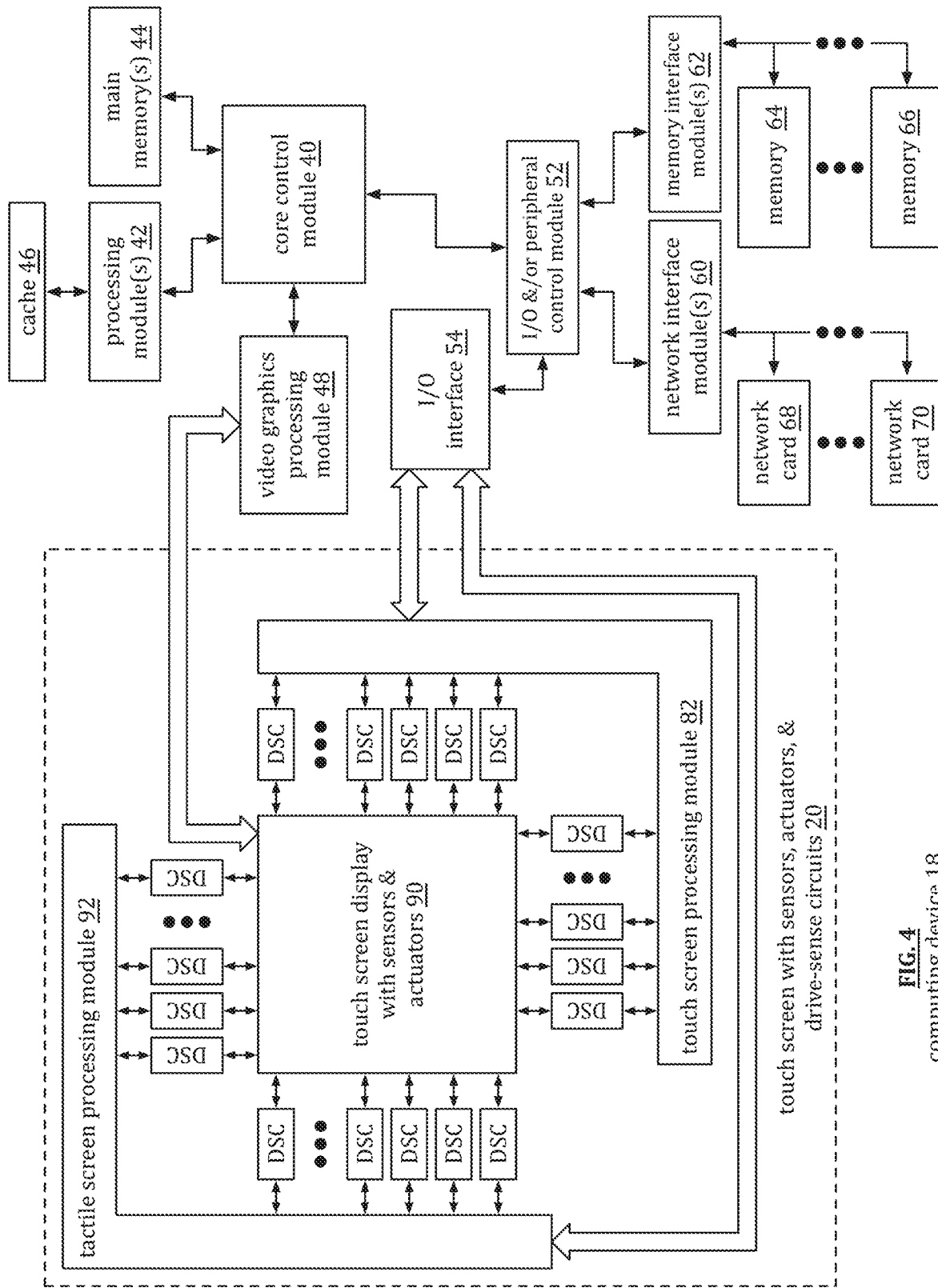
FIG. 4 is a schematic block diagram of another embodiment of a computing device in accordance with the present invention.

FIG. 4 is a schematic block diagram of another embodiment of a computing device 18 that includes a core control module 40, one or more processing modules 42, one or more main memories 44, cache memory 46, a video graphics processing module 48, a touch and tactile screen 20, an Input-Output (I/O) peripheral control module 52, one or more input interface modules 56, one or more output interface modules 58, one or more network interface modules 60, and one or more memory interface modules 62. The touch and tactile screen 20 includes a touch and tactile screen display 90, a plurality of sensors 30, a plurality of actuators 32, a plurality of drive-sense circuits (DSC), a touch screen processing module 82, and a tactile screen processing module 92.

Computing device 18 operates similarly to computing device 14 of FIG. 3 with the addition of a tactile aspect to the screen 20 as an output device. The tactile portion of the screen 20 includes the plurality of actuators (e.g., piezoelectric transducers to create vibrations, solenoids to create movement, etc.) to provide a tactile feel to the screen 20. To do so, the processing module creates tactile data, which is provided to the appropriate drive-sense circuits (DSC) via the tactile screen processing module 92, which may be a stand-alone processing module or integrated into processing module 42. The drive-sense circuits (DSC) convert the tactile data into drive-actuate signals and provide them to the appropriate actuators to create the desired tactile feel on the screen 20.

FIG. 5A is a schematic plot diagram of a computing subsystem 25 that includes a sensed data processing module 65, a plurality of communication modules 61A-x, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing devices in which processing modules 42A-x reside.

A drive-sense circuit 28 (or multiple drive-sense circuits), a processing module (e.g., 41A), and a communication module (e.g., 61A) are within a common computing device. Each grouping of a drive-sense circuit(s), processing module, and communication module is in a separate computing device. A communication module 61A-x is constructed in accordance with one or more wired communication protocol and/or one or more wireless communication protocols that is/are in accordance with the one or more of the Open System Interconnection (OSI) model, the Transmission Control Protocol/Internet Protocol (TCP/IP) model, and other communication protocol module.

In an example of operation, a processing module (e.g., 42A) provides a control signal to its corresponding drive-sense circuit 28. The processing module 42 A may generate the control signal, receive it from the sensed data processing module 65, or receive an indication from the sensed data processing module 65 to generate the control signal. The control signal enables the drive-sense circuit 28 to provide a drive signal to its corresponding sensor. The control signal may further include a reference signal having one or more frequency components to facilitate creation of the drive signal and/or interpreting a sensed signal received from the sensor.

Based on the control signal, the drive-sense circuit 28 provides the drive signal to its corresponding sensor (e.g., 1) on a drive & sense line. While receiving the drive signal (e.g., a power signal, a regulated source signal, etc.), the sensor senses a physical condition 1-$x$ (e.g., acoustic waves, a biological condition, a chemical condition, an electric condition, a magnetic condition, an optical condition, a thermal condition, and/or a mechanical condition). As a result of the physical condition, an electrical characteristic (e.g., impedance, voltage, current, capacitance, inductance, resistance, reactance, etc.) of the sensor changes, which affects the drive signal. Note that if the sensor is an optical sensor, it converts a sensed optical condition into an electrical characteristic.

The drive-sense circuit 28 detects the effect on the drive signal via the drive & sense line and processes the affect to produce a signal representative of power change, which may be an analog or digital signal. The processing module 42A receives the signal representative of power change, interprets it, and generates a value representing the sensed physical condition. For example, if the sensor is sensing pressure, the value representing the sensed physical condition is a measure of pressure (e.g., xPSI (pounds per square inch)).

In accordance with a sensed data process function (e.g., algorithm, application, etc.), the sensed data processing module 65 gathers the values representing the sensed physical conditions from the processing modules. Since the sensors 1-$x$ may be the same type of sensor (e.g., a pressure sensor), may each be different sensors, or a combination thereof; the sensed physical conditions may be the same, may each be different, or a combination thereof. The sensed data processing module 65 processes the gathered values to produce one or more desired results. For example, if the computing subsystem 25 is monitoring pressure along a pipeline, the processing of the gathered values indicates that the pressures are all within normal limits or that one or more of the sensed pressures is not within normal limits.

As another example, if the computing subsystem 25 is used in a manufacturing facility, the sensors are sensing a variety of physical conditions, such as acoustic waves (e.g., for sound proofing, sound generation, ultrasound monitoring, etc.), a biological condition (e.g., a bacterial contamination, etc.) a chemical condition (e.g., composition, gas concentration, etc.), an electric condition (e.g., current levels, voltage levels, electro-magnetic interference, etc.), a magnetic condition (e.g., induced current, magnetic field strength, magnetic field orientation, etc.), an optical condition (e.g., ambient light, infrared, etc.), a thermal condition (e.g., temperature, etc.), and/or a mechanical condition (e.g., physical position, force, pressure, acceleration, etc.).

The computing subsystem 25 may further include one or more actuators in place of one or more of the sensors and/or in addition to the sensors. When the computing subsystem 25 includes an actuator, the corresponding processing module provides an actuation control signal to the corresponding drive-sense circuit 28. The actuation control signal enables the drive-sense circuit 28 to provide a drive signal to the actuator via a drive & actuate line (e.g., similar to the drive & sense line, but for the actuator). The drive signal includes one or more frequency components and/or amplitude components to facilitate a desired actuation of the actuator.

In addition, the computing subsystem 25 may include an actuator and sensor working in concert. For example, the sensor is sensing the physical condition of the actuator. In this example, a drive-sense circuit provides a drive signal to the actuator and another drive sense signal provides the same drive signal, or a scaled version of it, to the sensor. This allows the sensor to provide near immediate and continuous sensing of the actuator's physical condition. This further allows for the sensor to operate at a first frequency and the actuator to operate at a second frequency.

In an embodiment, the computing subsystem is a stand-alone system for a wide variety of applications (e.g., manufacturing, pipelines, testing, monitoring, security, etc.). In another embodiment, the computing subsystem 25 is one subsystem of a plurality of subsystems forming a larger system. For example, different subsystems are employed based on geographic location. As a specific example, the computing subsystem 25 is deployed in one section of a factory and another computing subsystem is deployed in another part of the factory. As another example, different subsystems are employed based function of the subsystems. As a specific example, one subsystem monitors a city's traffic light operation and another subsystem monitors the city's sewage treatment plants.

Regardless of the use and/or deployment of the computing system, the physical conditions it is sensing, and/or the physical conditions it is actuating, each sensor and each actuator (if included) is driven and sensed by a single line as opposed to separate drive and sense lines. This provides many advantages including, but not limited to, lower power requirements, better ability to drive high impedance sensors, lower line to line interference, and/or concurrent sensing functions.

Figure 5B:
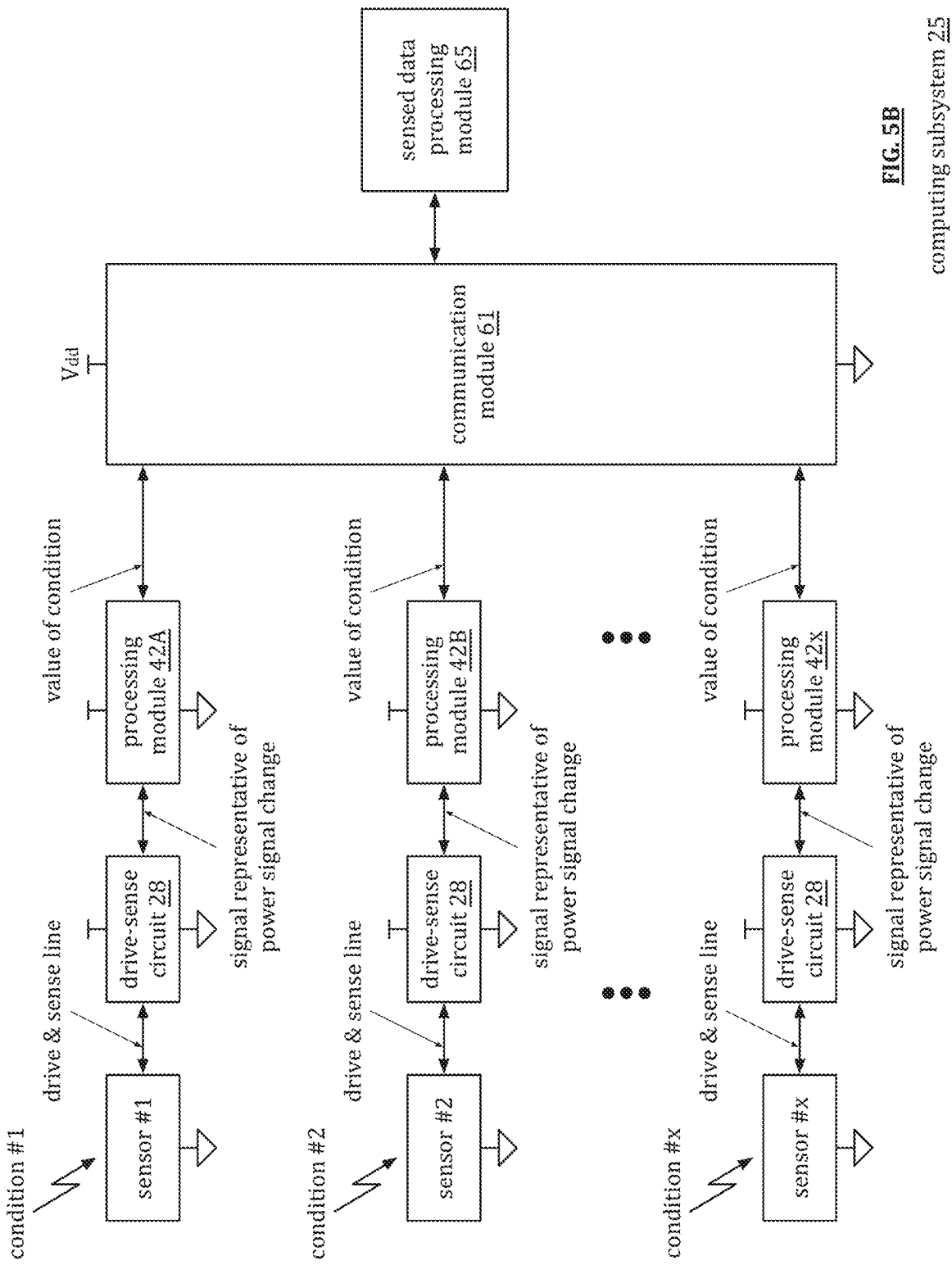
FIG. 5B is a schematic block diagram of another embodiment of a computing subsystem in accordance with the present invention.

FIG. 5B is a schematic block diagram of another embodiment of a computing subsystem 25 that includes a sensed data processing module 65, a communication module 61, a plurality of processing modules 42A-x, a plurality of drive sense circuits 28, and a plurality of sensors 1-$x$, which may be sensors 30 of FIG. 1. The sensed data processing module 65 is one or more processing modules within one or more servers 22 and/or one more processing modules in one or more computing devices that are different than the computing device, devices, in which processing modules 42A-x reside.

In an embodiment, the drive-sense circuits 28, the processing modules, and the communication module are within a common computing device. For example, the computing device includes a central processing unit that includes a plurality of processing modules. The functionality and operation of the sensed data processing module 65, the communication module 61, the processing modules 42A-x, the drive sense circuits 28, and the sensors 1-$x$ are as discussed with reference to FIG. 5A.

Figure 5C:
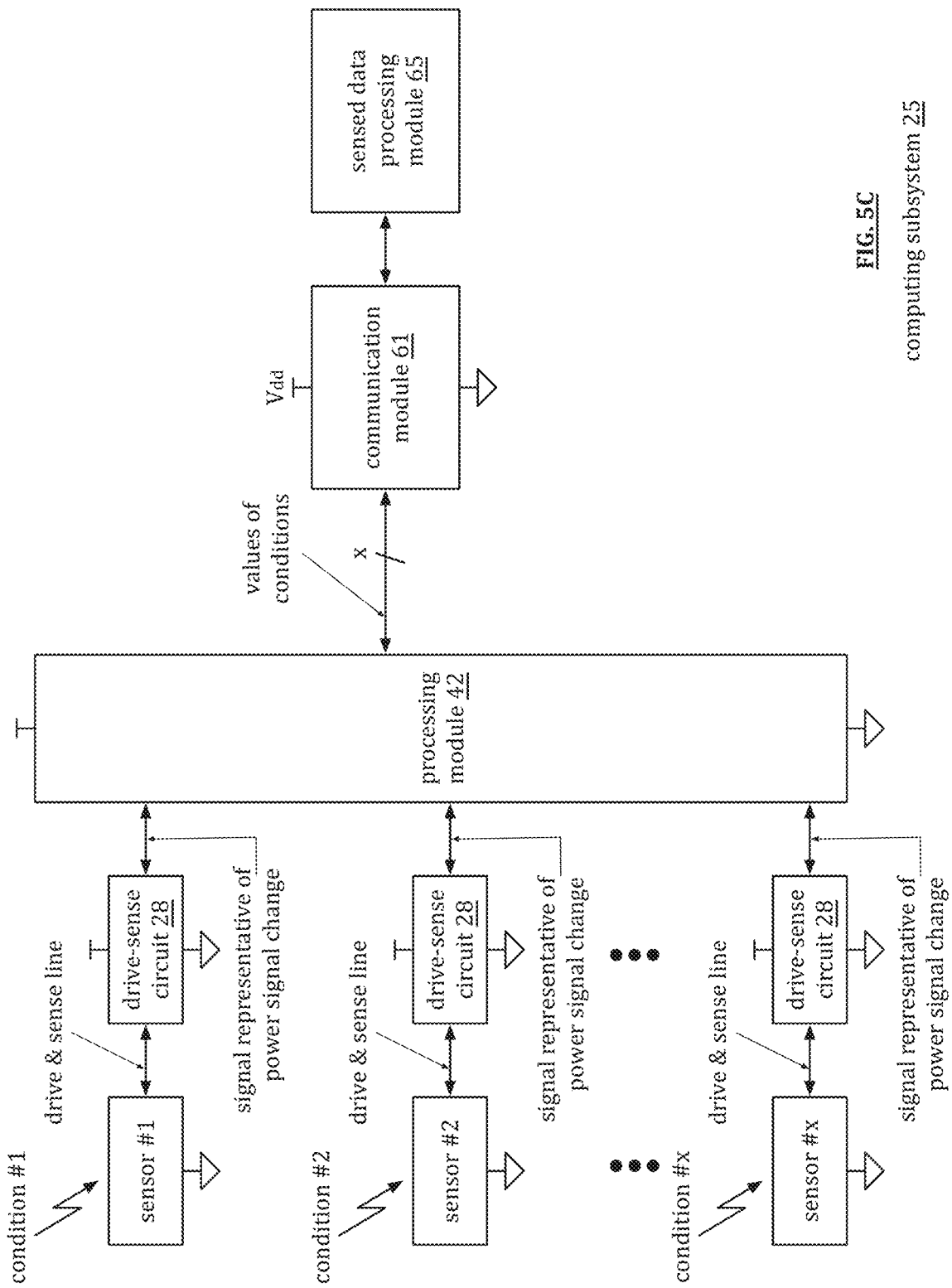
FIG. 5C is a schematic block diagram of another embodiment of a computing subsystem in accordance with the present invention.

FIG. 5C is a schematic block diagram of another embodiment of a computing subsystem 25 that includes a sensed data processing module 65, a communication module 61, a processing module 42, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing device in which the processing module 42 resides.

In an embodiment, the drive-sense circuits 28, the processing module, and the communication module are within a common computing device. The functionality and operation of the sensed data processing module 65, the communication module 61, the processing module 42, the drive sense circuits 28, and the sensors 1-x are as discussed with reference to FIG. 5A.

FIG. 5D is a schematic block diagram of another embodiment of a computing subsystem 25 that includes a processing module 42, a reference signal circuit 100, a plurality of drive sense circuits 28, and a plurality of sensors 30. The processing module 42 includes a drive-sense processing block 104, a drive-sense control block 102, and a reference control block 106. Each block 102-106 of the processing module 42 may be implemented via separate modules of the processing module, may be a combination of software and hardware within the processing module, and/or may be field programmable modules within the processing module 42.

In an example of operation, the drive-sense control block 104 generates one or more control signals to activate one or more of the drive-sense circuits 28. For example, the drive-sense control block 102 generates a control signal that enables of the drive-sense circuits 28 for a given period of time (e.g., 1 second, 1 minute, etc.). As another example, the drive-sense control block 102 generates control signals to sequentially enable the drive-sense circuits 28. As yet another example, the drive-sense control block 102 generates a series of control signals to periodically enable the drive-sense circuits 28 (e.g., enabled once every second, every minute, every hour, etc.).

Continuing with the example of operation, the reference control block 106 generates a reference control signal that it provides to the reference signal circuit 100. The reference signal circuit 100 generates, in accordance with the control signal, one or more reference signals for the drive-sense circuits 28. For example, the control signal is an enable signal, which, in response, the reference signal circuit 100 generates a pre-programmed reference signal that it provides to the drive-sense circuits 28. In another example, the reference signal circuit 100 generates a unique reference signal for each of the drive-sense circuits 28. In yet another example, the reference signal circuit 100 generates a first unique reference signal for each of the drive-sense circuits 28 in a first group and generates a second unique reference signal for each of the drive-sense circuits 28 in a second group.

The reference signal circuit 100 may be implemented in a variety of ways. For example, the reference signal circuit 100 includes a DC (direct current) voltage generator, an AC voltage generator, and a voltage combining circuit. The DC voltage generator generates a DC voltage at a first level and the AC voltage generator generates an AC voltage at a second level, which is less than or equal to the first level. The voltage combining circuit combines the DC and AC voltages to produce the reference signal. As examples, the reference signal circuit 100 generates a reference signal similar to the signals shown in FIG. 7, which will be subsequently discussed.

As another example, the reference signal circuit 100 includes a DC current generator, an AC current generator, and a current combining circuit. The DC current generator generates a DC current a first current level and the AC current generator generates an AC current at a second current level, which is less than or equal to the first current level. The current combining circuit combines the DC and AC currents to produce the reference signal.

Returning to the example of operation, the reference signal circuit 100 provides the reference signal, or signals, to the drive-sense circuits 28. When a drive-sense circuit 28 is enabled via a control signal from the drive sense control block 102, it provides a drive signal to its corresponding sensor 30. As a result of a physical condition, an electrical characteristic of the sensor is changed, which affects the drive signal. Based on the detected effect on the drive signal and the reference signal, the drive-sense circuit 28 generates a signal representative of the effect on the drive signal.

The drive-sense circuit provides the signal representative of the effect on the drive signal to the drive-sense processing block 104. The drive-sense processing block 104 processes the representative signal to produce a sensed value 97 of the physical condition (e.g., a digital value that represents a specific temperature, a specific pressure level, etc.). The processing module 42 provides the sensed value 97 to another application running on the computing device, to another computing device, and/or to a server 22.

Figure 5E:
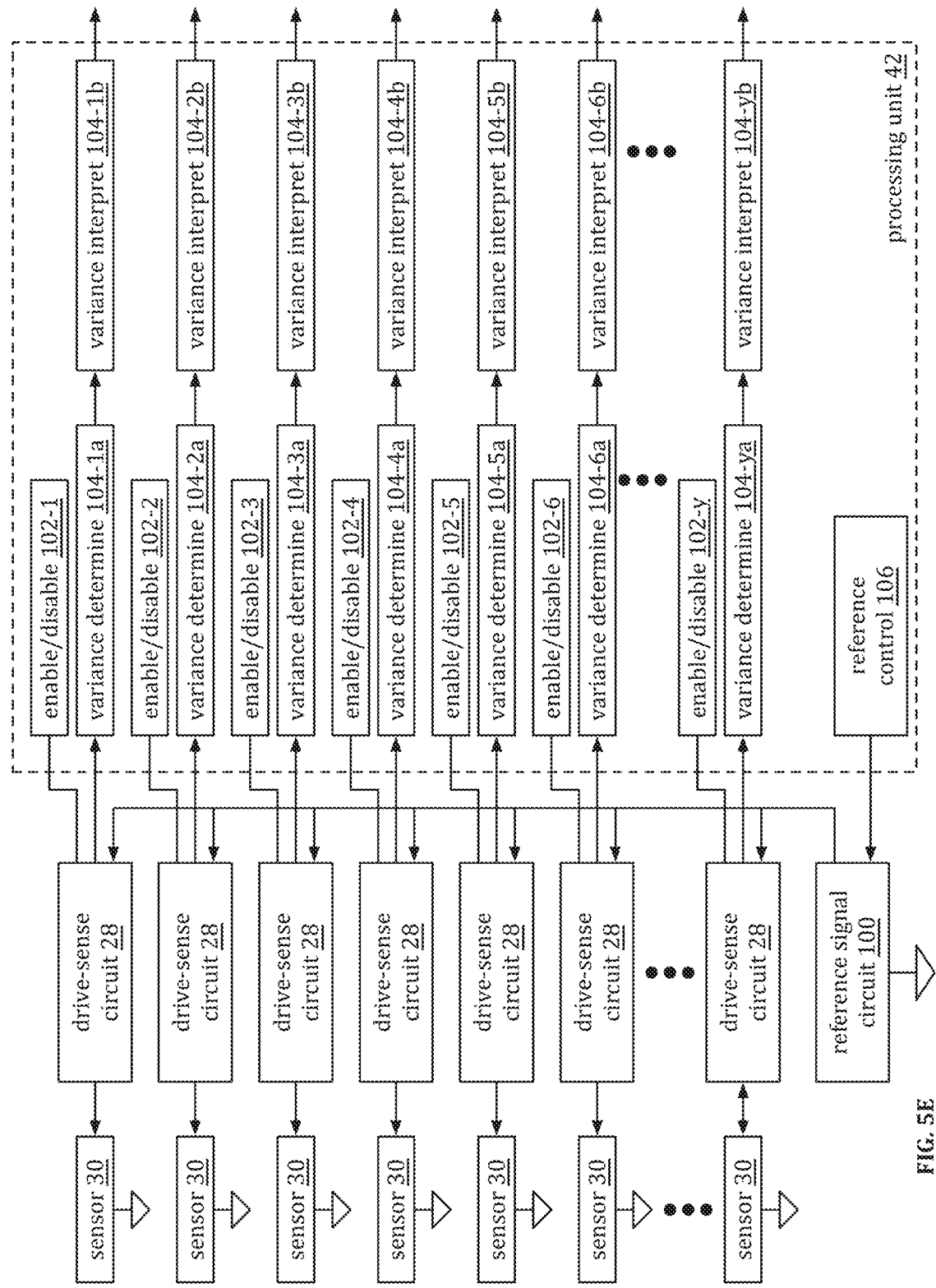
FIG. 5E is a schematic block diagram of another embodiment of a computing subsystem in accordance with the present invention.

FIG. 5E is a schematic block diagram of another embodiment of a computing subsystem 25 that includes a processing module 42, a plurality of drive sense circuits 28, and a plurality of sensors 30. This embodiment is similar to the embodiment of FIG. 5D with the functionality of the drive-sense processing block 104, a drive-sense control block 102, and a reference control block 106 shown in greater detail. For instance, the drive-sense control block 102 includes individual enable/disable blocks 102-1 through 102-y. An enable/disable block functions to enable or disable a corresponding drive-sense circuit in a manner as discussed above with reference to FIG. 5D.

The drive-sense processing block 104 includes variance determining modules 104-1a through y and variance interpreting modules 104-2a through y. For example, variance determining module 104-1a receives, from the corresponding drive-sense circuit 28, a signal representative of a physical condition sensed by a sensor. The variance determining module 104-1a functions to determine a difference from the signal representing the sensed physical condition with a signal representing a known, or reference, physical condition. The variance interpreting module 104-1b interprets the difference to determine a specific value for the sensed physical condition.

As a specific example, the variance determining module 104-1a receives a digital signal of 1001 0110 (150 in decimal) that is representative of a sensed physical condition (e.g., temperature) sensed by a sensor from the corresponding drive-sense circuit 28. With 8-bits, there are $2^8$ (256) possible signals representing the sensed physical condition. Assume that the units for temperature is Celsius and a digital value of 0100 0000 (64 in decimal) represents the known value for 25 degree Celsius. The variance determining module 104-b1 determines the difference between the digital signal representing the sensed value (e.g., 1001 0110, 150 in decimal) and the known signal value of (e.g., 0100 0000, 64 in decimal), which is 0011 0000 (86 in decimal). The variance determining module 104-b1 then determines the sensed value based on the difference and the known value. In this example, the sensed value equals 25+86*(100/256) =25+33.6=58.6 degrees Celsius.

FIG. 6 is a schematic block diagram of a drive center circuit 28-a coupled to a sensor 30. The drive sense-sense circuit 28 includes a power source circuit 110 and a power signal change detection circuit 112. The sensor 30 includes one or more transducers that have varying electrical characteristics (e.g., capacitance, inductance, impedance, current, voltage, etc.) based on varying physical conditions 114 (e.g., pressure, temperature, biological, chemical, etc.), or vice versa (e.g., an actuator).

The power source circuit 110 is operably coupled to the sensor 30 and, when enabled (e.g., from a control signal from the processing module 42, power is applied, a switch is closed, a reference signal is received, etc.) provides a power signal 116 to the sensor 30. The power source circuit 110 may be a voltage supply circuit (e.g., a battery, a linear regulator, an unregulated DC-to-DC converter, etc.) to produce a voltage-based power signal, a current supply circuit (e.g., a current source circuit, a current mirror circuit, etc.) to produce a current-based power signal, or a circuit that provide a desired power level to the sensor and substantially matches impedance of the sensor. The power source circuit 110 generates the power signal 116 to include a DC (direct current) component and/or an oscillating component.

When receiving the power signal 116 and when exposed to a condition 114, an electrical characteristic of the sensor affects 118 the power signal. When the power signal change detection circuit 112 is enabled, it detects the affect 118 on the power signal as a result of the electrical characteristic of the sensor. For example, the power signal is a 1.5 voltage signal and, under a first condition, the sensor draws 1 milliamp of current, which corresponds to an impedance of 1.5 K Ohms. Under a second conditions, the power signal remains at 1.5 volts and the current increases to 1.5 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

As another example, the power signal is a 1.5 voltage signal and, under a first condition, the sensor draws 1 milliamp of current, which corresponds to an impedance of 1.5 K Ohms. Under a second conditions, the power signal drops to 1.3 volts and the current increases to 1.3 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

The power signal 116 includes a DC component 122 and/or an oscillating component 124 as shown in FIG. 7. The oscillating component 124 includes a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component). Note that the power signal is shown without affect from the sensor as the result of a condition or changing condition.

In an embodiment, power generating circuit 110 varies frequency of the oscillating component 124 of the power signal 116 so that it can be tuned to the impedance of the sensor and/or to be off-set in frequency from other power signals in a system. For example, a capacitance sensor's impedance decreases with frequency. As such, if the frequency of the oscillating component is too high with respect to the capacitance, the capacitor looks like a short and variances in capacitances will be missed. Similarly, if the frequency of the oscillating component is too low with respect to the capacitance, the capacitor looks like an open and variances in capacitances will be missed.

In an embodiment, the power generating circuit 110 varies magnitude of the DC component 122 and/or the oscillating component 124 to improve resolution of sensing and/or to adjust power consumption of sensing. In addition, the power generating circuit 110 generates the drive signal 110 such that the magnitude of the oscillating component 124 is less than magnitude of the DC component 122.

FIG. 6A is a schematic block diagram of a drive center circuit 28-a1 coupled to a sensor 30. The drive sense-sense circuit 28-a1 includes a signal source circuit 111, a signal change detection circuit 113, and a power source 115. The power source 115 (e.g., a battery, a power supply, a current source, etc.) generates a voltage and/or current that is combined with a signal 117, which is produced by the signal source circuit 111. The combined signal is supplied to the sensor 30.

The signal source circuit 111 may be a voltage supply circuit (e.g., a battery, a linear regulator, an unregulated DC-to-DC converter, etc.) to produce a voltage-based signal 117, a current supply circuit (e.g., a current source circuit, a current mirror circuit, etc.) to produce a current-based signal 117, or a circuit that provide a desired power level to the sensor and substantially matches impedance of the sensor. The signal source circuit 111 generates the signal 117 to include a DC (direct current) component and/or an oscillating component.

When receiving the combined signal (e.g., signal 117 and power from the power source) and when exposed to a condition 114, an electrical characteristic of the sensor affects 119 the signal. When the signal change detection circuit 113 is enabled, it detects the affect 119 on the signal as a result of the electrical characteristic of the sensor.

FIG. 8 is an example of a sensor graph that plots an electrical characteristic versus a condition. The sensor has a substantially linear region in which an incremental change in a condition produces a corresponding incremental change in the electrical characteristic. The graph shows two types of electrical characteristics: one that increases as the condition increases and the other that decreases and the condition increases. As an example of the first type, impedance of a temperature sensor increases and the temperature increases. As an example of a second type, a capacitance touch sensor decreases in capacitance as a touch is sensed.

Figure 9:
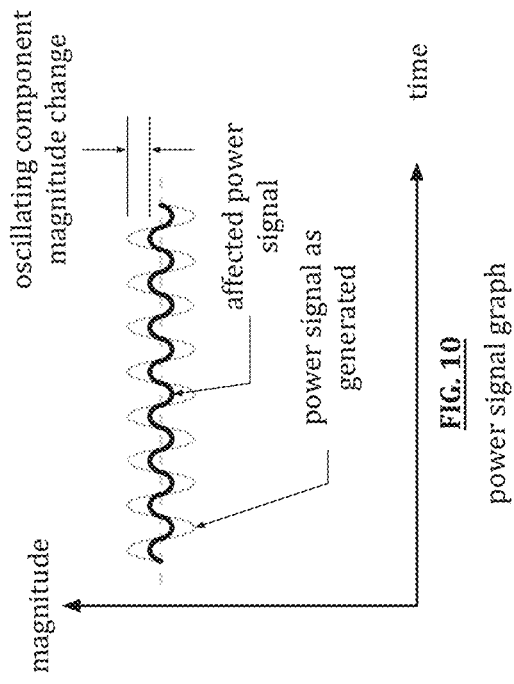
FIG. 9 is a schematic block diagram of another example of a power signal graph in accordance with the present invention.

FIG. 9 is a schematic block diagram of another example of a power signal graph in which the electrical characteristic or change in electrical characteristic of the sensor is affecting the power signal. In this example, the effect of the electrical characteristic or change in electrical characteristic of the sensor reduced the DC component but had little to no effect on the oscillating component. For example, the electrical characteristic is resistance. In this example, the resistance or change in resistance of the sensor decreased the power signal, inferring an increase in resistance for a relatively constant current.

Figure 10:
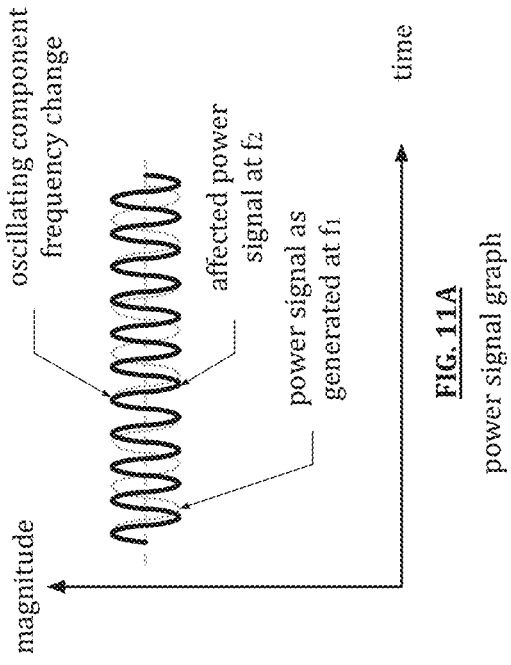
FIG. 10 is a schematic block diagram of another example of a power signal graph in accordance with the present invention.

FIG. 10 is a schematic block diagram of another example of a power signal graph in which the electrical characteristic or change in electrical characteristic of the sensor is affecting the power signal. In this example, the effect of the electrical characteristic or change in electrical characteristic of the sensor reduced magnitude of the oscillating component but had little to no effect on the DC component. For example, the electrical characteristic is impedance of a capacitor and/or an inductor. In this example, the impedance or change in impedance of the sensor decreased the magnitude of the oscillating signal component, inferring an increase in impedance for a relatively constant current.

Figure 11:
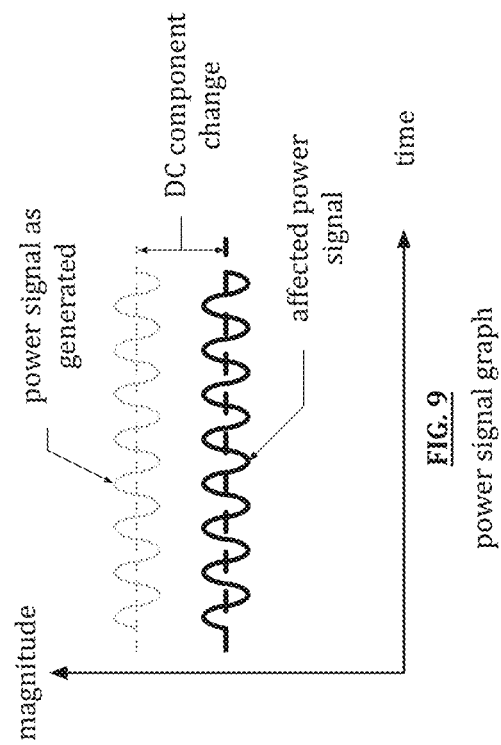
FIG. 11 is a schematic block diagram of another example of a power signal graph in accordance with the present invention.

FIG. 11 is a schematic block diagram of another example of a power signal graph in which the electrical characteristic or change in electrical characteristic of the sensor is affecting the power signal. In this example, the effect of the electrical characteristic or change in electrical characteristic of the sensor shifted frequency of the oscillating component but had little to no effect on the DC component. For example, the electrical characteristic is reactance of a capacitor and/or an inductor. In this example, the reactance or change in reactance of the sensor shifted frequency of the oscillating signal component, inferring an increase in reactance (e.g., sensor is functioning as an integrator or phase shift circuit).

Figure 11A:
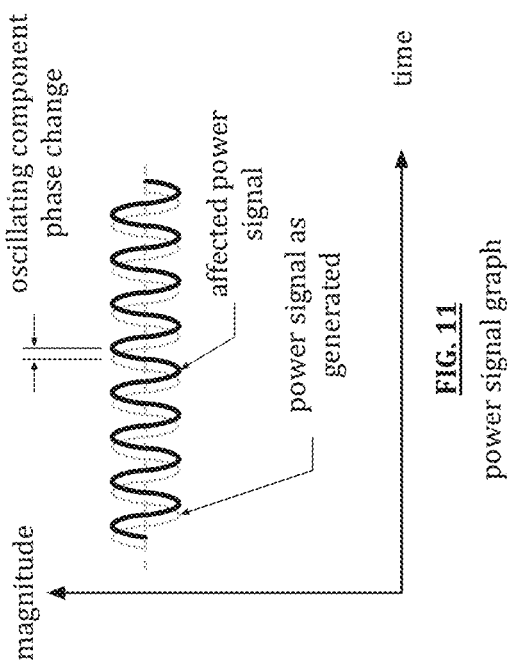
FIG. 11A is a schematic block diagram of another example of a power signal graph in accordance with the present invention.

FIG. 11A is a schematic block diagram of another example of a power signal graph in which the electrical characteristic or change in electrical characteristic of the sensor is affecting the power signal. In this example, the effect of the electrical characteristic or change in electrical characteristic of the sensor changes the frequency of the oscillating component but had little to no effect on the DC component. For example, the sensor includes two transducers that oscillate at different frequencies. The first transducer receives the power signal at a frequency of $f_1$ and converts it into a first physical condition. The second transducer is stimulated by the first physical condition to create an electrical signal at a different frequency $f_2$. In this example, the first and second transducers of the sensor change the frequency of the oscillating signal component, which allows for more granular sensing and/or a broader range of sensing.

Figure 12:
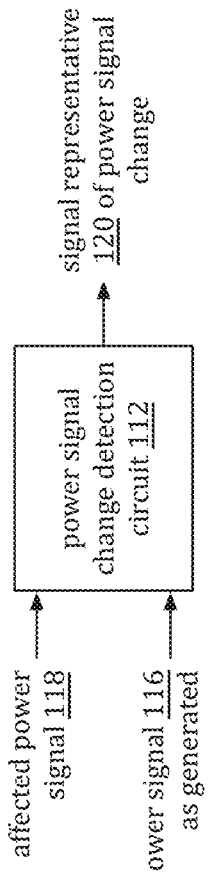
FIG. 12 is a schematic block diagram of an embodiment of a power signal change detection circuit in accordance with the present invention.

FIG. 12 is a schematic block diagram of an embodiment of a power signal change detection circuit 112 receiving the affected power signal 118 and the power signal 116 as generated to produce, therefrom, the signal representative 120 of the power signal change. The affect 118 on the power signal is the result of an electrical characteristic and/or change in the electrical characteristic of a sensor; a few examples of the affects are shown in FIGS. 8-11A.

In an embodiment, the power signal change detection circuit 112 detect a change in the DC component 122 and/or the oscillating component 124 of the power signal 116. The power signal change detection circuit 112 then generates the signal representative 120 of the change to the power signal based on the change to the power signal. For example, the change to the power signal results from the impedance of the sensor and/or a change in impedance of the sensor. The representative signal 120 is reflective of the change in the power signal and/or in the change in the sensor's impedance.

In an embodiment, the power signal change detection circuit 112 is operable to detect a change to the oscillating component at a frequency, which may be a phase shift, frequency change, and/or change in magnitude of the oscillating component. The power signal change detection circuit 112 is also operable to generate the signal representative of the change to the power signal based on the change to the oscillating component at the frequency. The power signal change detection circuit 112 is further operable to provide feedback to the power source circuit 110 regarding the oscillating component. The feedback allows the power source circuit 110 to regulate the oscillating component at the desired frequency, phase, and/or magnitude.

Figure 13:
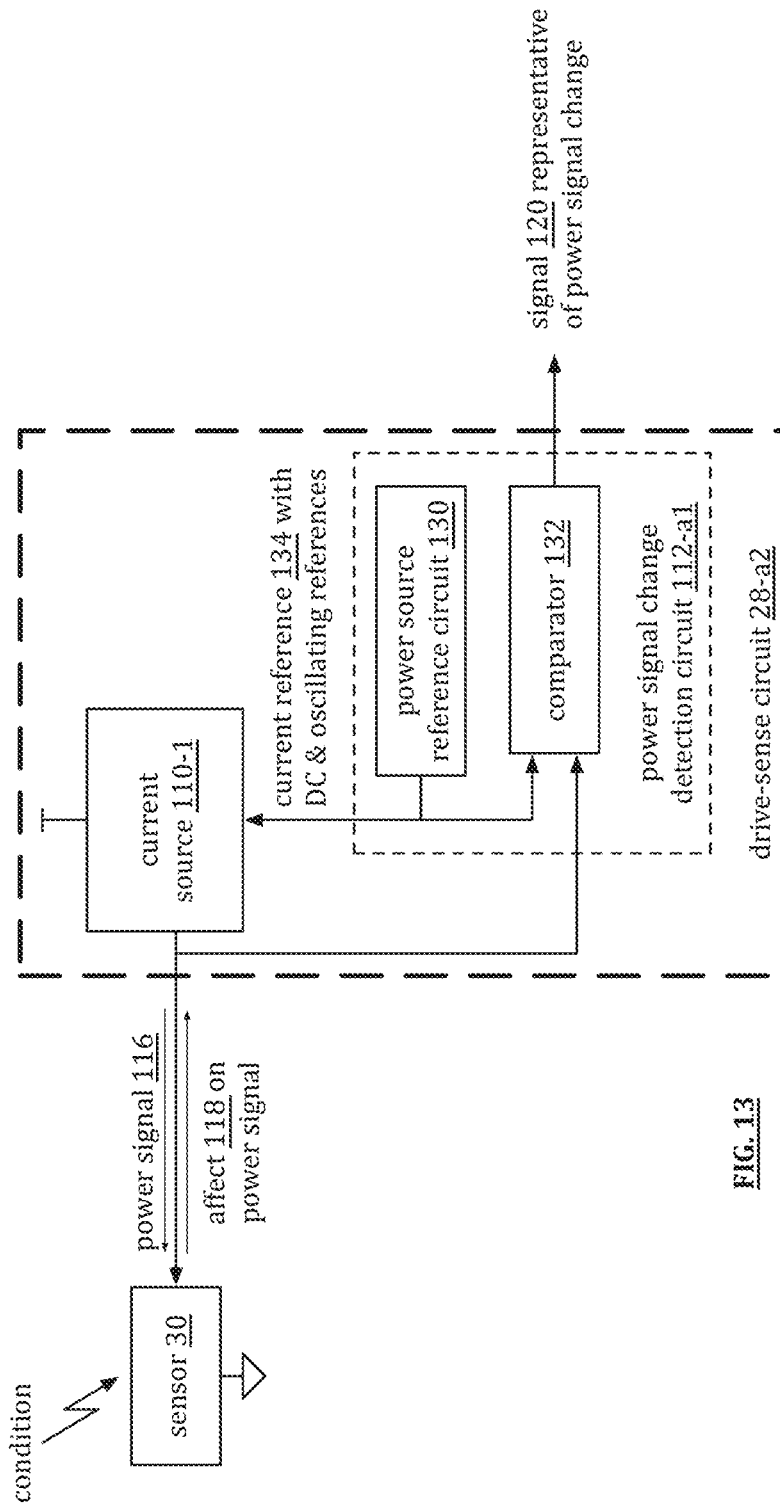
FIG. 13 is a schematic block diagram of another embodiment of a drive sense circuit in accordance with the present invention.

FIG. 13 is a schematic block diagram of another embodiment of a drive sense circuit 28-*a*2 that includes a current source 110-1 and a power signal change detection circuit 112-*a*1. The power signal change detection circuit 112-*a*1 includes a power source reference circuit 130 and a comparator 132. The current source 110-1 may be an independent current source, a dependent current source, a current mirror circuit, etc.

In an example of operation, the power source reference circuit 130 provides a current reference 134 with DC and oscillating components to the current source 110-1. The current source generates a current as the power signal 116 based on the current reference 134. An electrical characteristic of the sensor 30 has an effect on the current power signal 116. For example, if the impedance of the sensor decreases and the current power signal 116 remains substantially unchanged, the voltage across the sensor is decreased.

The comparator 132 compares the current reference 134 with the affected power signal 118 to produce the signal 120 that is representative of the change to the power signal. For example, the current reference signal 134 corresponds to a given current (I) times a given impedance (Z). The current reference generates the power signal to produce the given current (I). If the impedance of the sensor 30 substantially matches the given impedance (Z), then the comparator's output is reflective of the impedances substantially matching. If the impedance of the sensor 30 is greater than the given impedance (Z), then the comparator's output is indicative of how much greater the impedance of the sensor 30 is than that of the given impedance (Z). If the impedance of the sensor 30 is less than the given impedance (Z), then the comparator's output is indicative of how much less the impedance of the sensor 30 is than that of the given impedance (Z).

Figure 14:
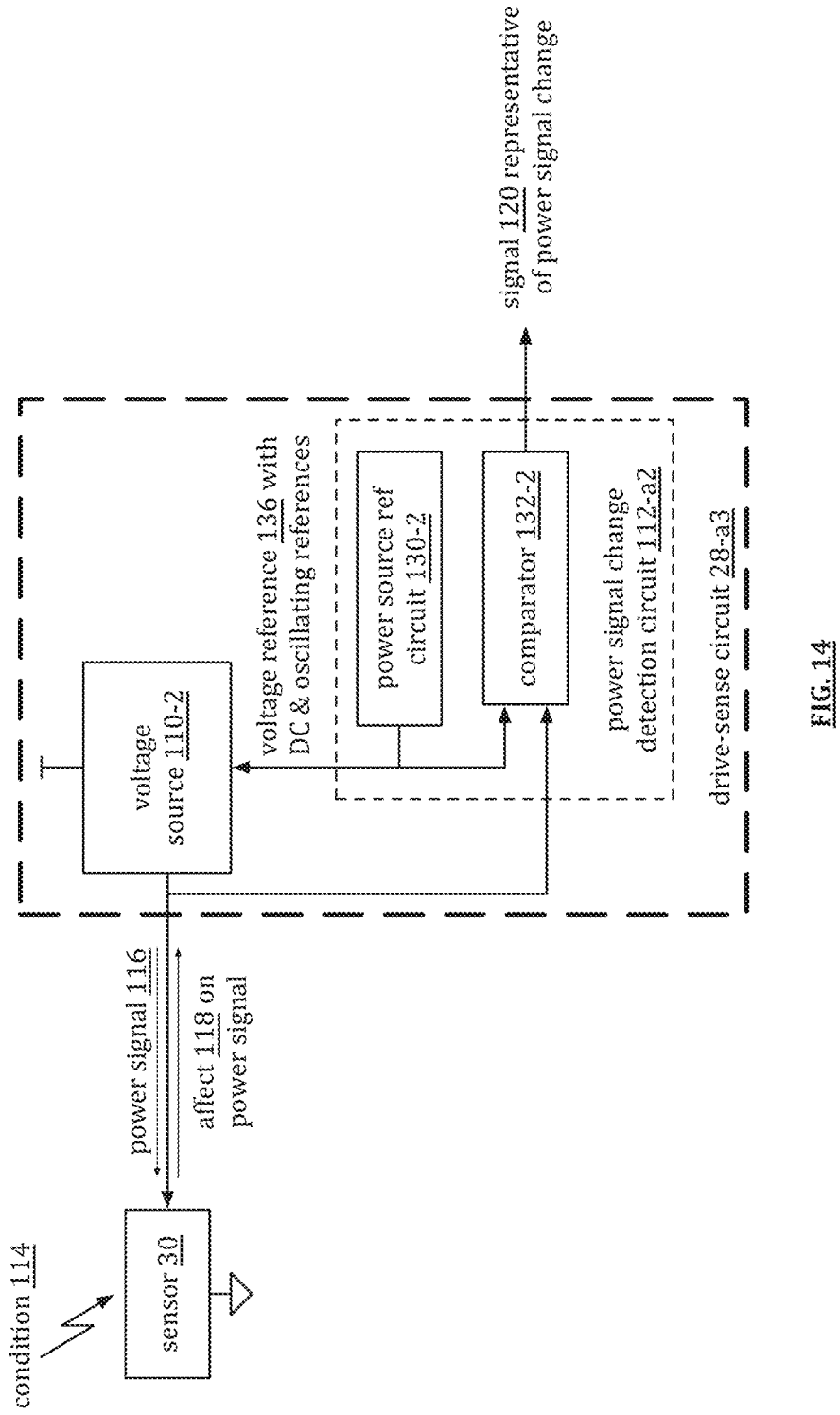
FIG. 14 is a schematic block diagram of another embodiment of a drive sense circuit in accordance with the present invention.

FIG. 14 is a schematic block diagram of another embodiment of a drive sense circuit 28-*a*3 that includes a voltage source 110-2 and a power signal change detection circuit 112-*a*2. The power signal change detection circuit 112-*a*2 includes a power source reference circuit 130-2 and a comparator 132-2. The voltage source 110-2 may be a battery, a linear regulator, a DC-DC converter, etc.

In an example of operation, the power source reference circuit 130-2 provides a voltage reference 136 with DC and oscillating components to the voltage source 110-2. The voltage source generates a voltage as the power signal 116 based on the voltage reference 136. An electrical characteristic of the sensor 30 has an effect on the voltage power signal 116. For example, if the impedance of the sensor decreases and the voltage power signal 116 remains substantially unchanged, the current through the sensor is increased.

The comparator 132 compares the voltage reference 136 with the affected power signal 118 to produce the signal 120 that is representative of the change to the power signal. For example, the voltage reference signal 134 corresponds to a given voltage (V) divided by a given impedance (Z). The voltage reference generates the power signal to produce the given voltage (V). If the impedance of the sensor 30 substantially matches the given impedance (Z), then the comparator's output is reflective of the impedances substantially matching. If the impedance of the sensor 30 is greater than the given impedance (Z), then the comparator's output is indicative of how much greater the impedance of the sensor 30 is than that of the given impedance (Z). If the impedance of the sensor 30 is less than the given impedance (Z), then the comparator's output is indicative of how much less the impedance of the sensor 30 is than that of the given impedance (Z).

Figure 15:
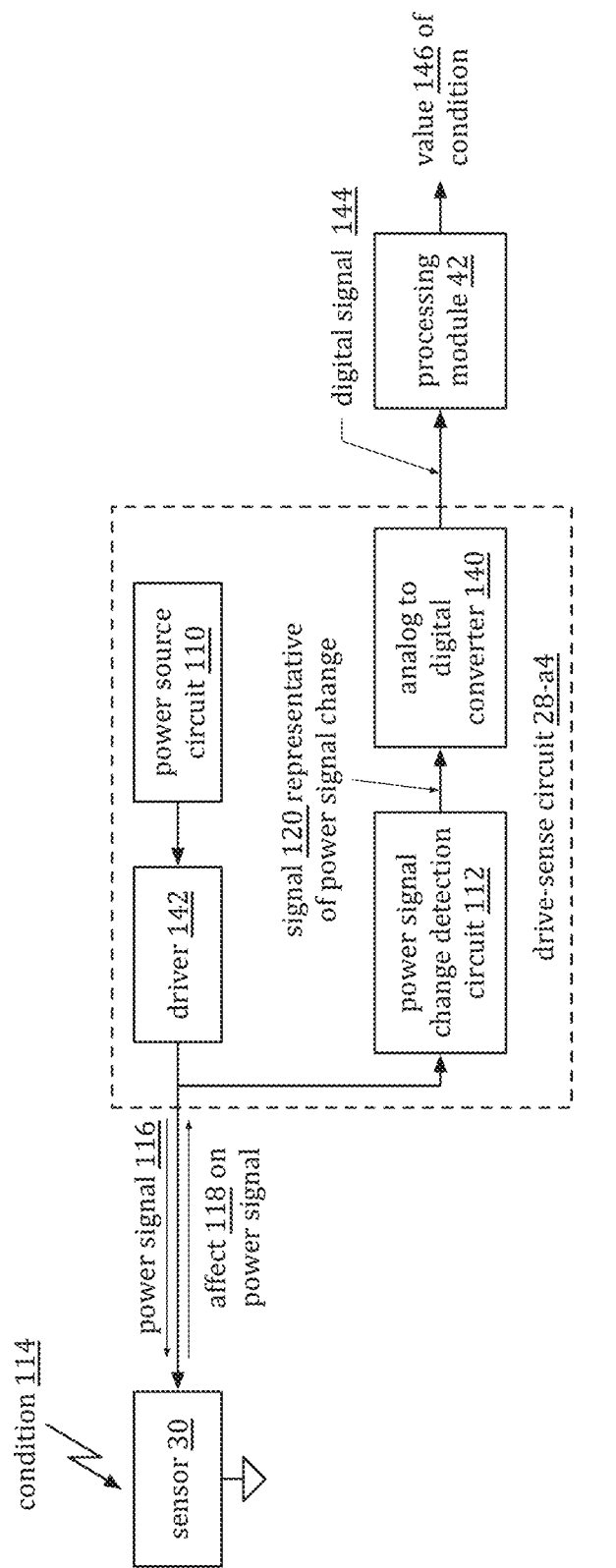
FIG. 15 is a schematic block diagram of another embodiment of a drive sense circuit in accordance with the present invention.

FIG. 15 is a schematic block diagram of another embodiment of a drive sense circuit 28-*a*4 that includes the power source circuit 110, the power signal change detection circuit 112, an analog to digital converter 140, and a driver 142. The power source circuit 110 and the power signal change detection circuit 112 function as previously discussed with reference to FIG. 13 to produce a signal 120 that is representative of a power signal change.

In this embodiment, the power source circuit 110 provides its output to the driver 142, which functions to increase the power (e.g., increase voltage and/or current) of the power signal produced by the power source circuit 110. The driver 142 provides the power signal 116 to the sensor 30. With a driver, which may be a power amplifier, a low impedance sensor 30 may be used of specific types for sensing applications.

The analog to digital converter 140 converts the signal 120 that represents the power signal change into a digital signal 144. The digital signal 144 is provided to the processing module 42 via a connection between the drive-sense circuit and the processing module. The processing module converts the digital signal into a relative value of the condition to which the sensor is exposed. The connection between the drive-sense circuit 28-*a*4 and the processing module 42 depends on whether the drive-sense circuit is internal or external to the computing device of the processing module. If internal, then the drive-sense circuit is connected to the processing module via a PCI bus or the like. If the drive-sense circuit is external to the processing module, then the connection is a USB connection, a Bluetooth connection, a WLAN connection, an internet connection, and/or a WAN connection.

Figure 16:
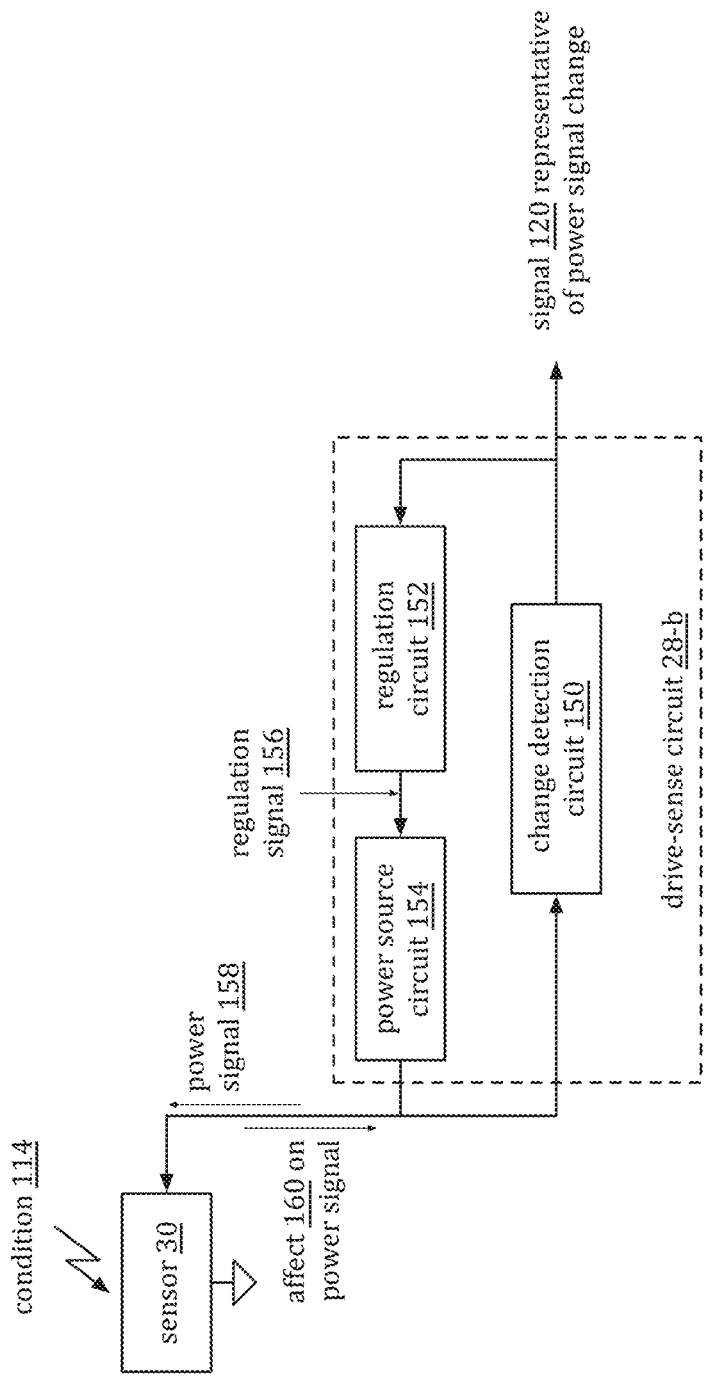
FIG. 16 is a schematic block diagram of another embodiment of a drive sense circuit in accordance with the present invention.

FIG. 16 is a schematic block diagram of another embodiment of a drive sense circuit 28-*b* includes a change detection circuit 150, a regulation circuit 152, and a power source circuit 154. The drive-sense circuit 28-*b* is coupled to the sensor 30, which includes a transducer that has varying electrical characteristics (e.g., capacitance, inductance, impedance, current, voltage, etc.) based on varying physical conditions 114 (e.g., pressure, temperature, biological, chemical, etc.).

The power source circuit 154 is operably coupled to the sensor 30 and, when enabled (e.g., from a control signal from the processing module 42, power is applied, a switch is closed, a reference signal is received, etc.) provides a power signal 158 to the sensor 30. The power source circuit 154 may be a voltage supply circuit (e.g., a battery, a linear regulator, an unregulated DC-to-DC converter, etc.) to produce a voltage-based power signal or a current supply circuit (e.g., a current source circuit, a current mirror circuit, etc.) to produce a current-based power signal. The power source circuit 154 generates the power signal 158 to include a DC (direct current) component and an oscillating component.

When receiving the power signal 158 and when exposed to a condition 114, an electrical characteristic of the sensor affects 160 the power signal. When the change detection circuit 150 is enabled, it detects the affect 160 on the power signal as a result of the electrical characteristic of the sensor 30. The change detection circuit 150 is further operable to generate a signal 120 that is representative of change to the power signal based on the detected effect on the power signal.

The regulation circuit 152, when its enabled, generates regulation signal 156 to regulate the DC component to a desired DC level and/or regulate the oscillating component to a desired oscillating level (e.g., magnitude, phase, and/or frequency) based on the signal 120 that is representative of the change to the power signal. The power source circuit 154 utilizes the regulation signal 156 to keep the power signal at a desired setting 158 regardless of the electrical characteristic of the sensor. In this manner, the amount of regulation is indicative of the affect the electrical characteristic had on the power signal.

In an example, the power source circuit 158 is a DC-DC converter operable to provide a regulated power signal having DC and AC components. The change detection circuit 150 is a comparator and the regulation circuit 152 is a pulse width modulator to produce the regulation signal 156. The comparator compares the power signal 158, which is affected by the sensor, with a reference signal that includes DC and AC components. When the electrical characteristics is at a first level (e.g., a first impedance), the power signal is regulated to provide a voltage and current such that the power signal substantially resembles the reference signal.

When the electrical characteristics changes to a second level (e.g., a second impedance), the change detection circuit 150 detects a change in the DC and/or AC component of the power signal 158 and generates the representative signal 120, which indicates the changes. The regulation circuit 152 detects the change in the representative signal 120 and creates the regulation signal to substantially remove the effect on the power signal. The regulation of the power signal 158 may be done by regulating the magnitude of the DC and/or AC components, by adjusting the frequency of AC component, and/or by adjusting the phase of the AC component.

Figure 17:
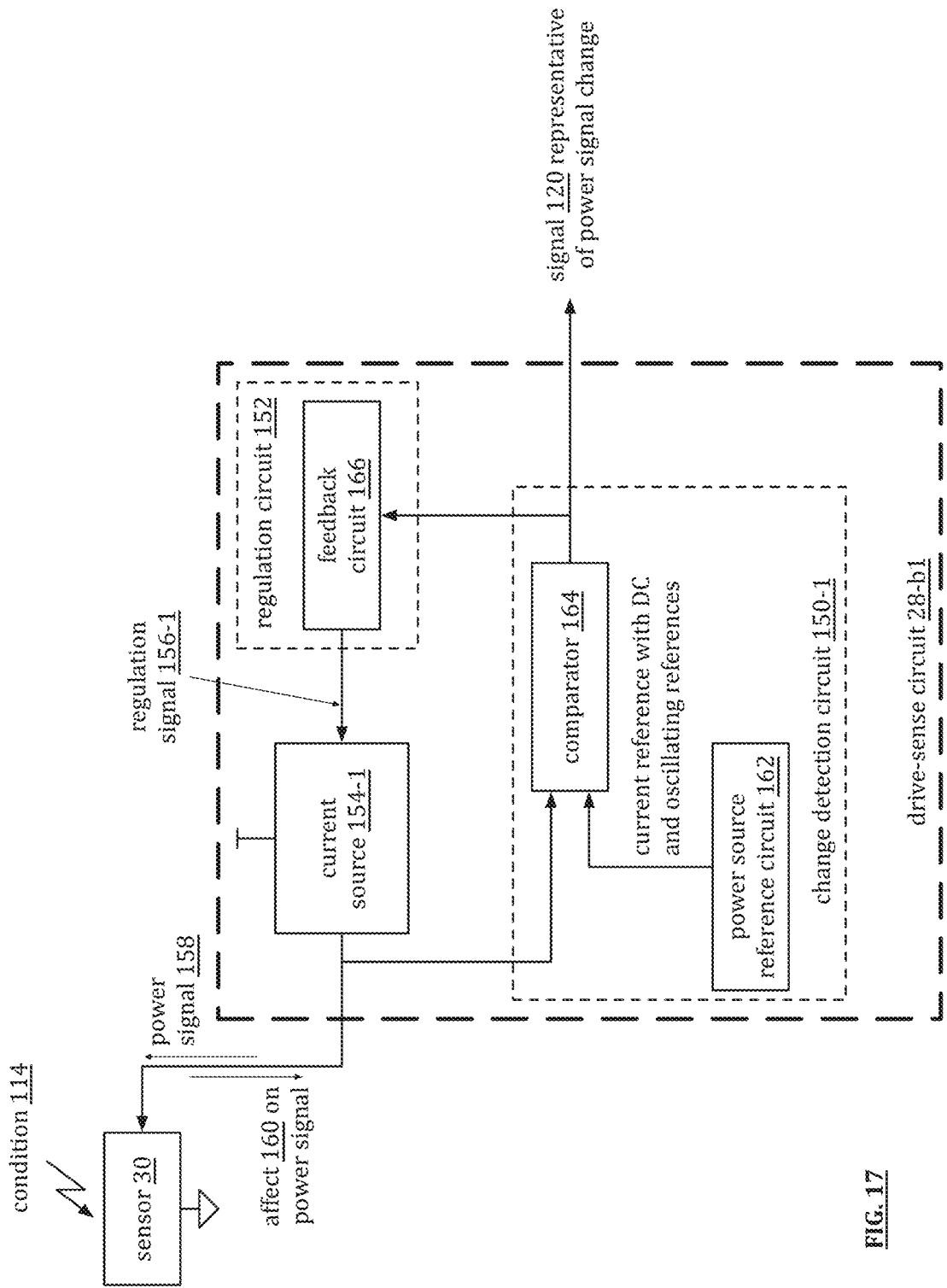
FIG. 17 is a schematic block diagram of another embodiment of a drive sense circuit in accordance with the present invention.

FIG. 17 is a schematic block diagram of another embodiment of a drive sense circuit 28-*b*1 that includes a current source 154-1 and a change detection circuit 150-1. The change detection circuit 150-1 includes a power source reference circuit 162 and a comparator 164. The current source 154-1 may be an independent current source, a dependent current source, a current mirror circuit, etc.

In an example of operation, the power source reference circuit 162 provides a current reference with DC and/or oscillating components to the comparator 164. The comparator 164 compares the reference current with the current power signal 158 generated by the current source 154-1 and produces, based on the comparison, the representative signal 120.

The regulation circuit 152, which includes a feedback circuit 166 (e.g., a dependent current source biasing circuit, a wire, etc.), generates a regulation signal 156-1 based on the representative signal 120 and provides the regulation signal to the current source 154-1. The current source generates a regulated current as the power signal 116 based on the regulation signal 156-1.

As an example, the current reference signal corresponds to a given current (I) times a given impedance (Z). The current source 154-1 generates the power signal to produce the given current (I). If the impedance of the sensor 30 substantially matches the given impedance (Z), then the comparator's output is reflective of the impedances substantially matching. If the impedance of the sensor 30 is greater than the given impedance (Z), then the comparator's output is indicative of how much greater the impedance of the sensor 30 is than that of the given impedance (Z). If the impedance of the sensor 30 is less than the given impedance (Z), then the comparator's output is indicative of how much less the impedance of the sensor 30 is than that of the given impedance (Z). The regulation circuit functions to account for the variations in the impedance of the sensor and to ensure that the current source produces a regulated current source (e.g., it remains substantially at the given current (I)).

Figure 18:
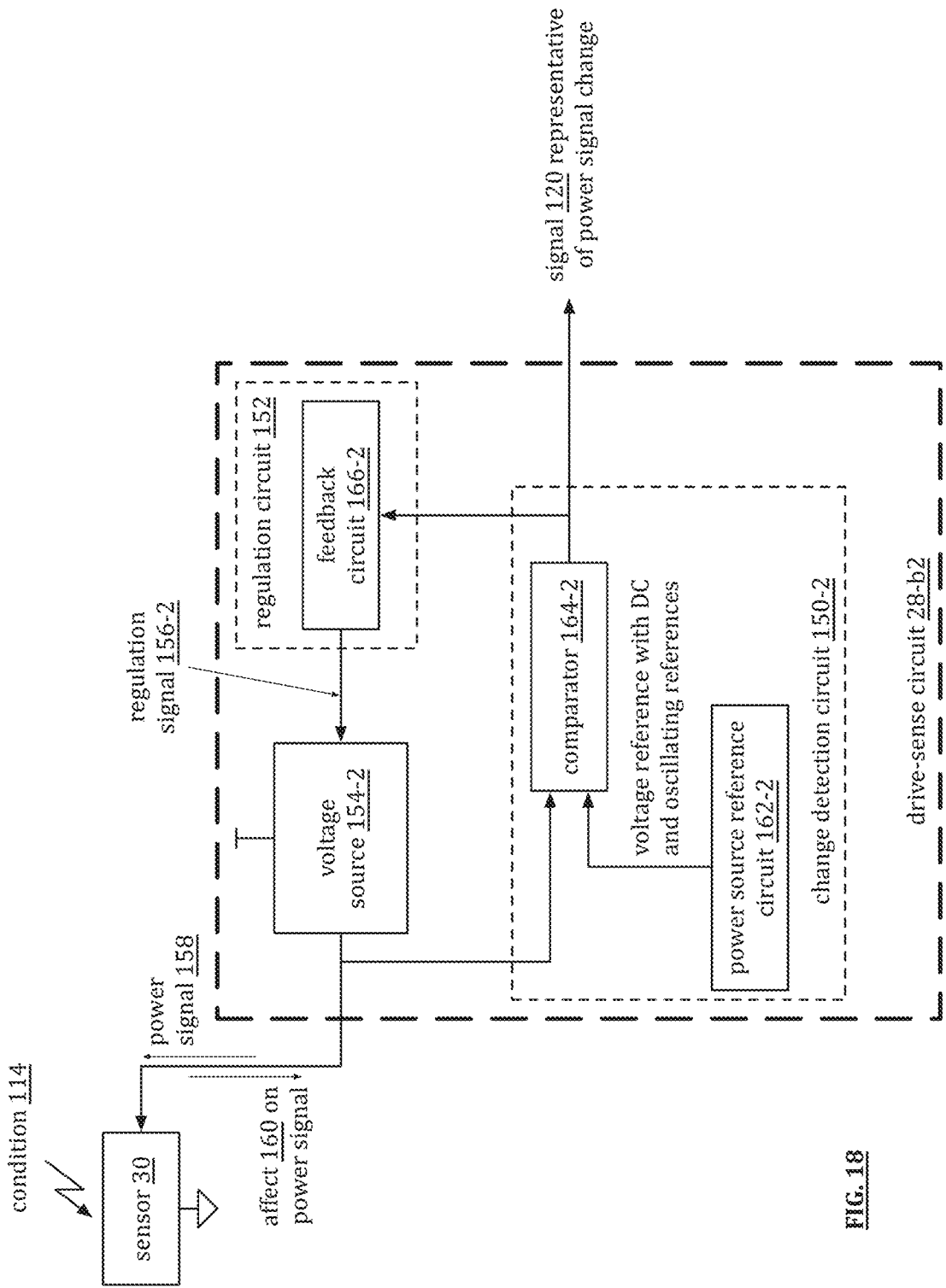
FIG. 18 is a schematic block diagram of another embodiment of a drive sense circuit in accordance with the present invention.

FIG. 18 is a schematic block diagram of another embodiment of a drive sense circuit 28-*b*2 that includes a voltage source 154-2 and a change detection circuit 150-2. The change detection circuit 150-2 includes a power source reference circuit 162-2 and a comparator 164-2. The voltage source 154-2 may be a linear regulator, a DC-DC converter, etc.

In an example of operation, the power source reference circuit 162-2 provides a voltage reference with DC and oscillating components to the comparator 164-2. The comparator 164-2 compares the reference voltage with the voltage power signal 158 generated by the voltage source 154-2 and produces, based on the comparison, the representative signal 120.

The regulation circuit 152, which includes a feedback circuit 166-2 (e.g., a power supply regulation circuit, a bias circuit, a wire, etc.), generates a regulation signal 156-2 based on the representative signal 120 and provides the regulation signal to the voltage source 154-2. The voltage source generates a regulated voltage as the power signal 116 based on the regulation signal 156-1.

As an example, the voltage reference signal corresponds to a given voltage (V) divided by a given impedance (Z). The voltage source 154-2 generates the power signal to produce the given voltage (V). If the impedance of the sensor 30 substantially matches the given impedance (Z), then the comparator's output is reflective of the impedances substantially matching. If the impedance of the sensor 30 is greater than the given impedance (Z), then the comparator's output is indicative of how much greater the impedance of the sensor 30 is than that of the given impedance (Z). If the impedance of the sensor 30 is less than the given impedance (Z), then the comparator's output is indicative of how much less the impedance of the sensor 30 is than that of the given impedance (Z). The regulation circuit functions to account for the variations in the impedance of the sensor and to ensure that the voltage source produces a regulated voltage source (e.g., it remains substantially at the given voltage (V)).

Figure 19:
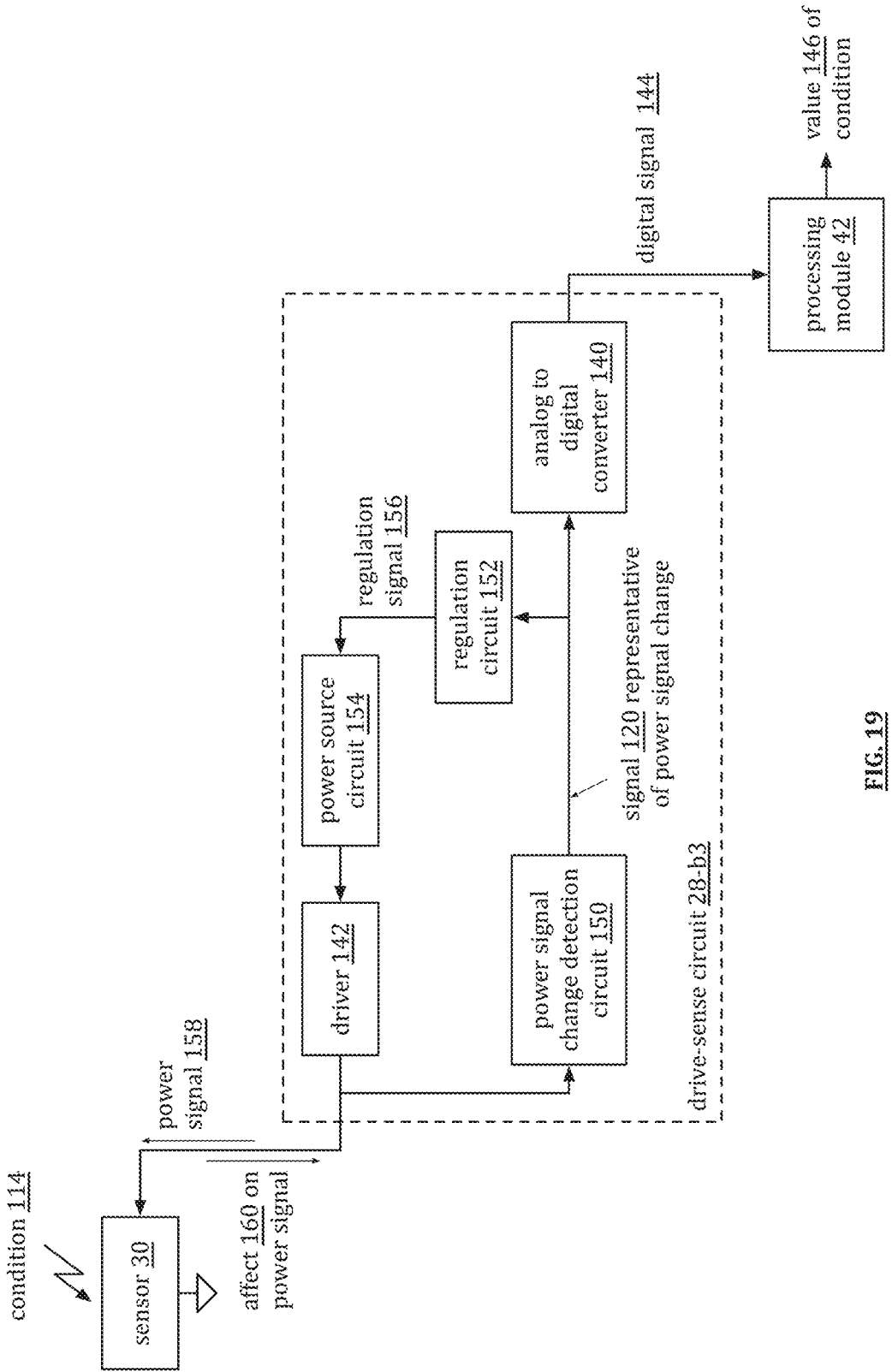
FIG. 19 is a schematic block diagram of another embodiment of a drive sense circuit in accordance with the present invention.

FIG. 19 is a schematic block diagram of another embodiment of a drive sense circuit 28-*b*3 that includes the power source circuit 154, the change detection circuit 150, the regulation circuit 152, an analog to digital converter 140, and a driver 142. The power source circuit 154, the regulation circuit 152, and the change detection circuit 150 function as previously discussed with reference to FIG. 16 to produce the regulation signal 156 and the signal 120 that is representative of a power signal change.

In this embodiment, the power source circuit 154 provides its output to the driver 142, which functions to increase the power (e.g., increase voltage and/or current) of the power signal. The driver 142 provides the power signal 116 to the sensor 30. With a driver, which may be a power amplifier, a low impedance sensor 30 may be used for specific types of sensing applications.

The analog to digital converter 140 converts the signal 120 that represents the power signal change into a digital signal 144. The digital signal 144 is provided to the processing module 42 via a connection between the drive-sense circuit and the processing module.

Figure 20:
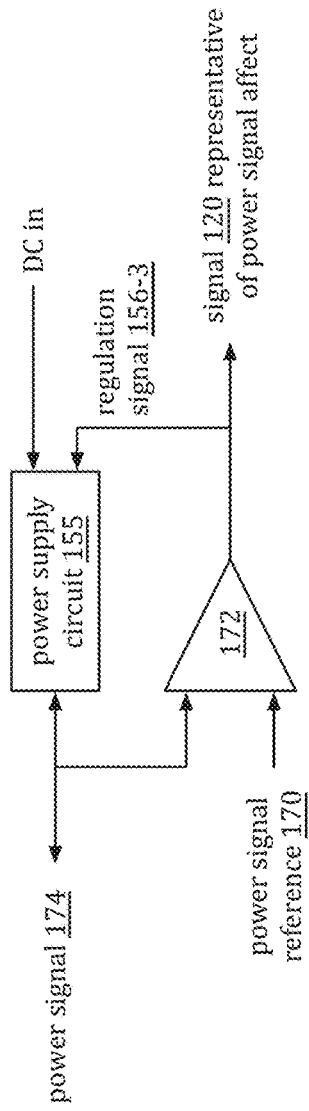
FIG. 20 is a schematic block diagram of another embodiment of a drive sense circuit in accordance with the present invention.

FIG. 20 is a schematic block diagram of another embodiment of a drive-sense circuit 28 that includes a power supply circuit 155 and an operational amplifier (op amp) or comparator 172. The power supply circuit 155 may be implemented in a variety of ways. For example, the power supply circuit 155 is a linear regulator that steps down a DC input voltage (DC in) to produce the power signal 174 based on a regulation signal 156-3. As another example, the power supply circuit 155 is a DC-DC converter that steps up or steps down the DC input voltage based on the regulation signal to produce the power signal 174.

The op amp 172 compares the power signal 174 with the power signal reference to produce the regulation signal 156-3, which is also the signal 120 representing a power signal change. In a specific embodiment, the power supply circuit 155 includes a P-channel FET (field effect transistor) and a bias circuit. The source of the P-channel FET is coupled to the DC input, the gate to the bias circuit, and the drain is coupled to provide the power signal 174. The bias circuit receives the regulation signal 156-3 and adjusts a gate-source voltage such that the voltage of the power signal 174 substantially matches the voltage of the power signal reference 170. For example, if the power signal reference has a DC component and/or an oscillating component as shown in FIG. 7, then the power signal 174 will have a substantially similar DC component and/or oscillating component.

When the power signal 174 is provided to a sensor and the sensor is exposed to a condition, an electrical characteristic of the sensor will affect the power signal. The control loop that regulates the voltage of the power signal 174 to substantially match the voltage of the power reference signal 170 will adjust the regulation signal to compensate for the affects the sensor has on the power signal 174. The compensation corresponds to the affect the electrical characteristic of the sensor has on the power signal and is representative of the condition being sensed by the sensor. Thus, the regulation signal 156-3 provides both the regulation of the power supply circuit 155 and the signal 120 that represents the effect on the power signal.

Figure 21:
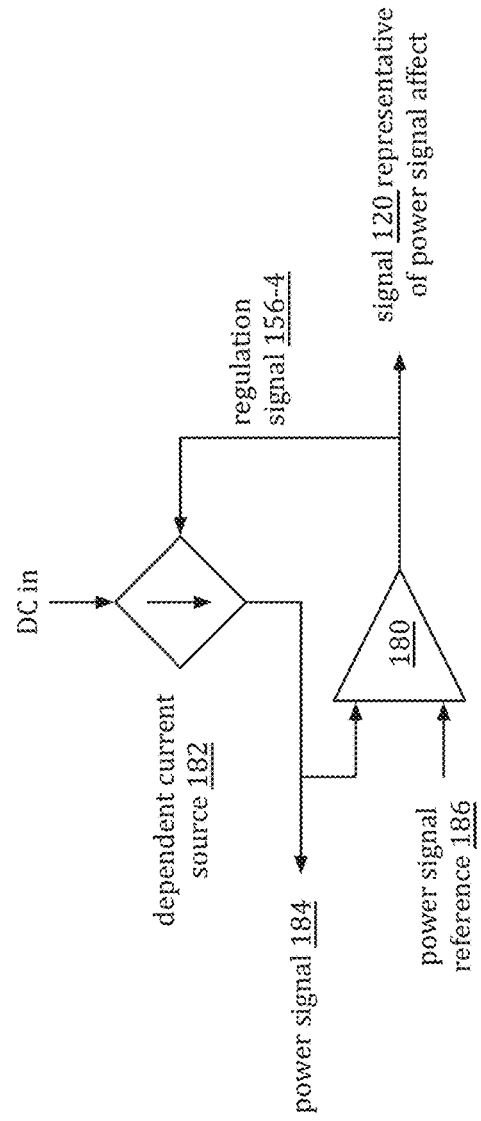
FIG. 21 is a schematic block diagram of another embodiment of a drive sense circuit in accordance with the present invention.

FIG. 21 is a schematic block diagram of another embodiment of a drive-sense circuit 28 that includes a dependent current source 182 and a transimpedance amplifier 180, which functions as a current comparator in this embodiment. The dependent current source 182 may be implemented in a variety of ways. For example, the dependent current source 182 is a current mirror circuit sourced via a DC input voltage (DC in) to produce the power signal 184 based on a regulation signal 156-3. As another example, the dependent current source 182 is voltage controlled current source. As yet another example, the dependent current source 182 is current controlled current source.

The transimpedance amplifier 180 compares current of the power signal 174 with current of the power signal reference 186 to produce the regulation signal 156-4, which is also the signal 120 representing a power signal change. In a specific embodiment, the power supply circuit 155 includes a P-channel FET (field effect transistor) and a bias circuit. The source of the P-channel FET is coupled to the DC input, the gate to the bias circuit, and the drain is coupled to provide the power signal 184. The bias circuit receives the regulation signal 156-4 and adjusts a gate-source voltage such that the current of the power signal 184 substantially matches the current of the power signal reference 186.

When the current of the power signal 184 is provided to a sensor and the sensor is exposed to a condition, an electrical characteristic of the sensor will affect the power signal. The control loop that regulates the current of the power signal 184 to substantially match the current of the power reference signal 186 will adjust the regulation signal to compensate for the affects the sensor has on the power signal 184. The compensation corresponds to the affect the electrical characteristic of the sensor has on the power signal and is representative of the condition being sensed by the sensor. Thus, the regulation signal 156-4 provides both the regulation of the dependent current source 182 and the signal 120 that represents the effect on the power signal.

Figure 22:
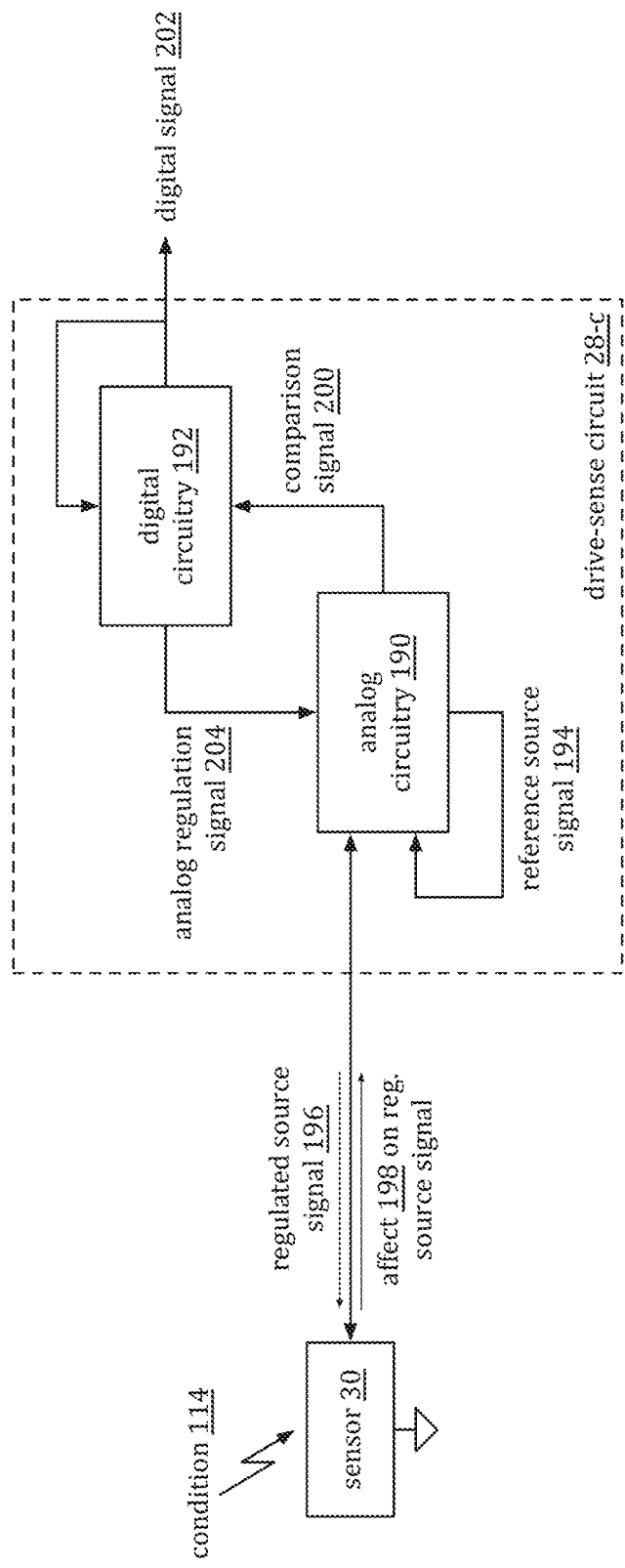
FIG. 22 is a schematic block diagram of another embodiment of a drive sense circuit in accordance with the present invention.

FIG. 22 is a schematic block diagram of another embodiment of a drive sense circuit 28-c, which is coupled to a sensor 30. The drive sense circuit 28-c includes analog circuitry 190 and digital circuitry 192. When the analog circuitry 190 is enabled, it is operable to generate a regulated source signal 196 based on an analog regulation signal 204. The analog circuitry is enabled in a variety of ways. For example, the analog circuitry 190 is enable when power is applied to the drive sense circuit 28-c. As another example, the analog circuitry 190 is enabled when the drive sense circuit receives a control signal from the processing module.

The analog circuitry 190 provides the regulated source signal 196 to the sensor 30. The regulated source signal 196 may be a regulated current signal, a regulated voltage signal, or a regulated impedance signal. When the sensor 30 is exposed to a condition 114, an electrical characteristic of the sensor affects 198 the regulated source signal.

In addition to generating the regulated source signal 196, the analog circuitry 190 also generates a reference source signal 194 at a desired source level. For example, the reference source signal 194 is generated to include a DC component having a magnitude and/or an oscillating component having a waveform (e.g., sinusoidal, square, triangular, polygonal, multiple step, etc.), a frequency, a phase, and a magnitude. The analog circuitry 190 is further operable to compare the regulated source signal 196 to the reference source signal 194 to produce a comparison signal 200. The comparison signal 200 corresponds to the affect the electrical characteristic of the sensor has on the regulated source signal and is representative of the condition 114 being sensed by the sensor 30.

When the digital circuitry is enabled, it is operable to convert the comparison signal 200 into a digital signal 202. The digital signal is a digital representation of the comparison signal and, as such, corresponds to the affect the electrical characteristic of the sensor has on the regulated source signal and is representative of the condition 114 being sensed by the sensor 30. The digital circuitry 192 is further operable to convert the digital signal 202 into the analog regulation signal 204.

Figure 23:
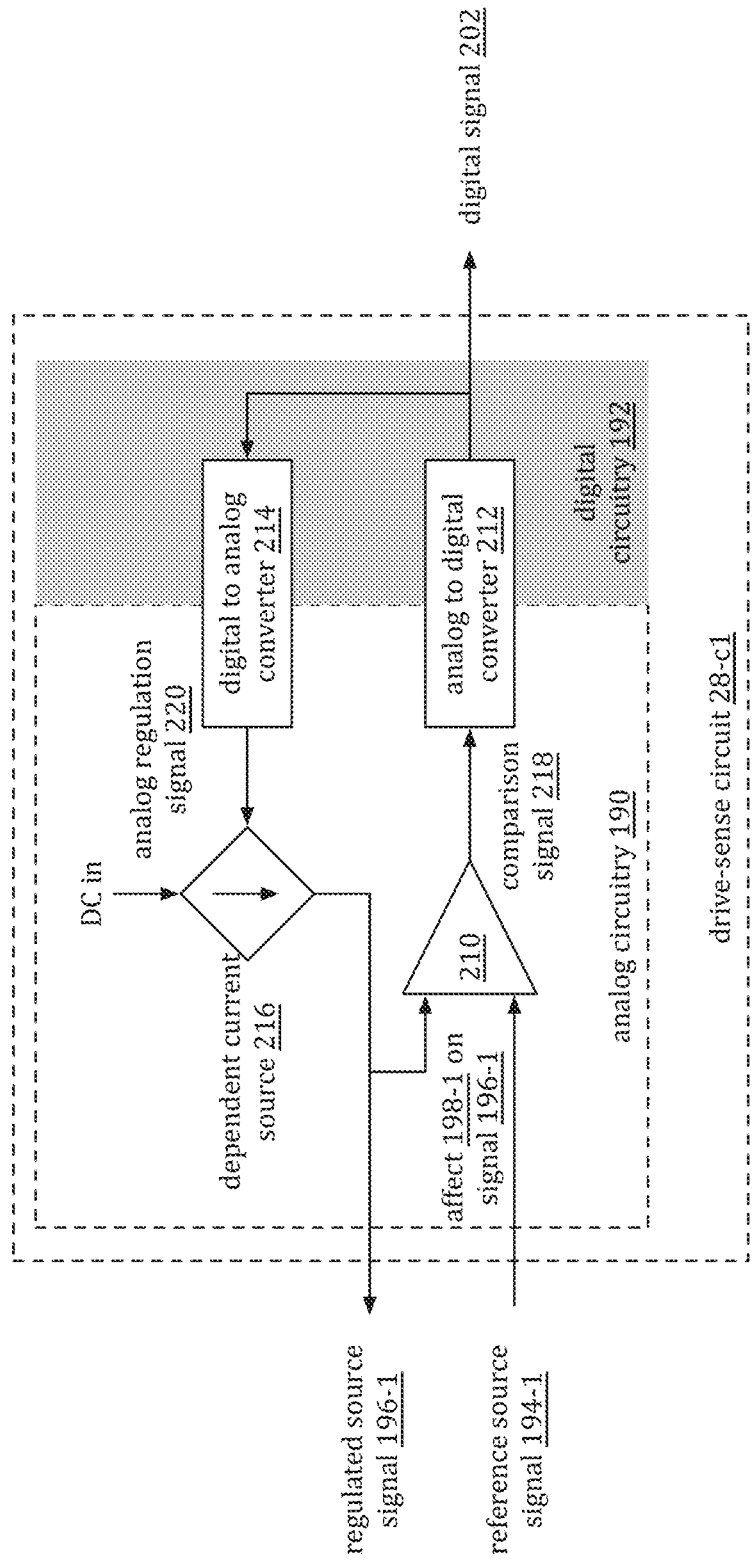
FIG. 23 is a schematic block diagram of another embodiment of a drive sense circuit in accordance with the present invention.

FIG. 23 is a schematic block diagram of another embodiment of a drive sense circuit 28-c1 that includes the analog circuitry 190 and the digital circuitry 192. The analog circuitry 190 includes a dependent current source 216, a comparator 210, an analog portion of an analog to digital converter 212, and an analog portion of a digital to analog converter 214. The digital circuitry 192 includes a digital portion of the analog to digital converter 212, and a digital portion of the digital to analog converter 214. The analog to digital converter (ADC) 212 may be a flash ADC, a successive approximation ADC, a ramp-compare ADC, a Wilkinson ADC, an integrating ADC, a delta encoded ADC, and/or a sigma-delta ADC. The digital to analog converter (DAC) 214 may be a sigma-delta DAC, a pulse width modulator DAC, a binary weighted DAC, a successive approximation DAC, and/or a thermometer-coded DAC.

The dependent current source 216 generates the regulated source signal 196-1 as a regulated current signal based on the analog regulation signal 220. The comparator 210 compares the regulated source signal 196-1 with a reference source signal 194-1, which is a current reference signal having a DC component and/or an oscillating component. The comparison signal 218 corresponds to the effect on the regulated source signal 196-1 and is representative of the condition 114 being sensed by the sensor 30. The comparator 210 provides the comparison signal 218 to the analog to digital converter 212, which generates the digital signal 202. The digital to analog converter 214 converts the digital signal into the analog regulation signals 220.

Figure 24:
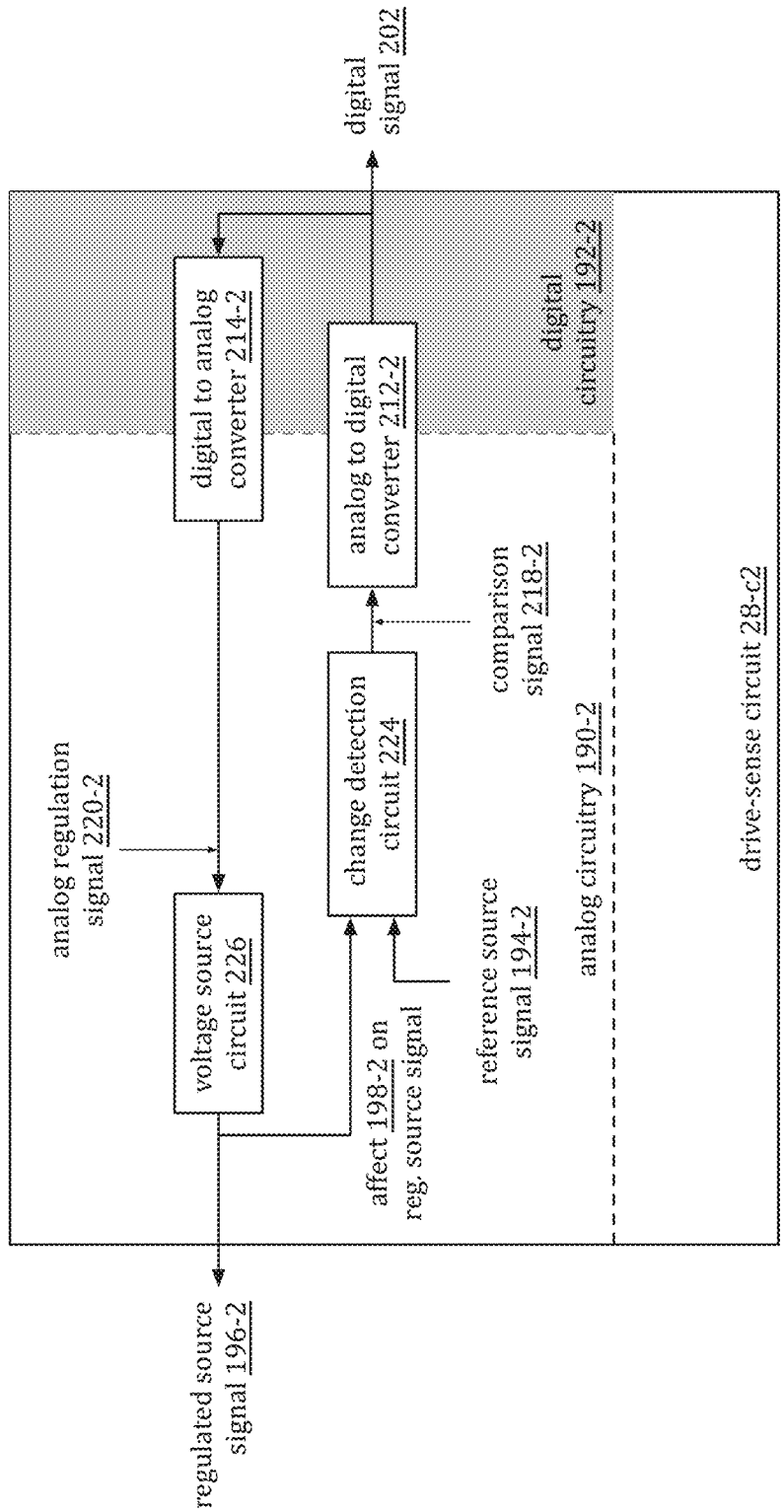
FIG. 24 is a schematic block diagram of another embodiment of a drive sense circuit in accordance with the present invention.

FIG. 24 is a schematic block diagram of another embodiment of a drive sense circuit 28-c2 that includes the analog circuitry 190 and the digital circuitry 192. The analog circuitry 190 includes a voltage source circuit 216, a change detection circuit 224, an analog portion of an analog to digital converter 212-2, and an analog portion of a digital to analog converter 214-2. The digital circuitry 192 includes a digital portion of the analog to digital converter 212-2, and a digital portion of the digital to analog converter 214-2. The analog to digital converter 212-2 and the digital to analog converter 214-2 are one or more of the types discussed with reference to FIG. 23.

The voltage source circuit 226 (e.g., a power supply, a linear regulator, a biased transistor, etc.) generates the regulated source signal 196-2 as a regulated voltage signal based on the analog regulation signal 220-2. The change detection circuit 224 (e.g., an op amp, a comparator, etc.) compares the regulated source signal 196-2 with a reference source signal 194-2, which is a voltage reference signal having a DC component and/or an oscillating component. The comparison signal 218-2 corresponds to the effect on the regulated source signal 196-2 and is representative of the condition 114 being sensed by the sensor 30. The change detection circuit 224 provides the comparison signal 218-2 to the analog to digital converter 212-2, which generates the digital signal 202. The digital to analog converter 214-2 converts the digital signal into the analog regulation signals 220-2.

Figure 25:
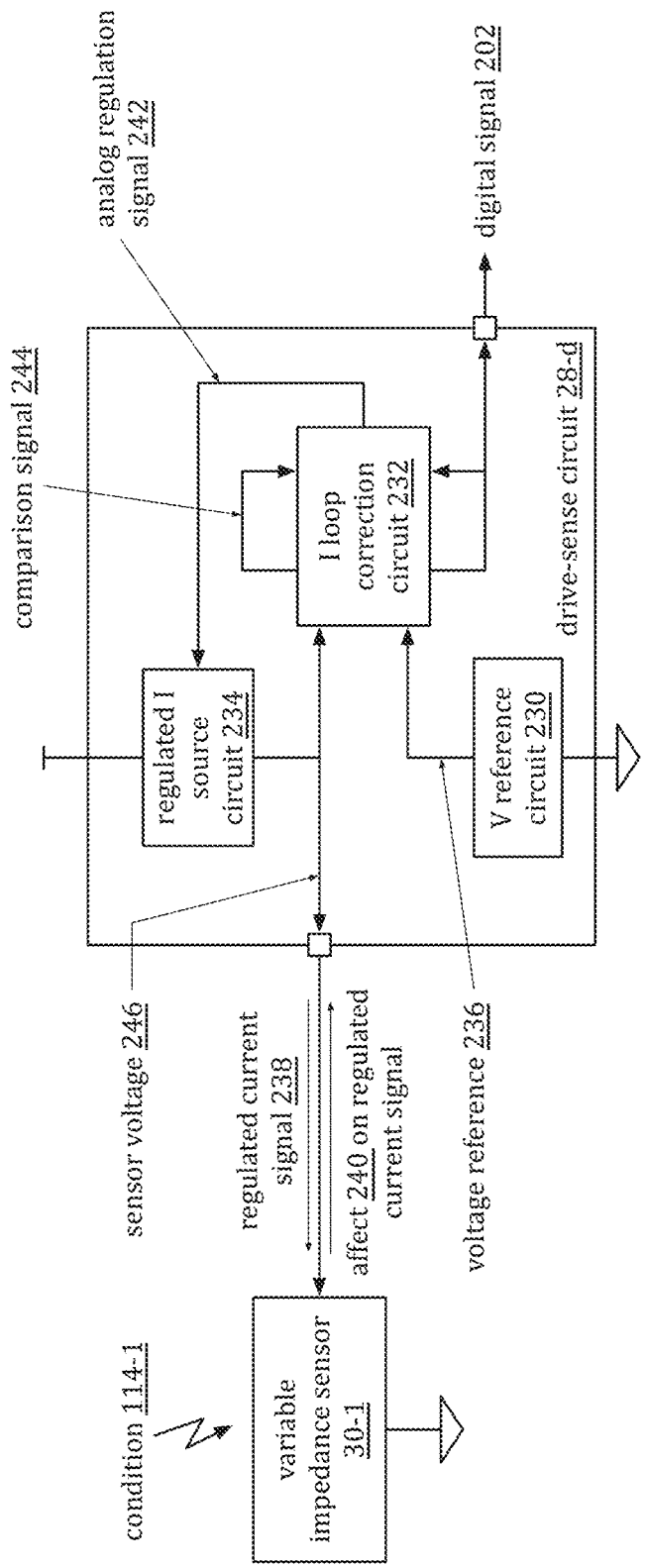
FIG. 25 is a schematic block diagram of another embodiment of a drive sense circuit in accordance with the present invention.

FIG. 25 is a schematic block diagram of another embodiment of a drive sense circuit 28-d coupled to a variable impedance sensor 30-1. The drive sense circuit 28-d includes a voltage (V) reference circuit 230, a current (I) loop correction circuit 232, and a regulated current (I) source circuit 234. In general, the drive sense circuit 28-d regulates the current applied to the sensor and keeps the voltage constant to sense an impedance (Z) of the sensor 30-1 in relation to a sensor voltage 246 and a voltage reference 236.

When the drive sense circuit 28-d is enabled, the regulated current source circuit 234 is operable to generate a regulated current signal 238 based on an analog regulation signal 242. The regulated current source circuit 234 generates the regulated current signal 238 such that the sensor voltage 246 substantially matches a voltage reference 236 produced by the V reference circuit 230.

The V reference circuit 230 (which may be a bandgap reference, a regulator, a divider network, an AC generator, and/or combining circuit) generates the voltage reference 236 to include a DC component and/or at least one oscillating component. For example, the V reference circuit generates a DC component to have a magnitude between 1 and 3 volts, generates a first sinusoidal oscillating component at frequency 1, and generates a second sinusoidal oscillating component at frequency 2. As a specific example, the first sinusoidal oscillating component at frequency 1 is used to sense self-touch on a touch screen display and the second sinusoidal oscillating component at frequency 2 is used to sense mutual touch on the touch screen display.

The regulated current source circuit 234 provides the regulated current signal 238 to the sensor 30-1. When the sensor 30-1 is exposed to a condition 114-1, its impedance affects 240 the regulated current signal 238 based on V=I*Z. As such, the sensor voltage 246 is created as a result of the current (I) provided by the regulated current source circuit 234 and the impedance of the sensor 30-1. As the impedance of the sensor 30-1 changes due to changing conditions 114-1, the current provided by the regulated current source circuit 234 changes so that the sensor voltage 246 remains substantially equal to the voltage reference 236, including the DC component and/or the oscillating component(s).

The current (I) loop correction circuit 232 is operable to generate a comparison signal 244 based on a comparison of the sensor voltage 246 with the voltage reference 236. The effect of the impedance of the sensor on the regulated current signal 238 is detected by the I loop correction circuit 232 and captured by the comparison signal 244. The I loop correction circuit 232 is further operable to convert the comparison signal 244 into a digital signal 202, which is a digital representation of the affect the impedance of the sensor has on the regulated current signal and corresponds to the sensed condition 114-1. The I loop correction circuit is further operable to convert the digital signal 202 into the analog regulation signal 242, thereby creating a feedback loop to keep the sensor voltage 246 substantially equal to the voltage reference 236.

Figure 26:
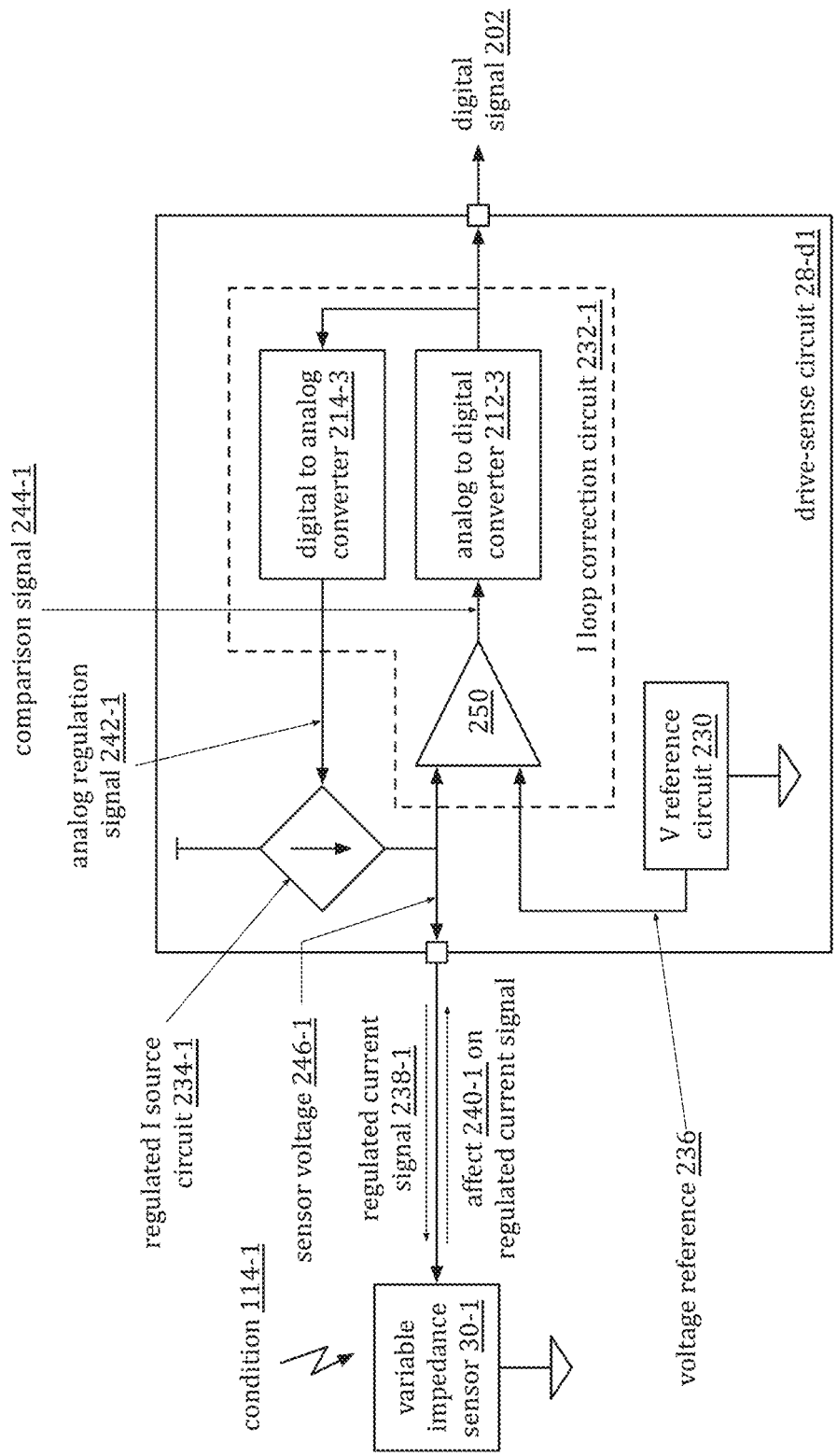
FIG. 26 is a schematic block diagram of another embodiment of a drive sense circuit in accordance with the present invention.

FIG. 26 is a schematic block diagram of another embodiment of a drive sense circuit 28-d1 coupled to a variable impedance sensor 30-1. The drive sense circuit 28-d1 includes the voltage (V) reference circuit 230, a current (I) loop correction circuit 232-1, and a regulated current (I) source circuit 234-1. The regulated current (I) source circuit 234-1 includes a dependent current source and the I loop correction circuit 232-1 includes a voltage comparator or op amp 250, an analog to digital converter 212-3 and a digital to analog converter 214-3. The analog to digital converter 212-3 and the digital to analog converter 214-3 are one or more of the types discussed with reference to FIG. 23.

When the drive sense circuit 28-d1 is enabled, the regulated current source circuit 234-1 is operable to generate a regulated current signal 238-1 based on an analog regulation signal 242-1. The regulated current source circuit 234-1 generates the regulated current signal 238-1 such that the sensor voltage 246-1 substantially matches the voltage reference 236 produced by the V reference circuit 230.

The regulated current source circuit 234-1 provides the regulated current signal 238-1 to the sensor 30-1. When the sensor 30-1 is exposed to a condition 114-1, its impedance affects 240-1 the regulated current signal 238-1 based on V=I*Z. As such, the sensor voltage 246-1 is created as a result of the current (I) provided by the regulated current source circuit 234-1 and the impedance of the sensor 30-1. As the impedance of the sensor 30-1 changes due to changing conditions 114-1, the current provided by the regulated current source circuit 234-1 changes so that the sensor voltage 246-1 remains substantially equal to the voltage reference 236-1, including the DC component and/or the oscillating component(s).

The comparator 250 compares the sensor voltage 246-1 with the voltage reference 236 to produce a comparison signal 244-1. The effect of the impedance of the sensor on the regulated current signal 238-1 is captured by the comparison signal 244-1. The analog to digital converter 212-3 converts the comparison signal 244-1 into a digital signal 202, which is a digital representation of the affect the impedance of the sensor has on the regulated current signal and corresponds to the sensed condition 114-1. The digital to analog converter 214-3 converts the digital signal 202 into the analog regulation signal 242-1, thereby creating a feedback loop to keep the sensor voltage 246-1 substantially equal to the voltage reference 236.

Figure 27:
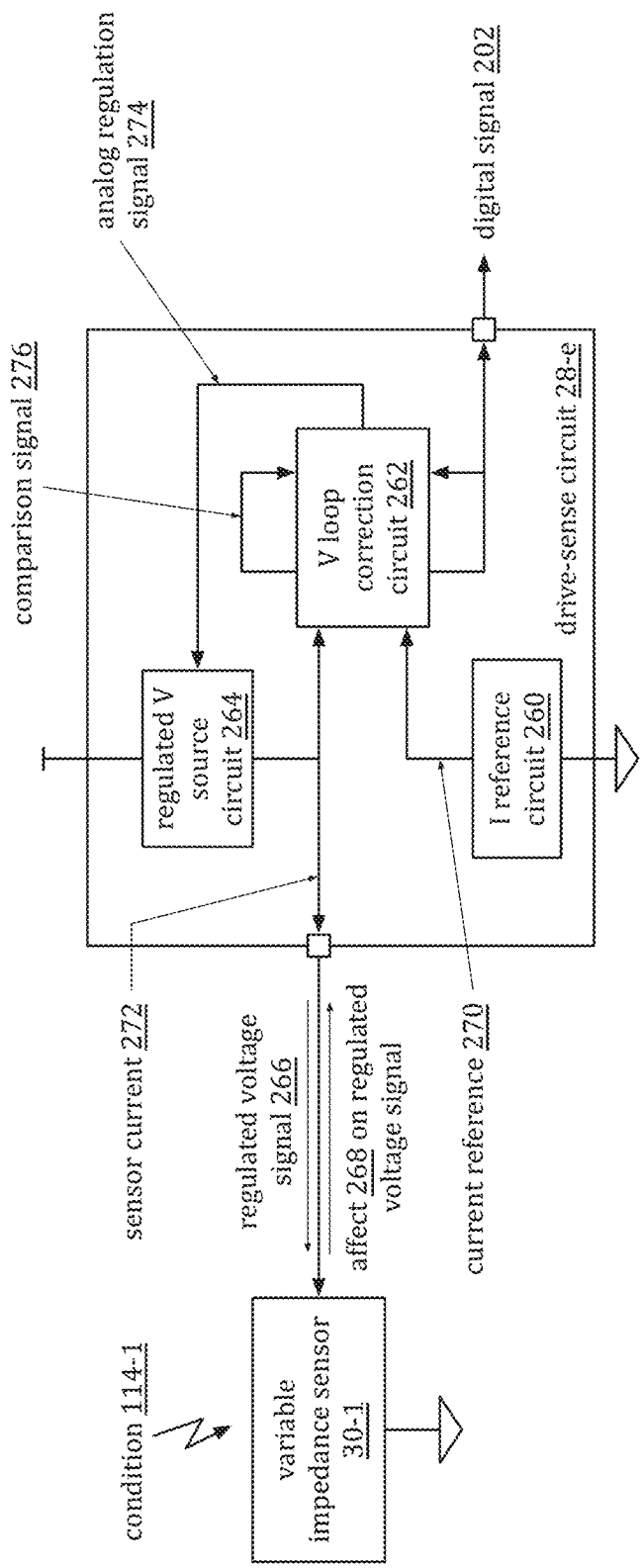
FIG. 27 is a schematic block diagram of another embodiment of a drive sense circuit in accordance with the present invention.

FIG. 27 is a schematic block diagram of another embodiment of a drive sense circuit 28-e coupled to a variable impedance sensor 30-1. The drive sense circuit 28-e includes a current (I) reference circuit 260, a voltage (V) loop correction circuit 262, and a regulated voltage (V) source circuit 264. In general, the drive sense circuit 28-e regulates the voltage applied to the sensor and keeps the current constant to sense an impedance (Z) of the sensor 30-1 in relation to a sensor current 272 and a current reference 270.

When the drive sense circuit 28-e is enabled, the regulated voltage source circuit 264 is operable to generate a regulated voltage signal 266 based on an analog regulation signal 274. The regulated voltage source circuit 264 generates the regulated voltage signal 266 such that the sensor current 272 substantially matches the current reference 270 produced by the I reference circuit 260.

The I reference circuit 260 (which may be a biased dependent current source, an independent current source, a current mirror, an AC current generator, and/or combining circuit) generates the current reference 270 to include a DC component and/or at least one oscillating component. For example, the I reference circuit generates a DC component to have a magnitude between 100 micro-amps and 300 micro-amps (or other range), generates a first sinusoidal oscillating current component at frequency 1, and generates a second sinusoidal oscillating current component at frequency 2. As a specific example, the first sinusoidal oscillating current component at frequency 1 is used to sense self-touch on a touch screen display and the second sinusoidal oscillating current component at frequency 2 is used to sense mutual touch on the touch screen display.

The regulated voltage source circuit 264 provides the regulated voltage signal 266 to the sensor 30-1. When the sensor 30-1 is exposed to a condition 114-1, its impedance affects 240 the regulated voltage signal 266 based on Z=V/I. As such, the sensor current 272 is created as a result of the voltage (V) provided by the regulated voltage source circuit 264 and the impedance of the sensor 30-1. As the impedance of the sensor 30-1 changes due to changing conditions 114-1, the voltage provided by the regulated voltage source circuit 264 changes so that the sensor current 272 remains substantially equal to the current reference 270, including the DC component and/or the oscillating component(s).

The voltage (V) loop correction circuit 262 is operable to generate a comparison signal 276 based on a comparison of the sensor current 272 with the current reference 270. The effect of the impedance of the sensor on the regulated voltage signal 266 is detected by the V loop correction circuit 262 and is captured by the comparison signal 276. The V loop correction circuit 262 is further operable to convert the comparison signal 276 into the digital signal 202, which is a digital representation of the affect the impedance of the sensor has on the regulated voltage signal and corresponds to the sensed condition 114-1. The V loop correction circuit is further operable to convert the digital signal 202 into the analog regulation signal 274, thereby creating a feedback loop to keep the sensor current 272 substantially equal to the current reference 270.

Figure 28:
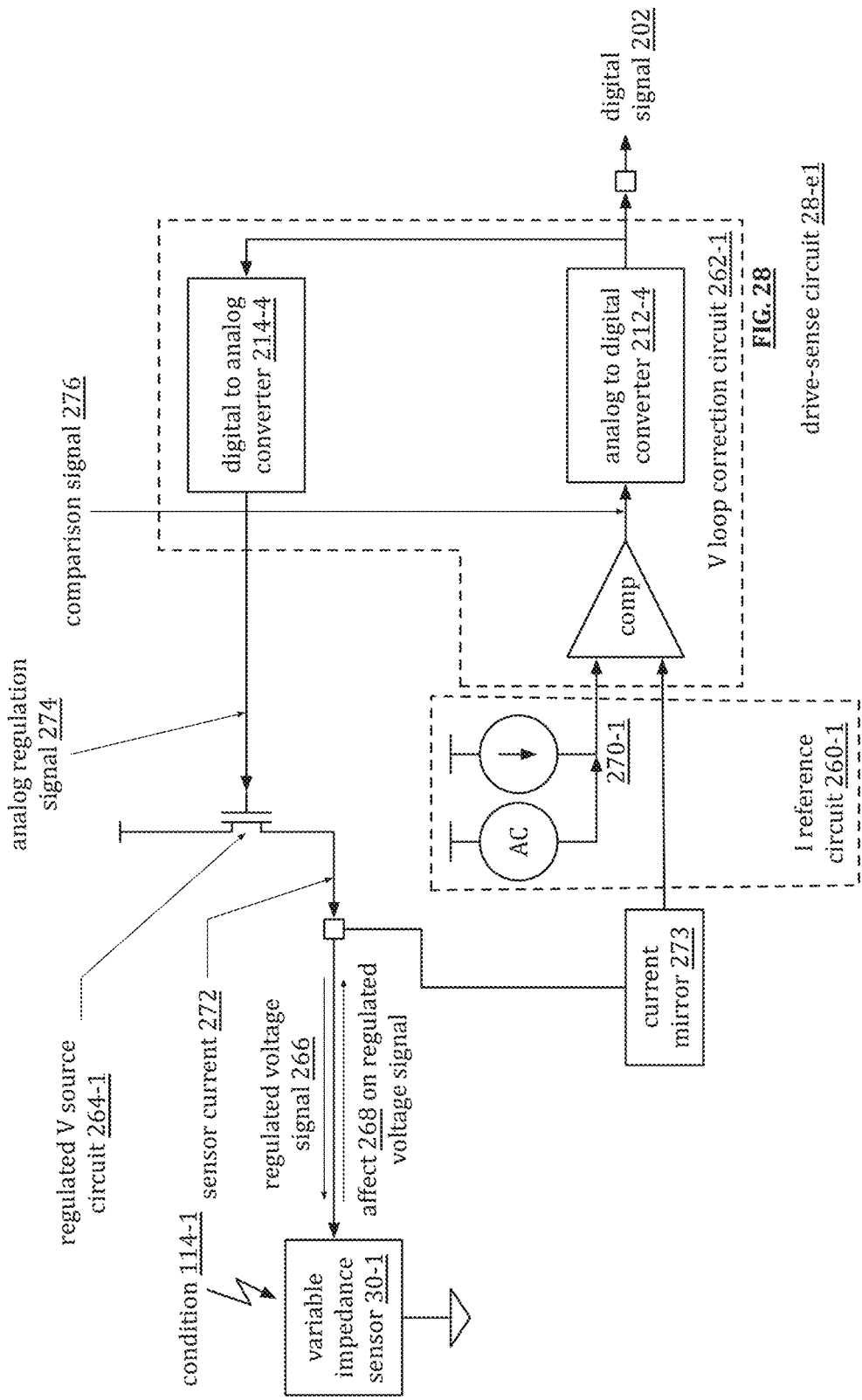
FIG. 28 is a schematic block diagram of another embodiment of a drive sense circuit in accordance with the present invention.

FIG. 28 is a schematic block diagram of another embodiment of a drive sense circuit 28-e1 coupled to a variable impedance sensor 30-1. The drive sense circuit 28-e1 includes a current (I) reference circuit 260-1, a voltage (V) loop correction circuit 262-1, and a regulated voltage (V) source circuit 264-1. The I reference circuit 260-1 includes an independent current source to produce a reference current ($I_{ref}$). The V loop correction circuit 262-1 includes a current comparator (e.g., a transimpedance amplifier), an analog to digital converter 212-4 and a digital to analog converter 214-4. The regulated voltage source 264-1 includes a P-channel FET and a current mirror 273. The regulated voltage source 264-1 may further include a bias circuit (not shown) coupled between the gate and source of the P-channel FET. The analog to digital converter 212-4 and the digital to analog converter 214-4 are one or more of the types discussed with reference to FIG. 23.

When the drive sense circuit 28-el is enabled, the regulated voltage source circuit 264-1 is operable to generate a regulated voltage signal 266 based on an analog regulation signal 274-1. The regulated voltage source circuit 264 generates the regulated voltage signal 266 such that the sensor current 272 substantially matches the current reference 270, a multiple thereof, or a fraction thereof, produced by the I reference circuit 260. The current mirror 273 mirrors the sensor current 272 and the mirrored current substantially matches the current reference 270. The mirrored current produced by the current mirror 273 is equal to the sensor current 272, is greater than the sensor current 272, or is less than the sensor current 272 depending on the application and/or the sensor sensitivity.

The I reference circuit 260 (which may a DC current source and/or an AC current source) generates the current reference 270-1 to include a DC component and/or at least one oscillating component. For example, the I reference circuit generates a DC component to have a magnitude between 100 micro-amps and 300 micro-amps (or other range), generates a first sinusoidal oscillating current component at frequency 1, and generates a second sinusoidal oscillating current component at frequency 2.

The regulated voltage source circuit 264-1 provides the regulated voltage signal 266 to the sensor 30-1. When the sensor 30-1 is exposed to a condition 114-1, its impedance affects 240 the regulated voltage signal 266 based on Z=V/I. As such, the sensor current 272 is created as a result of the voltage (V) provided by the regulated voltage source circuit 264-1 and the impedance of the sensor 30-1. As the impedance of the sensor 30-1 changes due to changing conditions 114-1, the voltage provided by the regulated voltage source circuit 264-1 changes so that the mirrored current of the sensor current 272 remains substantially equal to the current reference 270-1, including the DC component and/or the oscillating component(s).

The current comparator (comp) compares the mirrored current of the sensor current 272 with the current reference 270-1 to generate the comparison signal 276. The effect of the impedance of the sensor on the regulated voltage signal 266 is captured by the comparison signal 276. The analog to digital converter 212-4 converts the comparison signal 276 into the digital signal 202, which is a digital representation of the affect the impedance of the sensor has on the regulated voltage signal and corresponds to the sensed condition 114-1. The digital to analog converter 214-4 convert the digital signal 202 into the analog regulation signal 274, thereby creating a feedback loop to keep the mirrored current of the sensor current 272 substantially equal to the current reference 270-1.

Figure 29:
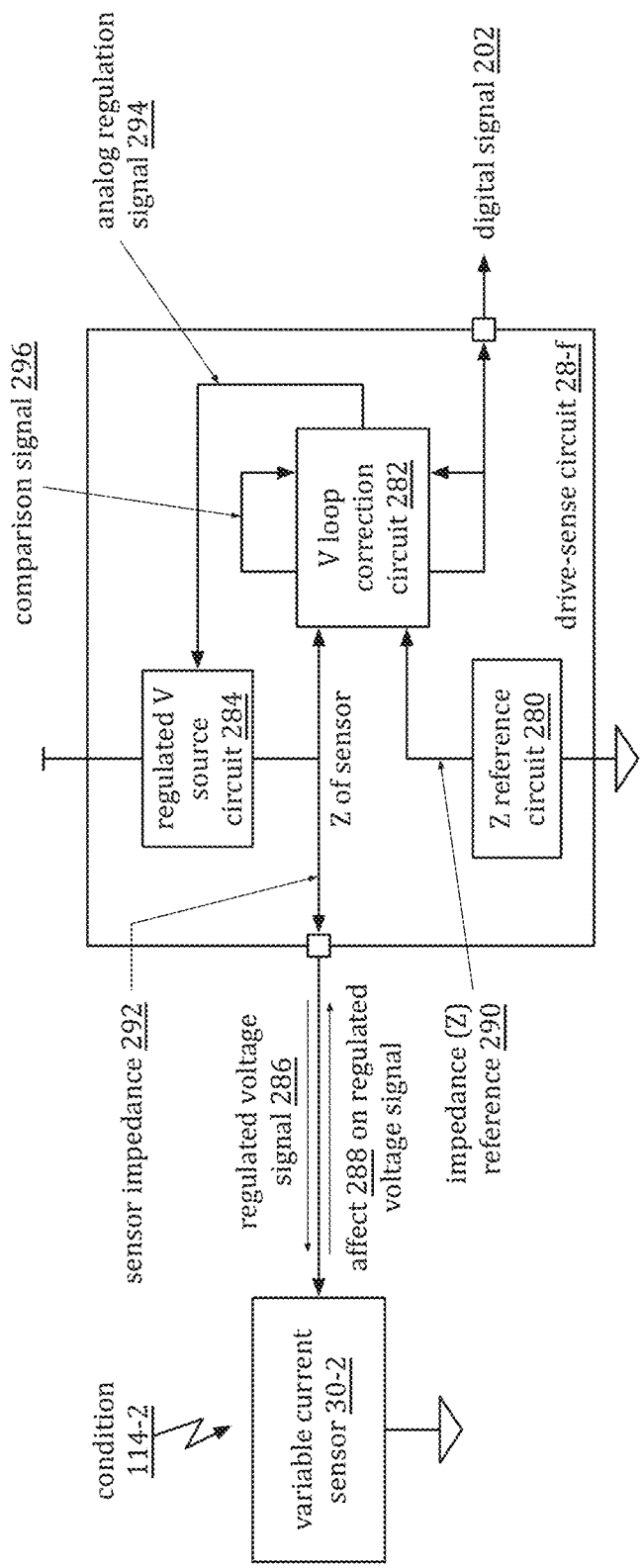
FIG. 29 is a schematic block diagram of another embodiment of a drive sense circuit in accordance with the present invention.

FIG. 29 is a schematic block diagram of another embodiment of a drive sense circuit 28-f coupled to a variable current sensor 30-2. The drive sense circuit 28-f includes an impedance (Z) reference circuit 280, a voltage (V) loop correction circuit 282, and a regulated voltage (V) source circuit 284. In general, the drive sense circuit 28-f regulates the voltage applied to the sensor and keeps the sensor's impedance constant to sense a current (I) of the sensor 30-2 in relation to a sensor impedance 292 and an impedance (Z) reference 290. Varying current of the sensor 30-2 is indicative of changes to the condition 114-2 being sensed (e.g., magnetic field, current flow, etc.), which may be used in motor monitoring applications, load sensing applications, electronic circuit applications, failure analysis applications, etc.

When the drive sense circuit 28-f is enabled, the regulated voltage source circuit 284 is operable to generate a regulated voltage signal 286 based on an analog regulation signal 294. The regulated voltage source circuit 284 generates the regulated voltage signal 286 such that the sensor impedance 292 (e.g., capacitance, inductance, etc.) substantially matches the impedance reference 290 produced by the Z reference circuit 280.

The Z reference circuit 280 (which may be a capacitor, an inductor, a circuit equivalent of a capacitor, a circuit equivalent of an inductor, a tunable capacitor bank, etc.) generates the impedance reference 290 to include a DC component and/or at least one oscillating (AC) component. For example, the Z reference circuit generates a DC component to have a desired resistance at DC and/or to have a first desired impedance at frequency 1, and have a second desired impedance at frequency 2.

The regulated voltage source circuit 284 provides the regulated voltage signal 286 to the sensor 30-2. When the sensor 30-2 is exposed to a condition 114-2, its current affects 288 the regulated voltage signal 286 based on I=V/Z. As such, the sensor impedance 292 corresponds to the voltage (V) provided by the regulated voltage source circuit 284 and the current flowing through the sensor 30-2. As the current of the sensor 30-2 changes due to changing conditions 114-1, the voltage provided by the regulated voltage source circuit 284 changes so that the sensor impedance 292 remains substantially equal to the impedance reference 290, including the DC resistance and/or desired impedances at f1 and f2.

The voltage (V) loop correction circuit 282 is operable to generate a comparison signal 296 based on a comparison of the sensor impedance 292 with the impedance reference 290. The effect of the current of the sensor on the regulated impedance signal 286 is detected by the V loop correction circuit 282 and is captured by the comparison signal 296. The V loop correction circuit 282 is further operable to convert the comparison signal 296 into the digital signal 202, which is a digital representation of the affect the current of the sensor has on the regulated voltage signal and corresponds to the sensed condition 114-2. The V loop correction circuit is further operable to convert the digital signal 202 into the analog regulation signal 294, thereby creating a feedback loop to keep the sensor impedance 292 substantially equal to the impedance reference 290.

Figure 30:
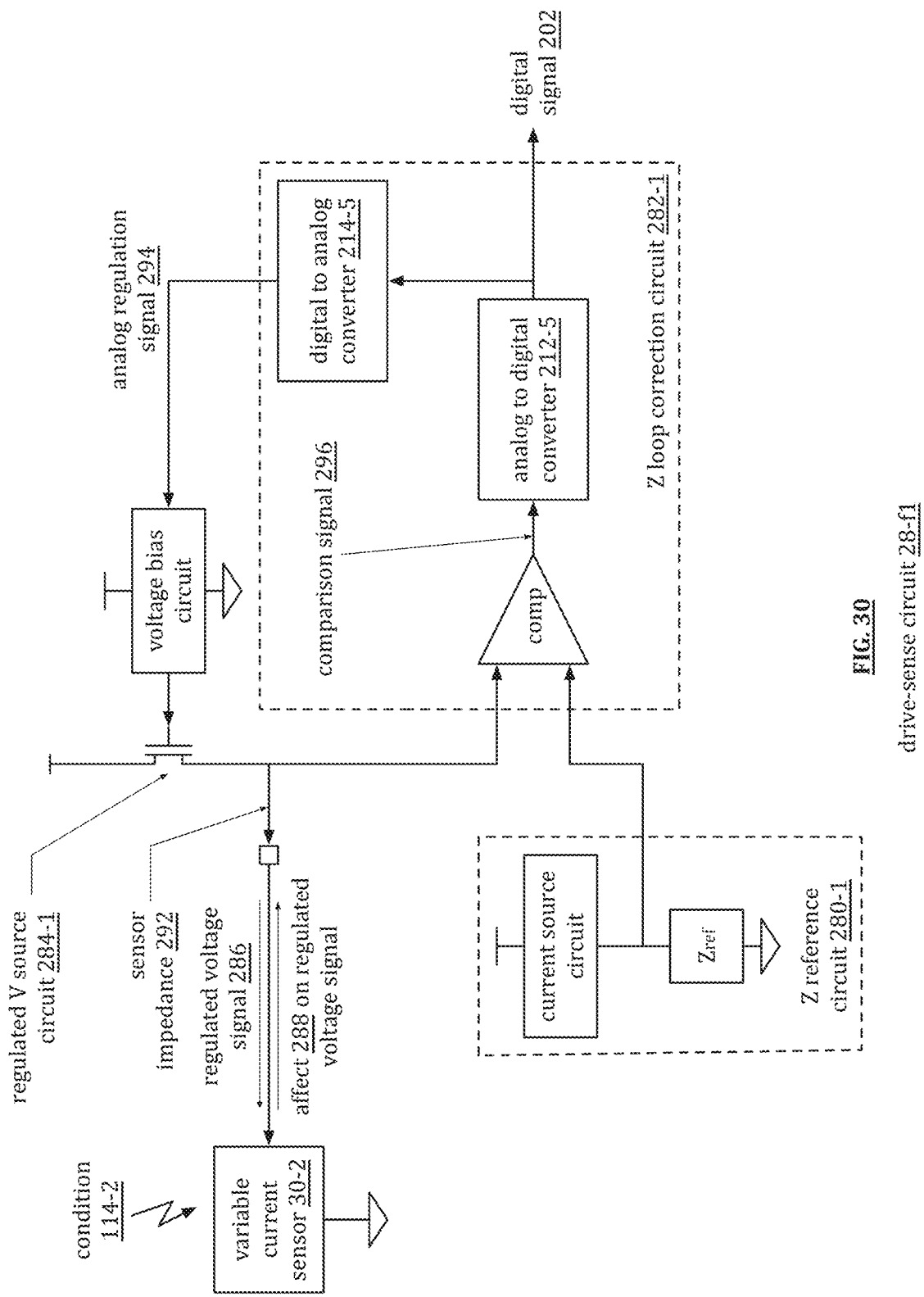
FIG. 30 is a schematic block diagram of another embodiment of a drive sense circuit in accordance with the present invention.

FIG. 30 is a schematic block diagram of another embodiment of a drive sense circuit 28-f1 coupled to a variable current sensor 30-2. The drive sense circuit 28-f1 includes an impedance (Z) reference circuit 280-1, a voltage (V) loop correction circuit 282-1, and a regulated voltage (V) source circuit 284-1. The Z reference circuit includes a current source circuit and an impedance ($Z_{ref}$) The V loop correction circuit 282-1 includes a comparator (comp), an analog to digital converter 212-5 and a digital to analog converter 214-5. The analog to digital converter 212-5 and the digital to analog converter 214-5 are one or more of the types discussed with reference to FIG. 23.

When the drive sense circuit 28-f1 is enabled, the regulated voltage source circuit 284-1, which includes a P-channel transistor and a voltage bias circuit, is operable to generate a regulated voltage signal 286 based on an analog regulation signal 294. The regulated voltage source circuit 284-1 generates the regulated voltage signal 286 such that the sensor impedance 292 (e.g., capacitance, inductance, etc.) substantially matches the impedance reference 290 produced by the Z reference circuit 280.

The Z reference circuit 280 (which includes a current source circuit and an impedance) generates the impedance reference 290 in accordance with (V/I) to include a DC component and/or at least one oscillating (AC) component. For example, the Z reference circuit generates a DC component to have a desired resistance at DC, to have a first desired impedance at frequency 1, and to have a second desired impedance at frequency 2.

The regulated voltage source circuit 284-1 provides the regulated voltage signal 286 to the sensor 30-2. When the sensor 30-2 is exposed to a condition 114-2, its current affects 288 the regulated impedance signal 286 based on I=V/Z. As such, the sensor impedance 292 corresponds to the voltage (V) provided by the regulated voltage source circuit 284 and the current flowing through the sensor 30-2. As the current of the sensor 30-2 changes due to changing conditions 114-1, the voltage provided by the regulated voltage source circuit 284 changes so that the sensor impedance 292 remains substantially equal to the impedance reference 290, including the DC resistance and/or desired impedances at f1 and f2.

The comparator compares (as voltages or currents) the impedance reference with the sensor impedance 292 to produce a comparison signal 296, which captures the effect of the current of the sensor has on the regulated impedance signal 286. The analog to digital converter 212-5 converts the comparison signal 296 into the digital signal 202, which is a digital representation of the affect the current of the sensor has on the regulated voltage signal and corresponds to the sensed condition 114-2. The digital to analog converter 214-5 converts the digital signal 202 into the analog regulation signal 294, thereby creating a feedback loop to keep the sensor impedance 292 substantially equal to the impedance reference 290.

Figure 31:
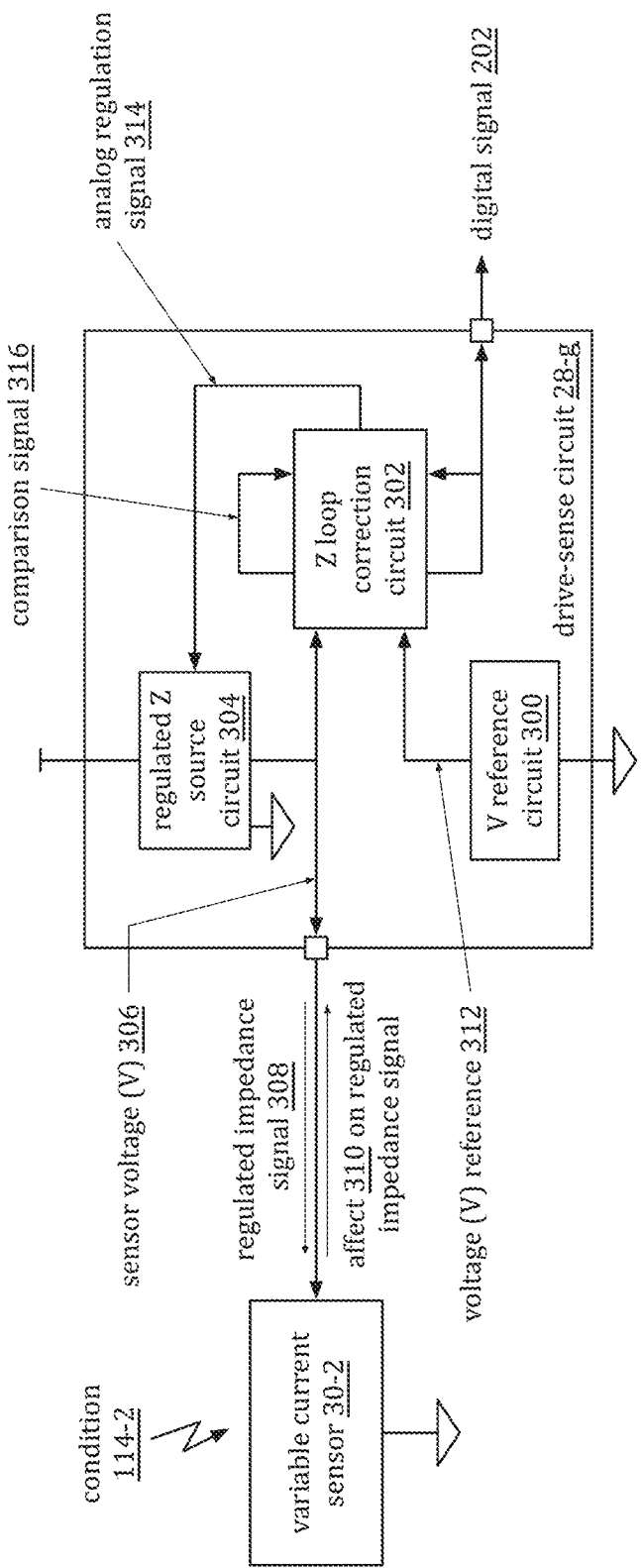
FIG. 31 is a schematic block diagram of another embodiment of a drive sense circuit in accordance with the present invention.

FIG. 31 is a schematic block diagram of another embodiment of a drive sense circuit 28-g coupled to a variable current sensor 30-2. The drive sense circuit 28-g includes a voltage (V) reference circuit 300, an impedance (Z) loop correction circuit 302, and a regulated impedance (Z) source circuit 304. In general, the drive sense circuit 28-g regulates the impedance of the sensor and keeps the sensor's voltage constant to sense a current (I) of the sensor 30-2 in relation to a sensor voltage 306 and a voltage (V) reference 312. Varying current of the sensor 30-2 is indicative of changes to the condition 114-2 being sensed (e.g., magnetic field, current flow, etc.), which may be used in motor monitoring applications, load sensing applications, electronic circuit applications, failure analysis applications, etc.

When the drive sense circuit 28-g is enabled, the regulated impedance source circuit 304 is operable to generate a regulated impedance signal 308 based on an analog regulation signal 314. The regulated impedance source circuit 304 generates the regulated impedance signal 308 by varying frequency of a voltage produced by the regulated Z source circuit 304 such that the sensor voltage 306 substantially matches the voltage reference 312 produced by the V reference circuit 300.

The V reference circuit 300 (which includes a bandgap reference, a linear regulator, a power supply, a divider network, an AC generator, a combining circuit and/or etc.) generates the voltage reference 312 to include a DC component and/or at least one oscillating (AC) component. For example, the V reference circuit generates a DC component to have a desired DC level, a first oscillating component at a first frequency 1, and a second oscillating component at frequency 2. Alternatively, the frequency of the oscillating component sweeps a frequency range to find a frequency, or frequencies, that optimizes the impedance of the sensor.

The regulated impedance source circuit 304 provides the regulated impedance signal 308 to the sensor 30-2. When the sensor 30-2 is exposed to a condition 114-2, its current affects 288 the regulated impedance signal 308 based on I=V/Z. As such, the sensor voltage 306 corresponds to the impedance of the sensor as regulated by the regulation Z source circuit and the current provided by the regulated impedance source circuit 304 to the sensor 30-2. As the current of the sensor 30-2 changes due to changing conditions 114-2, the impedance is adjusted by the regulated impedance source circuit 304 changes so that the sensor voltage 306 remains substantially equal to the voltage reference 312, including the DC resistance and desired impedances at f1 and f2.

The impedance (Z) loop correction circuit 302 is operable to generate a comparison signal 316 based on a comparison of the sensor voltage 306 with the voltage reference 312. The effect of the current of the sensor on the regulated voltage signal 308 is detected by the Z loop correction circuit 302 and is captured by the comparison signal 316. The Z loop correction circuit 302 is further operable to convert the comparison signal 316 into the digital signal 202, which is a digital representation of the affect the current of the sensor has on the regulated impedance signal and corresponds to the sensed condition 114-2. The Z loop correction circuit is further operable to convert the digital signal 202 into the analog regulation signal 314, thereby creating a feedback loop to keep the sensor voltage 306 substantially equal to the voltage reference 312.

Figure 32:
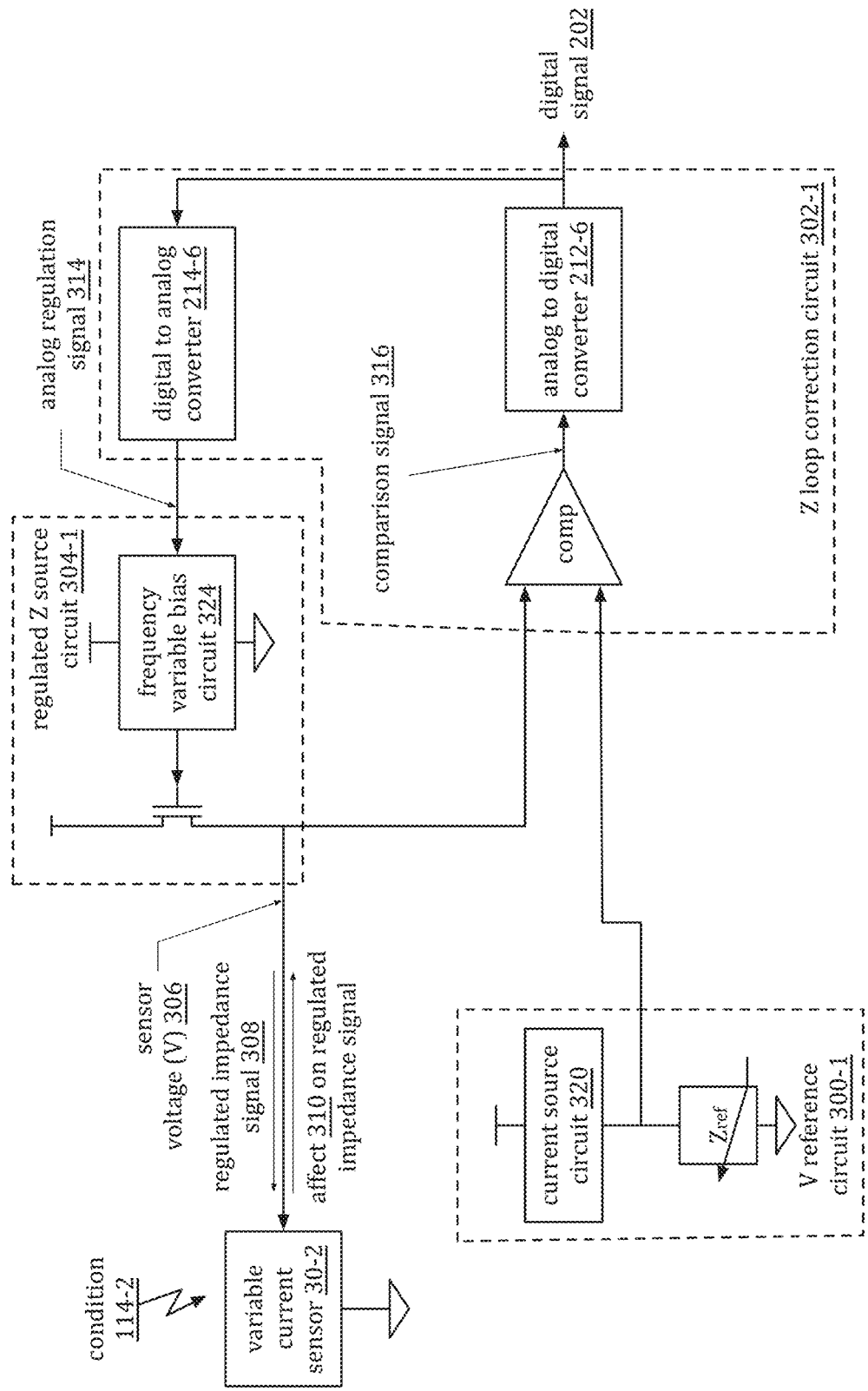
FIG. 32 is a schematic block diagram of another embodiment of a drive sense circuit in accordance with the present invention.

FIG. 32 is a schematic block diagram of another embodiment of a drive sense circuit 28-g1 coupled to a variable current sensor 30-2. The drive sense circuit 28-g1 includes a voltage (V) reference circuit 300-1, an impedance (Z) loop correction circuit 302-1, and a regulated impedance (Z) source circuit 304. The voltage reference circuit 300-1 includes a current source circuit 320 and a variable impedance. The Z loop correction circuit 302-1 includes a comparator or op amp, an analog to digital converter 212-6 and a digital to analog converter 214-6. The analog to digital converter 212-6 and the digital to analog converter 214-6 are one or more of the types discussed with reference to FIG. 23.

When the drive sense circuit 28-g1 is enabled, the regulated impedance source circuit 304-1 is operable to generate the regulated impedance signal 308 based on an analog regulation signal 314. The frequency variable bias circuit 324 provides a frequency vary gate source voltage to the P-channel FET to generate the regulated impedance signal 308, which includes a varying frequency voltage component. In this manner, the sensor voltage 306 substantially matches the voltage reference 312 produced by the V reference circuit 300-1.

The V reference circuit 300 (which includes a current source and a variable impedance.) generates the voltage reference 312 to include a DC component and/or at least one oscillating (AC) component. For example, the current source circuit 320 and/or the variable impedance generate a DC component to have a desired DC level, a first oscillating component at a first frequency 1, and a second oscillating component at frequency 2. Alternatively, the current source circuit 320 and/or the variable impedance performs a frequency sweep within a frequency range to find a frequency, frequencies, that optimizes the impedance of the sensor.

The regulated impedance source circuit 304 provides the regulated impedance signal 308 to the sensor 30-2. When the sensor 30-2 is exposed to a condition 114-2, its current affects 288 the regulated impedance signal 308 based on I=V/Z. As such, the sensor voltage 306 corresponds to the impedance of the sensor as regulated by the regulation Z source circuit and the current provided by the regulated impedance source circuit 304 to the sensor 30-2. As the current of the sensor 30-2 changes due to changing conditions 114-2, the impedance is adjusted by the regulated impedance source circuit 304 changes so that the sensor voltage 306 remains substantially equal to the voltage reference 312, including the DC resistance and/or desired impedances at f1 and f2.

The comparator is operable to generate a comparison signal 316 based on a comparison of the sensor voltage 306 with the voltage reference 312. The effect of the current of the sensor on the regulated voltage signal 308 is detected by the Z loop correction circuit 302 and is captured by the comparison signal 316. The analog to digital converter 212-6 converts the comparison signal 316 into the digital signal 202, which is a digital representation of the affect the current of the sensor has on the regulated impedance signal and corresponds to the sensed condition 114-2. The digital to analog converter 214-6 convert the digital signal 202 into the analog regulation signal 314, thereby creating a feedback loop to keep the sensor voltage 306 substantially equal to the voltage reference 312.

Figure 33:
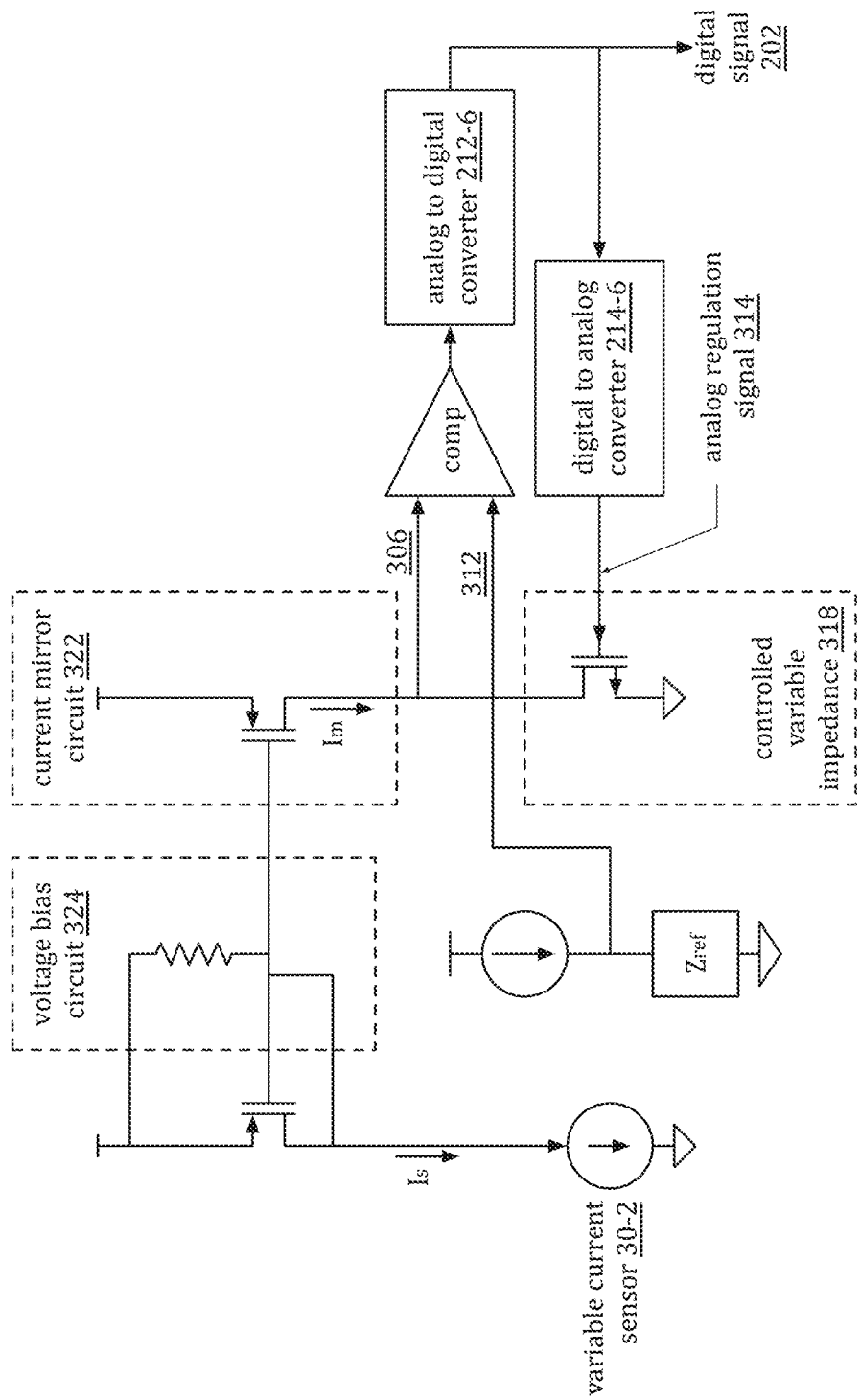
FIG. 33 is a schematic block diagram of another embodiment of a drive sense circuit in accordance with the present invention.

FIG. 33 is a schematic block diagram of another embodiment of a drive sense circuit 28-g2 coupled to a variable current sensor 30-2. The drive sense circuit 28-g1 includes a voltage (V) reference circuit (which includes a current source and an impedance (Zref)), an impedance (Z) loop correction circuit (which includes the comparator, the analog to digital converter 212-6, the digital to analog converter 214-6, a current mirror circuit 322, and a controlled variable impedance 318), and a regulated impedance (Z) source circuit (which includes a voltage bias circuit 324 and a P-channel FET).

When the drive sense circuit 28-g1 is enabled, the comparator compares the voltage reference signal 312 with the sensor voltage 306 to produce the comparison signal. The analog to digital converter converts the comparison signal into the digital signal 202. The digital to analog converter converts the digital signal 202 into the analog regulation signal 314.

The analog regulation signal 314 varies the impedance of the controlled variable impedance 318. The varying impedance of circuit 318 is multiplied by the mirrored current (Im) of the sensor current (Is) to produce the sensor voltage 306. The mirrored current is produced by the current mirror circuit 322 that mirrors the current provided by the P-channel FET to the variable current sensor 30-2. The P-channel FET is enabled via the voltage bias circuit 324, which includes one or more resistors and/or one or more capacitors. The varying of the impedance of the controlled variable impedance 318 regulates the sensor voltage 306 to substantially match the reference voltage 312.

Figure 34:
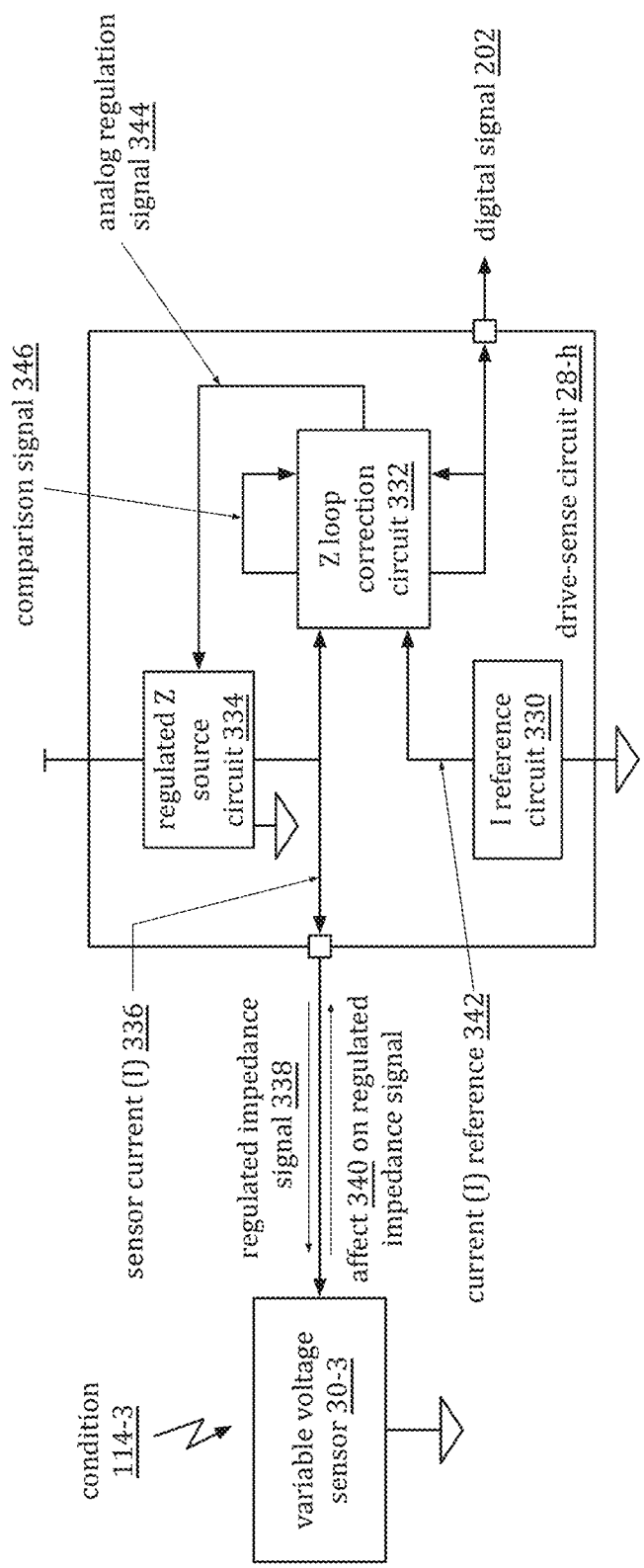
FIG. 34 is a schematic block diagram of another embodiment of a drive sense circuit in accordance with the present invention.

FIG. 34 is a schematic block diagram of another embodiment of a drive sense circuit 28-h coupled to a variable voltage sensor 30-3. The drive sense circuit 28-h includes a current (I) reference circuit 330, an impedance (Z) loop correction circuit 332, and a regulated impedance (Z) source circuit 334. In general, the drive sense circuit 28-h regulates the impedance of the sensor and keeps the sensor's current constant to sense a voltage (V) of the sensor 30-3 in relation to a sensor current 336 and a current (I) reference 342. Varying voltage of the sensor 30-3 is indicative of changes to the condition 114-3 being sensed (e.g., voltage levels, capacitance, inductance, thermal conditions, etc.).

When the drive sense circuit 28-h is enabled, the regulated impedance source circuit 334 is operable to generate a regulated impedance signal 338 based on an analog regulation signal 344. The regulated impedance source circuit 334 generates the regulated impedance signal 338 by varying frequency of a current produced by the regulated Z source circuit 334 such that the sensor current 306 substantially matches the voltage reference 342 produced by the I reference circuit 330.

The I reference circuit 330 (which may be implement in accordance with a previously discussed current reference circuit) generates the current reference 342 to include a DC component and/or at least one oscillating (AC) component. For example, the I reference circuit generates a DC component to have a desired DC level, a first oscillating component at a first frequency 1, and a second oscillating component at frequency 2. Alternatively, the frequency of the oscillating component sweeps a frequency range to find a frequency, or frequencies, that optimizes the impedance of the sensor.

The regulated impedance source circuit 334 provides the regulated impedance signal 338 to the sensor 30-3. When the sensor 30-3 is exposed to a condition 114-3, its voltage affects 288 the regulated impedance signal 338 based on V=I*Z. As such, the sensor current 336 corresponds to the impedance of the sensor as regulated by the regulation Z source circuit and the voltage provided by the regulated impedance source circuit 334 to the sensor 30-3. As the voltage of the sensor 30-3 changes due to changing conditions 114-3, the impedance is adjusted by the regulated impedance source circuit 334 so that the sensor current 336 remains substantially equal to the current reference 342, including the DC resistance and/or desired impedances at f1 and f2.

The impedance (Z) loop correction circuit 332 is operable to generate a comparison signal 346 based on a comparison of the sensor current 336 with the current reference 342. The effect of the voltage of the sensor on the regulated impedance signal 338 is detected by the Z loop correction circuit 332 and is captured by the comparison signal 336. The Z loop correction circuit 332 is further operable to convert the comparison signal 336 into the digital signal 202, which is a digital representation of the affect the voltage of the sensor has on the regulated impedance signal and corresponds to the sensed condition 114-3. The Z loop correction circuit is further operable to convert the digital signal 202 into the analog regulation signal 344, thereby creating a feedback loop to keep the sensor current 336 substantially equal to the current reference 342.

Figure 35:
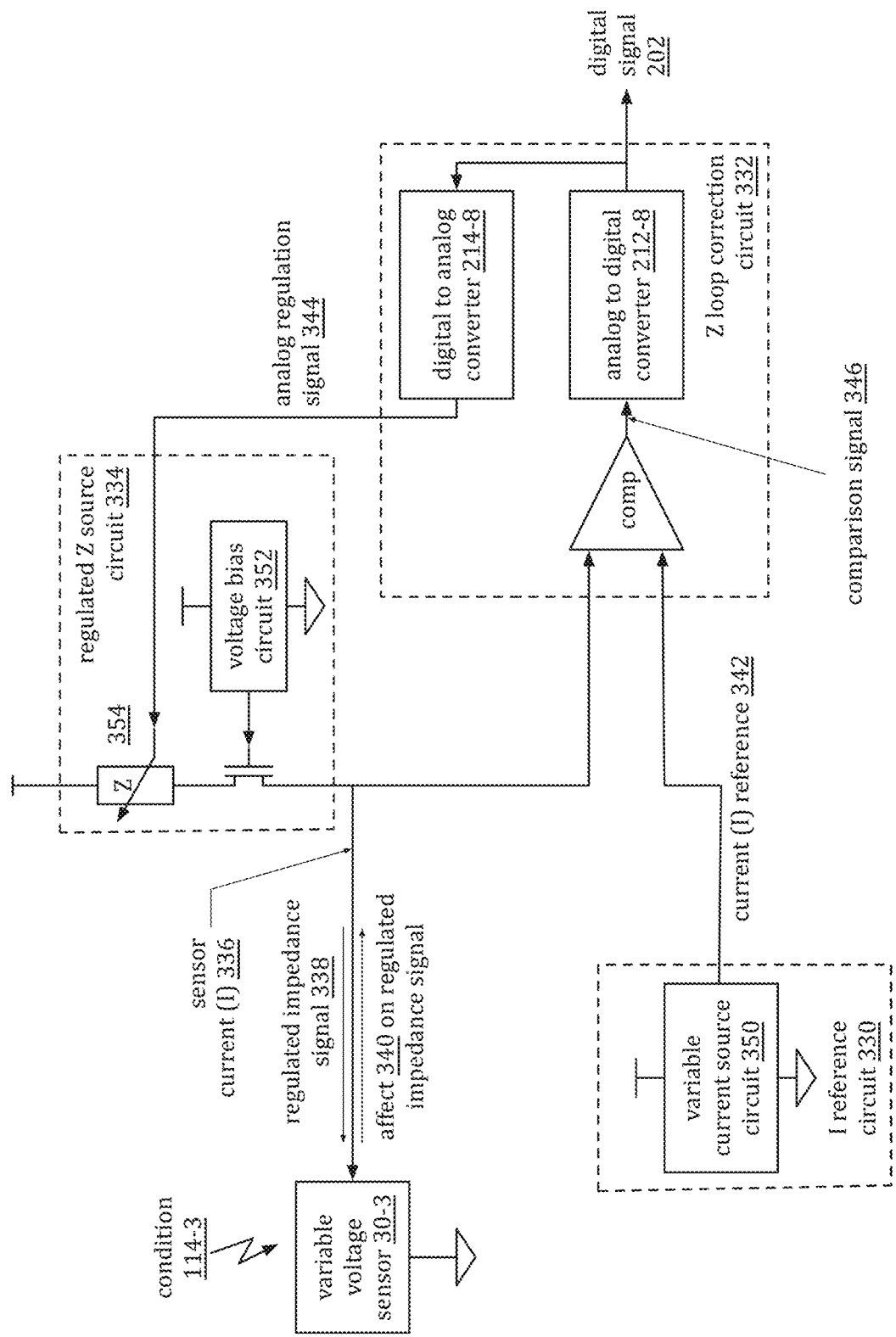
FIG. 35 is a schematic block diagram of another embodiment of a drive sense circuit in accordance with the present invention.

FIG. 35 is a schematic block diagram of another embodiment of a drive sense circuit 28-h1 coupled to a variable voltage sensor 30-3. The drive sense circuit 28-h1 includes a current (I) reference circuit 330, an impedance (Z) loop correction circuit 332, and a regulated impedance (Z) source circuit 334. The I reference circuit 330 includes a variable current source circuit 350. The Z loop correction circuit 332 includes a comparator, an analog to digital converter 212-8 and a digital to analog converter 214-8. The regulated Z source circuit 334 includes a variable impedance 354, a P-channel FET, and a voltage bias circuit 352. The analog to digital converter 212-8 and the digital to analog converter 214-8 are one or more of the types discussed with reference to FIG. 23.

The voltage bias circuit 352 generates a gate-source voltage for the P-channel FET and the impedance of the variable impedance is adjusted based on the analog regulation signal 344. In this embodiment, the combination of the variable impedance and P-channel transistor generate a regulated impedance signal 338 at a desired current level for the variable voltage sensor 30-3. The regulated impedance signal 338 is regulated to obtain a desired impedance of the sensor 30-3 such that, at the desired current level (e.g., a few micro amps to an amp or more), variation of the voltage of the sensor is within the linear range of the sensor.

The I reference circuit 330 (which may be implement in accordance with a previously discussed current reference circuit) generates the current reference 342 to include a DC component and/or at least one oscillating (AC) component. For example, the variable current source circuit 350 generates a DC component to have a desired DC level, a first oscillating component at a first frequency 1, and a second oscillating component at frequency 2.

The comparator (e.g., a transimpedance amplifier) compares the sensor current 336 with the current reference 342 to produce the comparison signal 346. The effect of the voltage of the sensor on the regulated impedance signal 338 is captured by the comparison signal 336. The analog to digital converter 212-8 converts the comparison signal 346 into the digital signal 202, which is a digital representation of the affect the voltage of the sensor has on the regulated impedance signal and corresponds to the sensed condition 114-3. The digital to analog converter converts the digital signal 202 into the analog regulation signal 344, thereby creating a feedback loop to keep the sensor current 336 substantially equal to the current reference 342.

Figure 36:
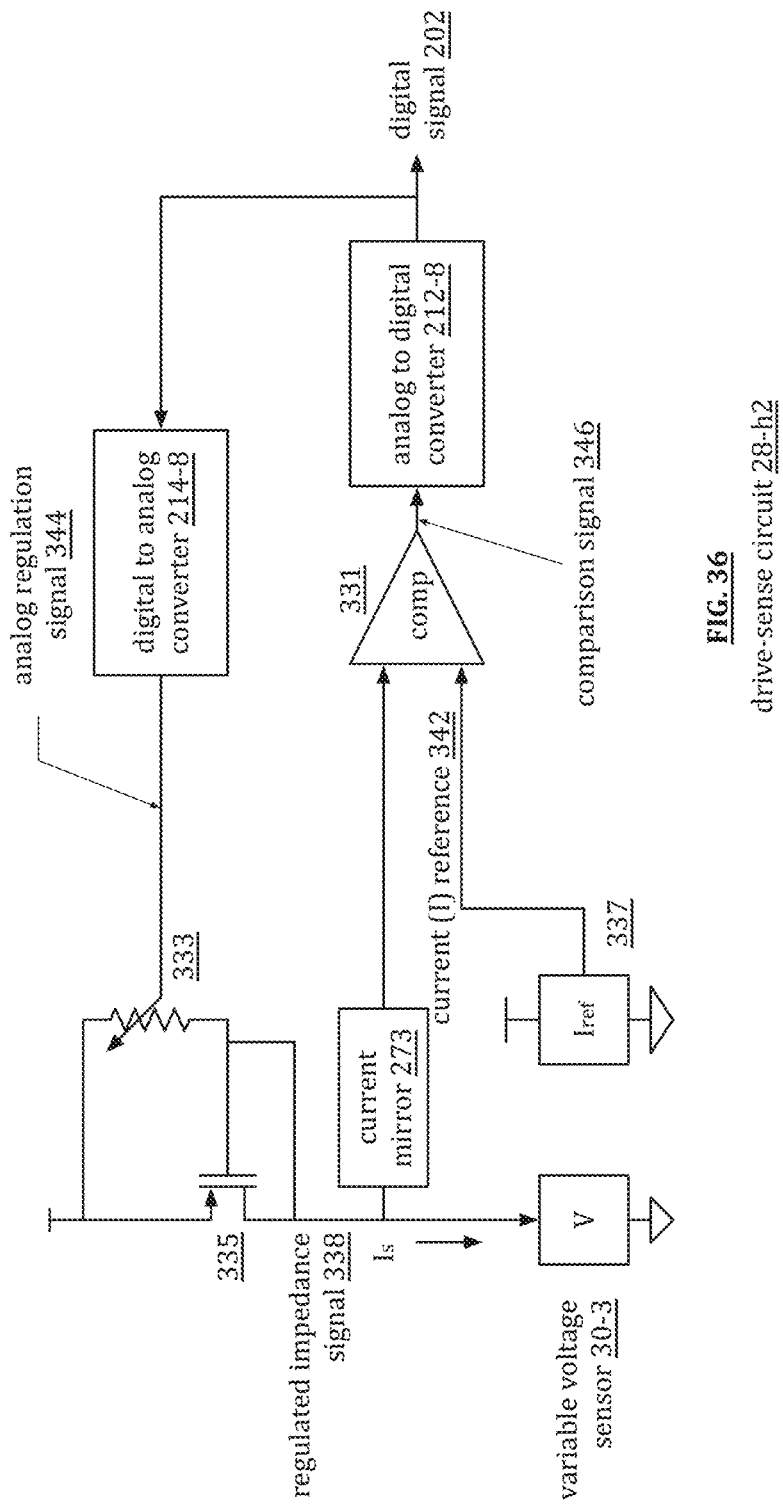
FIG. 36 is a schematic block diagram of another embodiment of a drive sense circuit in accordance with the present invention.

FIG. 36 is a schematic block diagram of another embodiment of a drive sense circuit 28-$h2$ is coupled to a variable voltage sensor 30-3. The drive sense circuit 28-$h2$ includes a P-channel transistor 335, a variable impedance 333 (e.g., resistor(s), capacitor(s), and/or transistor(s)), a comparator 331, the analog to digital converter 212-8, and the digital to analog converter 214-8.

In operation, the variable voltage sensor 30-3 is exposed to a condition that changes its voltage when its receiving the variable impedance signal at a current level (Is). The comparator 331 compares a mirrored current of the sensor 30-1 with the current reference 342 to produce the comparison signal 336. The analog to digital converter 212-8 converts the comparison signal 336 into the digital signal 202. The digital to analog converter 214-8 convers the digital signal 202 into the analog regulation signal 344. The variable impedance 333 is adjusted based on the analog regulation signal 334. Adjusting the variable impedance 333 adjusts the gate-source voltage of the P-channel transistor to produce the regulated impedance signal 338.

Figure 37:
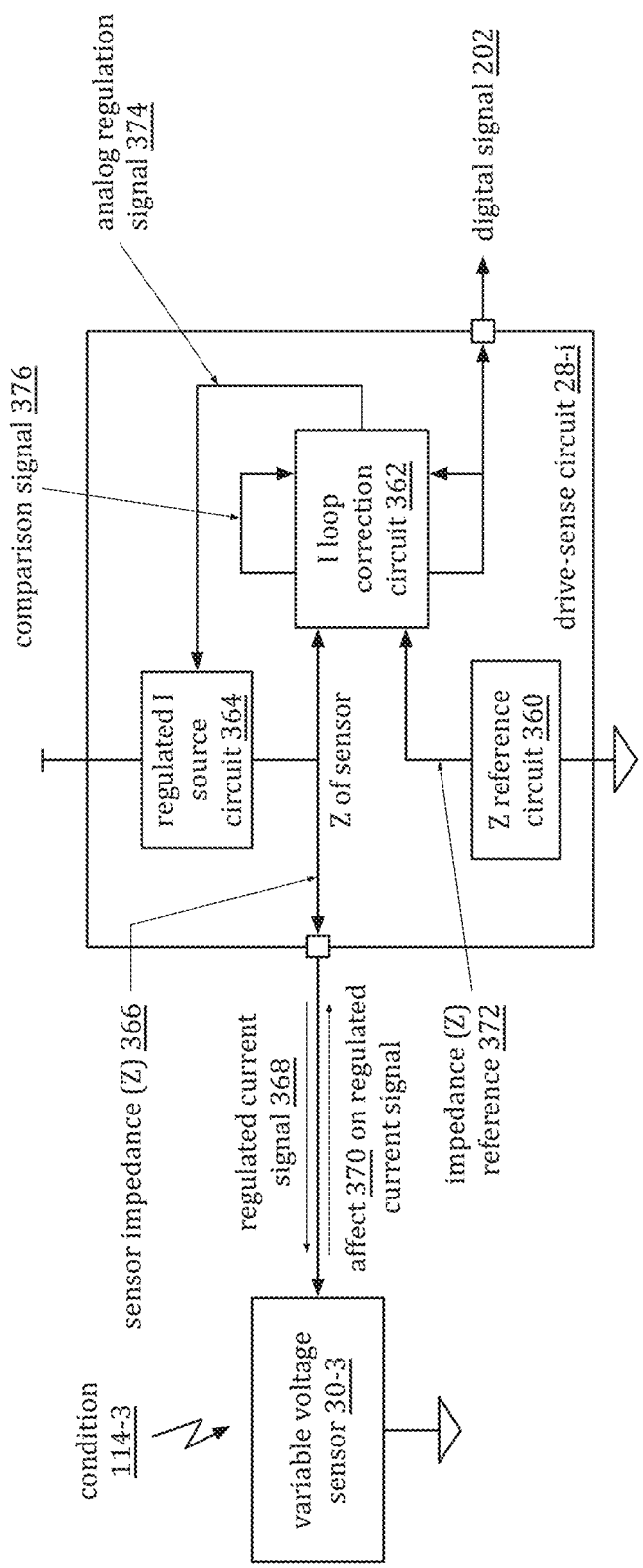
FIG. 37 is a schematic block diagram of another embodiment of a drive sense circuit in accordance with the present invention.

FIG. 37 is a schematic block diagram of another embodiment of a drive sense circuit 28-$i$ coupled to a variable voltage sensor 30-3. The drive sense circuit 28-$i$ includes an impedance (Z) reference circuit 360, a current (I) loop correction circuit 262, and a regulated current (I) source circuit 264. In general, the drive sense circuit 28-$i$ regulates the current applied to the sensor and keeps the impedance of sensor constant to sense a voltage of the sensor 30-3 in relation to a sensor impedance 366 and an impedance reference 372.

When the drive sense circuit 28-$i$ is enabled, the regulated current source circuit 364 is operable to generate a regulated current signal 368 based on an analog regulation signal 374. The regulated current source circuit 364 generates the regulated current signal 368 such that the sensor impedance (Z) 366 substantially matches the impedance reference 372 produced by the Z reference circuit 260.

The Z reference circuit 360 (which may be a capacitor, an inductor, a circuit equivalent of a capacitor, a circuit equivalent of an inductor, a tunable capacitor bank, etc.) generates the impedance reference 372 to include a DC component and/or at least one oscillating component. For example, the impedance reference 372 includes a DC component and/or at least one oscillating (AC) component. For example, the Z reference circuit 360 generates a DC component to have a desired resistance at DC, a first desired impedance at frequency 1, and a second desired impedance at frequency 2.

The regulated current source circuit 364 provides the regulated current signal 368 to the sensor 30-3. When the sensor 30-3 is exposed to a condition 114-3, its voltage affects 370 the regulated current signal 388 based on I=V/Z. As such, the sensor impedance 366 is created as a result of the current (I) provided by the regulated current source circuit 364 and the voltage of the sensor 30-3. As the voltage of the sensor 30-3 changes due to changing conditions 114-3, the current provided by the regulated current source circuit 234 changes so that the sensor impedance 366 remains substantially equal to the impedance reference 372, including the DC component and/or the oscillating component(s).

The current (I) loop correction circuit 362 is operable to generate a comparison signal 376 based on a comparison of the sensor impedance 366 with the impedance reference 372. The effect of the voltage of the sensor on the regulated current signal 368 is detected by the I loop correction circuit 362 and captured by the comparison signal 376. The I loop correction circuit 362 is further operable to convert the comparison signal 376 into a digital signal 202, which is a digital representation of the affect the voltage of the sensor has on the regulated current signal and corresponds to the sensed condition 114-3. The I loop correction circuit is further operable to convert the digital signal 202 into the analog regulation signal 374, thereby creating a feedback loop to keep the sensor impedance 366 substantially equal to the impedance reference 372.

FIG. 38 is a schematic block diagram of another embodiment of a drive sense circuit 28-$i1$ coupled to a variable voltage sensor 30-3. The drive sense circuit 28-$i1$ includes an impedance (Z) reference circuit 360-1, a current (I) loop correction circuit 262-1, and a regulated current (I) source circuit 364-1, implemented as a dependent current source. The Z reference circuit 360-1 includes a current source circuit and an impedance circuit (e.g., resistor(s), capacitor(s), inductor(s), transistor(s), etc.) to produce the impedance reference, which may be expressed as a voltage (V of impedance reference=current of current source times impedance of the impedance circuit).

The dependent current source 364-1 generate a regulated current signal 368 based on the analog regulation signal 374. The voltage of the sensor 30 and current of the regulated current signal 368 provides the sensor impedance 366.

The comparator compares the sensor impedance 366 with the impedance reference, which may be done in voltage, to produce the comparison signal 376. The analog to digital converter 212-8 converts the comparison signal 376 into a digital signal 202, which is a digital representation of the affect the voltage of the sensor has on the regulated current signal and corresponds to the sensed condition 114-3. The digital to analog converter 214-8 converts the digital signal 202 into the analog regulation signal 374, thereby creating a feedback loop to keep the sensor impedance 366 substantially equal to the impedance reference 372.

As used in the preceding figures, a drive sense circuit has the general reference number of 28. When, in a particular figure, the drive sense circuit's reference number has a suffix (e.g., -a, -b, -c, etc.), the reference number with a suffix is referring to a specific embodiment of a drive sense circuit. A specific embodiment of a drive sense circuit includes some or all of the features and/or functions of drive sense circuits having no suffix to its reference number. Further, when a drive sense circuit has a suffix with a letter and a number, this is represented of different sub-embodiments of an embodiment of the drive sense circuit. The same applies for other components in the figures that have a reference number with a suffix.

FIG. 39A is a schematic block diagram of another embodiment 3901 of a drive sense circuit in accordance with the present invention. Certain of the previous embodiments operate by driving a sinusoidal voltage, such as via a single line from a drive-sense circuit (DSC), and measuring the current using a transconductance amplifier. For example, the reference signal is provided as a sinusoidal voltage signal, and the transconductance amplifier is configured to produce an output current. For example, the feedback current drives the load and produces a sinusoidal voltage that exactly follows the sinusoidal voltage of the reference signal.

In an example of operation and implementation, consider a load (e.g., shown as Z_load, which may be any of a variety of types of loads including a capacitive load having an associated capacitive reactance, Z_C, such as from an LCD capacitive load, a resistive load, R, and inductive load having an associated inductive reactance, Z_L. and/or generally speaking, any combination of such different types of loads, Z, etc.) that is serviced by a DSC via a single line that facilitates driving and simultaneously sensing any change of a signal provided to the load. A sinusoidal voltage reference signal, Vref, is provided to one of the inputs of an operational amplifier or comparator, and the other input of the operational amplifier or comparator receives a load voltage signal, V_load, that is based on a current that is provided to the load and also the impedance of the load. For example, V_load=I×Z_load. The output current signal from the analog transconductance amplifier is adapted so that the load voltage that is received at the other input of the operational amplifier or comparator, V_load, follows, tracks, matches, etc. the sinusoidal voltage reference signal, Vref.

In an example of operation and implementation, this configuration is implemented using an analog transconductance amplifier that is operated by driving the positive input of the analog transconductance amplifier using a sinusoidal voltage reference signal, Vref. The analog transconductance amplifier produces a feedback current, I, which is scaled (e.g., consider a scaling ratio of N:1, where N is a positive integer greater) and fed into an analog to digital converter (ADC) 3910.

In some implementations, the ADC 3910 is implemented as a current-mode ADC. Note that the ADC 3910 may be implemented as a sigma delta ADC or some other type of ADC in other alternative implementations. Also, within one example of this configuration, note that the analog transconductance amplifier output is a current signal, not a voltage signal. As such, the ADC 3910 is implemented as a current-mode ADC that is configured to generate a digital signal based on digital sampling of a current signal thereby generating a data out (digital) signal. In certain examples, one or more processing modules 42 is configured to process the data out (digital) signal. Such processing by the one or more processing modules 42 includes determining the impedance of the load, Z_load, based on information regarding the known sinusoidal voltage reference signal, Vref, and the feedback current, I, that is generated that ensured the load voltage, V_load, follows, tracks, matches, etc. the sinusoidal voltage reference signal, Vref.

Referring to one implementation of this diagram, this configuration operates by driving a sinusoidal voltage reference signal, Vref, to the analog transconductance amplifier and forcing the load voltage, V_load, to follow the sinusoidal voltage reference signal, Vref, by adapting the feedback current, I. note that the output signal of the analog transconductance amplifier is a current signal. Note that it is also a sinusoidal current signal. This signal is then scaled (e.g., N:1, where N is a positive integer greater) and said to the ADC 3910, which may be implemented as a sigma delta ADC.

FIG. 39B is a schematic block diagram of another embodiment 3902 of a drive sense circuit in accordance with the present invention. The implementation shown in this diagram shows an alternative embodiment 3902 of a drive-sense circuit (DSC) that operates using a transconductance analog to digital converter (ADC). For example, one of the inputs of a comparator is driven with a sinusoidal voltage reference signal, Vref, that is a sinusoidal signal, and one or more processing modules 42 and a feedback digital to analog converter (DAC) 3912 are configured to generate an feedback current signal, I, that drives the load voltage, V_load, to follow, track, match, etc. the sinusoidal voltage reference signal, Vref. In this implementation, the one or processing models 42 is configured to perform the analog to digital conversion of the output signal from the comparator that is clocked using a digital signal. For example, consider that this comparator is implemented as a latched comparator that is driven using a clock signal, CLK, thereby generating a digital signal (latched comparator output signal). For example, a latched comparator, that is clocked at a clock frequency, CLK, is configured to output a digital signal based on that clock frequency, CLK. In this implementation, the feedback DAC 3912, the latched comparator, and the one or more processing modules 42 may be viewed as the components of a drive-sense ADC. This may be viewed as a replacement of a sigma delta ADC from certain perspectives. Also, note that the drive-sense ADC of this implementation also operates as a current-mode ADC that is configured to generate a digital signal based on digital sampling of a current signal thereby generating a data out (digital) signal.

In certain examples, one or more processing modules 42 is configured to process the data out (digital) signal. Such processing by the one or more processing modules 42 includes determining the impedance of the load, Z_load, based on information regarding the known sinusoidal voltage reference signal, Vref, and the feedback current, I, that is generated that ensured the load voltage, V_load, follows, tracks, matches, etc. the sinusoidal voltage reference signal, Vref.

Referring to one implementation of this diagram, a comparator is implemented instead of an analog transconductance amplifier. Similarly to the previous diagram, a sinusoidal voltage reference signal, Vref, is provided, yet this is provided to the positive input of the comparator in this diagram. Also, a feedback current, I, is produced to force the load voltage, V_load, to be same as the sinusoidal voltage reference signal, Vref. Note also that the configurations of this diagram in the previous diagram both include a feedback path that is used to adapt the feedback current, I.

Certain of the following diagrams operate using a transimpedance concept. For example, several of these implementations in the following diagrams operate by driving a sinusoidal current reference signal, Iref, onto a load, Z_load, and measuring the load voltage, V_load, using a voltage-mode analog to digital converter (ADC). For example, consider that the load voltage, V_load, is equal to the impedance of the load, Z_load, multiplied with the sinusoidal current reference signal, Iref. the load voltage is therefore also a sinusoidal signal as well within an implementation in which the impedance of the load, Z_load, is a linear passive load. For example, consider that the load is purely capacitive, such as with respect to an LCD capacitive load or some other type of capacitive load. In such instances, the load voltage, V_load, is therefore a sinusoidal signal as well based on the sinusoidal current reference signal, Iref.

In certain of these diagrams, a voltage-mode ADC is implemented to measure the load voltage, V_load, directly. For example, this may be implemented without providing adaptation via a feedback path, and this is also implemented using a sinusoidal current reference signal, Iref, instead of a sinusoidal voltage reference signal, Vref. In other implementations, a voltage amplifier can be used to amplify the sinusoidal voltage signal that is generated based on the sinusoidal current reference signal, Iref, that is provided to the load before digitally sampling it with a voltage-mode ADC. And even other implementations, note that a transimpedance amplifier is implemented to amplify the sinusoidal voltage signal that is generated based on the sinusoidal current reference signal, Iref, that is provided to the load to generate a sinusoidal current signal that subsequently undergoes digital sampling using a current-mode ADC instead of a voltage-mode ADC.

Figures 40A, 40B:
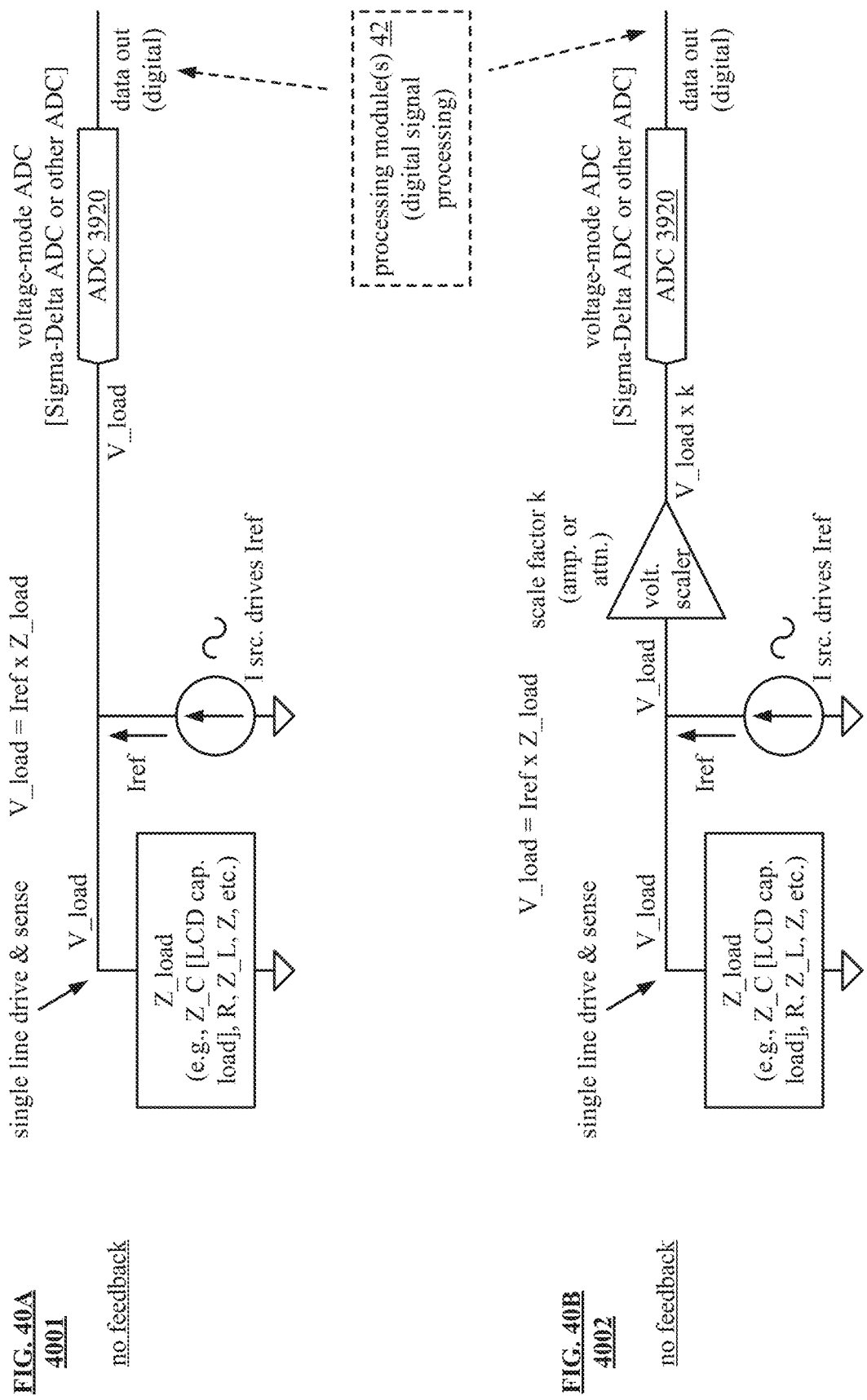
FIG. 40A is a schematic block diagram of another embodiment of a drive sense circuit in accordance with the present invention.
FIG. 40B is a schematic block diagram of another embodiment of a drive sense circuit in accordance with the present invention.

FIG. 40A is a schematic block diagram of another embodiment 4001 of a drive sense circuit in accordance with the present invention. In this diagram, an ADC 3920 is implemented to receive a load voltage, V_load. This load voltage, V_load, is generated based on a current source that is implemented to drive a sinusoidal current reference signal, Iref, to the load. Again, the load may be any of a variety of types of loads in this diagram as well as others herein. The load voltage, V_load, that is generated is a function of the impedance of the load, Z_load, times the sinusoidal current reference signal, Iref, that is provided from the current source. Note that this implementations includes a sinusoidal current reference signal, Iref, that is provided within this particular implementation of a drive-sense circuit (DSC).

Note that the ADC 3920 may be implemented in a variety of different ways. The ADC 3920 is implemented as a voltage-mode ADC sets that it digitally samples a voltage signal that is received at the input of the ADC 3922 to generate a data out (digital) signal. An alternative implementations, note that the ADC 3920 may be implemented as a sigma delta ADC or some other type of ADC such as a general-purpose ADC. The ADC 3920 is configured to sample the load voltage, V_load. Note that this implementation operates with no feedback loop. The load voltage, V_load, is generated based on the impedance of the load, Z_load, and the sinusoidal current reference signal, Iref, that is provided from the current source.

In certain examples, one or more processing modules 42 is configured to process the data out (digital) signal. Such processing by the one or more processing modules 42 includes determining the impedance of the load, Z_load, based on information regarding the known sinusoidal current reference signal, Iref, and the detected and digitally sampled load voltage, V_load, and/or a scaled version thereof, which corresponds to the data out (digital) signal.

In an example of operation and implementation, a current reference operative drive-sense circuit (DSC) includes a current source operably coupled to a load and a voltage-mode analog to digital converter (ADC). When enabled, the current source is configured to drive a sinusoidal current reference signal to the load thereby generating a load voltage that is based on the sinusoidal current reference signal and an impedance of the load. When enabled, the voltage-mode ADC is configured to perform digital sampling of the load voltage and to generate a digital signal that is representative of the load voltage.

In certain examples, the voltage-mode ADC is a sigma delta ADC. Note that the load voltage is a product of the sinusoidal current reference signal multiplied by the impedance of the load.

In some examples, the current reference operative DSC also includes memory that stores operational instructions and one or more processing modules 42 operably coupled to the voltage-mode ADC and to the memory. When enabled, the one or more processing modules 42 is configured to execute the operational instructions to process the digital signal that is representative of the load voltage to determine the load voltage and to determine the impedance of the load based on the load voltage and the sinusoidal current reference signal.

Note that the load may be of a variety of types of loads including a liquid crystal display (LCD) capacitive load, a sensor, an actuator, or a touch screen capacitive load.

When the load is a touch screen capacitive load, note that user interaction with the touch screen capacitive load causes a change of the impedance of the touch screen capacitive load. Generally speaking, regardless of the type of load, a change of the impedance of the load causes a change of the load voltage.

In yet other examples, the current reference operative DSC includes memory that stores operational instructions and one or more processing modules 42 operably coupled to the voltage-mode ADC and to the memory. When enabled, the one or more processing modules 42 is configured to execute the operational instructions to process the digital signal that is representative of the load voltage to determine a first value of load voltage before the change of the impedance of the load. Then, after the change of the impedance of the load, the one or more processing modules 42 is configured to execute the operational instructions to process the digital signal that is representative of the load voltage to determine a second value of load voltage that is based on the change of the impedance of the load. The one or more processing modules 42 is also configured to execute the operational instructions to determine the change of the impedance of the load based on the first value of load voltage, the second value of load voltage, and the sinusoidal current reference signal.

For example, the first value of the load voltage, V_load, is generated based on the impedance of the load before the change of impedance of the, Z_load, and the sinusoidal current reference signal, Iref, that is provided from the current source. The second value of the load voltage, V_load, is generated based on the impedance of the load after the change of impedance of the, Z_load, and the sinusoidal current reference signal, Iref, that is provided from the current source. The difference between the first value of the load voltage, V_load, and the second value of the load voltage, V_load, is based on the change of the impedance of the load. The change of the impedance of the load may be determined based on first value of load voltage, the second value of load voltage, and the sinusoidal current reference signal.

In another example of operation and implementation, a current reference operative drive-sense circuit (DSC) includes a current source operably coupled to a load, a voltage-mode sigma delta analog to digital converter (ADC), memory that stores operational instructions, and one or more processing modules 42.

When enabled, the current source is configured to drive a sinusoidal current reference signal to the load thereby generating a load voltage that is based on the sinusoidal current reference signal and an impedance of the load. The voltage-mode sigma delta ADC is operably coupled the load and to the current source. When enabled, the voltage-mode sigma delta ADC is configured to perform digital sampling of the load voltage and to generate a digital signal that is representative of the load voltage.

Wherein, when enabled, the one or more processing modules 42 is configured to execute the operational instructions to process the digital signal that is representative of the load voltage to determine the load voltage and to determine the impedance of the load based on the load voltage and the sinusoidal current reference signal.

Note that the load voltage is a product of the sinusoidal current reference signal multiplied by the impedance of the load. Note that the load may be of a variety of types of loads including a liquid crystal display (LCD) capacitive load, a sensor, an actuator, or a touch screen capacitive load.

When the load is a touch screen capacitive load, note that user interaction with the touch screen capacitive load causes a change of the impedance of the touch screen capacitive load. Generally speaking, regardless of the type of load, a change of the impedance of the load causes a change of the load voltage.

In yet other examples, the current reference operative DSC includes memory that stores operational instructions and one or more processing modules 42 operably coupled to the voltage-mode sigma delta ADC and to the memory. When enabled, the one or more processing modules 42 is configured to execute the operational instructions to process the digital signal that is representative of the load voltage to determine a first value of load voltage before the change of the impedance of the load. Then, after the change of the impedance of the load, the one or more processing modules 42 is configured to execute the operational instructions to process the digital signal that is representative of the load voltage to determine a second value of load voltage that is based on the change of the impedance of the load. The one or more processing modules 42 is also configured to execute the operational instructions to determine the change of the impedance of the load based on the first value of load voltage, the second value of load voltage, and the sinusoidal current reference signal.

In another example of operation and implementation, a current reference operative drive-sense circuit (DSC) includes a current source operably coupled to a touch screen capacitive load, a voltage-mode analog to digital converter (ADC), memory that stores operational instructions, and one or more processing modules 42.

When enabled, the current source is configured to drive a sinusoidal current reference signal to the touch screen capacitive load thereby generating a load voltage that is based on the sinusoidal current reference signal and an impedance of the touch screen capacitive load. The voltage-mode analog to digital converter (ADC) is operably coupled the touch screen capacitive load and to the current source. When enabled, the voltage-mode ADC is configured to perform digital sampling of the load voltage and to generate a digital signal that is representative of the load voltage.

The one or more processing modules 42 is operably coupled to the voltage-mode ADC and to the memory. When enabled, the one or more processing modules 42 configured to execute the operational instructions to process the digital signal that is representative of the load voltage to determine the load voltage and to determine the impedance of the touch screen capacitive load based on the load voltage and the sinusoidal current reference signal.

Note that the load voltage is a product of the sinusoidal current reference signal multiplied by the impedance of the load. Note that the load may be of a variety of types of loads including a liquid crystal display (LCD) capacitive load, a sensor, an actuator, or a touch screen capacitive load.

When the load is a touch screen capacitive load, note that user interaction with the touch screen capacitive load causes a change of the impedance of the touch screen capacitive load. Generally speaking, regardless of the type of load, a change of the impedance of the load causes a change of the load voltage.

When enabled, the one or more processing modules 42 is further configured to execute the operational instructions to process the digital signal that is representative of the load voltage to determine a first value of load voltage before the change of the impedance of the touch screen capacitive load. Then, after the change of the impedance of the touch screen capacitive load, the one or more processing modules 42 is further configured to execute the operational instructions to process the digital signal that is representative of the load voltage to determine a second value of load voltage that is based on the change of the impedance of the touch screen capacitive load. Also, the one or more processing modules 42 is further configured to execute the operational instructions to determine the change of the impedance of the touch screen capacitive load based on the first value of load voltage, the second value of load voltage, and the sinusoidal current reference signal.

FIG. 40B is a schematic block diagram of another embodiment 4002 of a drive sense circuit in accordance with the present invention. This diagram has similarities to certain previous diagrams in that a current source provides a sinusoidal current reference signal, Iref, to the load and is thereby configured to generate a load voltage, V_load, is that generated based on the impedance of the load, Z_load, and the sinusoidal current reference signal, Iref, that is provided from the current source.

However, this diagram also includes a voltage scaler that is implemented to amplify or attenuate the load voltage, V_load, that is generated is generated based on a current source that is implemented to drive a sinusoidal current reference signal, Iref, to the load. Consider that the scale factor of the voltage scaler is k, then the voltage that is received at the input of the ADC 3920 is then V_load×k, where V_load is the input to the voltage scaler that corresponds to the load voltage, V_load.

In certain implementations, it may be desirable to amplify or attenuate the load voltage, V_load, before performing digital sampling on it to generate a data out (digital) signal. For example, in particular implementation of the ADC 3920 may be better suited to perform digital sampling of a voltage signal within a particular range, and appropriate amplification or attenuation of the load voltage, V_load, may be performed to ensure that the input signal to the ADC 3920 is within that particular range to facilitate more efficient operation and better accuracy of the ADC 3920 when performing digital sampling to generate a data out (digital) signal.

In certain examples, one or more processing modules 42 is configured to process the data out (digital) signal. Such processing by the one or more processing modules 42 includes determining the impedance of the load, Z_load, based on information regarding the known sinusoidal current reference signal, Iref, and the detected and digitally sampled load voltage, V_load, and/or a scaled version thereof, which corresponds to the data out (digital) signal.

Figure 41:
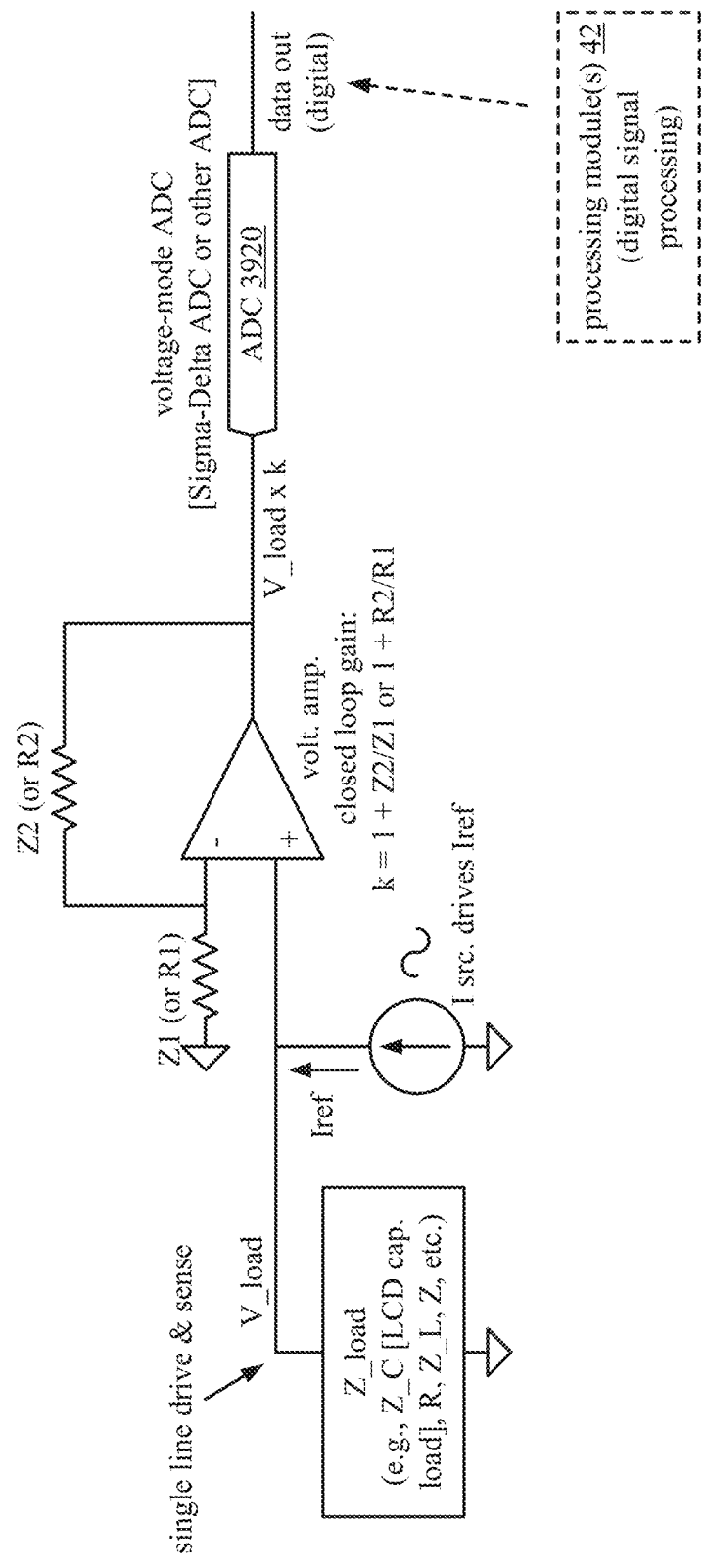
FIG. 41 is a schematic block diagram of another embodiment of a drive sense circuit in accordance with the present invention.

FIG. 41 is a schematic block diagram of another embodiment 4100 of a drive sense circuit in accordance with the present invention. This diagram has similarities to certain previous diagrams in that a current source provides a sinusoidal current reference signal, Iref, to the load and is thereby configured to generate a load voltage, V_load, is that generated based on the impedance of the load, Z_load, and the sinusoidal current reference signal, Iref, that is provided from the current source.

However, this diagram also includes a different implementation of a voltage amplifier. This diagram includes a voltage amplifier having impedance (e.g., which may be purely resistive in certain examples). For example, consider an operational amplifier that is implemented with negative feedback to generate an amplified voltage signal V_load×k, based on V_load being the input to the voltage amplifier. Consider an implementation of a non-inverting op amp circuit. The closed loop gain (e.g., Vout/Vin of the op amp) is 1+Z2/Z1 or 1+R2/R1. For example, to achieve a gain of 20 using such a noninverting op amp circuit, and considering a purely resistive implementation, selecting resistor values of R2=19 kilo-Ohms and R1=1 kilo-Ohms, would achieve the desired gain of 20. Generally speaking, any desired gain may be achieved by appropriately selecting the resistor values for such a noninverting op amp circuit.

In certain examples, one or more processing modules 42 is configured to process the data out (digital) signal. Such processing by the one or more processing modules 42 includes determining the impedance of the load, Z_load, based on information regarding the known sinusoidal current reference signal, Iref, and the detected and digitally sampled load voltage, V_load, and/or a scaled version thereof, which corresponds to the data out (digital) signal.

FIG. 42 is a schematic block diagram of another embodiment 4200 of a drive sense circuit in accordance with the present invention. This diagram has similarities to certain previous diagrams in that a current source provides a sinusoidal current reference signal, Iref, to the load and is thereby configured to generate a load voltage, V_load, is that generated based on the impedance of the load, Z_load, and the sinusoidal current reference signal, Iref, that is provided from the current source.

However, this diagram also includes a transimpedance amplifier that is configured to convert the load voltage, V_load, to a current signal, I, that is based on the load voltage, V_load. For example, a voltage to current converter circuit (V to I) is configured to convert the load voltage, V_load, to a current signal, I, that may be a scaled representation of the load voltage, V_load. This current signal, I, is then provided to an ADC 3910. Note that the ADC 3910 is implemented as a current-mode ADC in this diagram. Note that the ADC 3910 may be implemented as a sigma delta ADC or some other type of ADC in other alternative implementations. Also, within this diagram, the output of the transimpedance amplifier is a current signal, I, not a voltage signal. As such, the ADC 3910 is implemented as a current-mode ADC that is configured to generate a digital signal based on digital sampling of a current signal thereby generating a data out (digital) signal.

In certain examples, one or more processing modules 42 is configured to process the data out (digital) signal. Such processing by the one or more processing modules 42 includes determining the impedance of the load, Z_load, based on information regarding the known sinusoidal current reference signal, Iref, and the detected and digitally sampled current signal, I, that is provided to the ADC 3910, and/or a scaled version thereof, which is based on the load voltage, V_load, and corresponds to the data out (digital) signal.

In certain implementations shown in previous diagrams, there may occur a situation in which the DC voltage of the load is not well regulated. In certain instances, this can cause issues with a voltage-mode ADC. For example, if the DC voltage of the load varies (e.g., more than 0.1%, 0.2%, 0.5%, 1%, 2%, 5%, or varies by some other amount), there can be instances in which a voltage-mode ADC will not operate well. For example, the performance and operation of such a voltage-mode ADC may be adversely affected based on variation of the DC voltage of the load.

Certain of the following diagrams include various alternative configurations that operate to facilitate regulation of the DC voltage of the load in one or more ways. For example, in some implementations, a high-impedance load voltage regulator is implemented to facilitate regulation of the DC voltage of the load. In certain examples, such a high-impedance load voltage regulator operates to perform regulation of the DC voltage of the load without adversely affecting the generation of the load voltage, V_load, based on the sinusoidal current reference signal, Iref, that is provided to the load from the current source. That is to say, the input impedance of the load voltage regulator is such that it does not significantly affect the value of the load voltage, V_load, based on the sinusoidal current reference signal, Iref, that is provided to the load from the current source.

In other implementations, a very large resistor (e.g., 100 kilo-ohms, 200 kilo-ohms, 500 kilo-ohms, 1 mega-ohms, 2 mega-ohms, 5 mega-ohms, etc.) is implemented to facilitate regulation of the DC voltage of the load. For example, a DC reference voltage is provided to one end of the very large resistor, and the other end of the very large resister is connected to the node that connects to the load.

In even other implementations, the voltage of the load undergoes low pass filtering to determine the DC voltage of the load, and DC voltage of the load is then used to determine an amount of current to be driven as feedback to maintain the load voltage, V_load, to ensure that the DC voltage of the load is same as a DC reference voltage. Note that such load voltage regulation may be implemented using any one or more of a variety of different configurations. For example, consider that a transit beams amplifier is implemented with a low pass filter (LPF) in a feedback loop. This can be used to regulate the DC load voltage to a DC reference voltage. The low pass filter (LPF) is configured to reject any sinusoidal components within the load voltage, V_load, thereby retaining only the DC load voltage. The transimpedance amplifier is configured to compare the DC load voltage that is output from the low pass filter (LPF) to generate a current signal that is driven as feedback to maintain the load voltage, V_load, to ensure that the DC voltage of the load is same as a DC reference voltage.

FIG. 43A is a schematic block diagram of another embodiment 4301 of a drive sense circuit in accordance with the present invention. In this diagram, a high impedance voltage regulator is connected to the node that connects to the voltage source and the load and that also serves as an input to and ADC 3920. In these implementations, the ADC 3920 is implemented as a voltage-mode ADC. Again, note that the ADC 3920 may be implemented as a sigma delta ADC or some other type of ADC including general-purpose ADC. A DC reference voltage signal is also provided to the high impedance voltage regulator. This DC reference voltage signal is the basis at which the DC voltage at the load is maintained by the high impedance voltage regulator. In certain examples, the load voltage, V_load, will be primarily AC in nature, though it may have some DC component. The high impedance voltage regulator is configured to ensure the value of the DC component of the load voltage, V_load, to a particular value.

In an example of operation and implementation, the high impedance voltage regulator is configured to sense the DC component of the load voltage, V_load. For example, if there is any DC component within the sinusoidal current reference signal, Iref, that is provided to the load from the current source, and considering the load to be a capacitive type load (e.g., an LCD load or other type of capacitive load), the sinusoidal current reference signal, Iref, will operate to facilitate charging of that capacitive load and thereby provide DC voltage to the system. Over time, such a sinusoidal current reference signal, Iref, if it has a DC component, can, in some instances, saturate the DC component of the load voltage, V_load, to be the supply voltage of the system (e.g., Vdd, Vss, or some other supply voltage). The high impedance voltage regulator is configured to regulate the DC component of the load voltage, V_load, to a particular value. For example, consider that the high impedance voltage regulator is configured to operate based on a DC reference voltage that is provided to it, then the high impedance voltage regulator is configured to maintain the load voltage, V_load, to ensure that the DC voltage of the load is same as a DC reference voltage. The high impedance voltage regulator operates to force the DC component of the load voltage, V_load, to the same as the DC reference voltage. By doing this, the high impedance fault it regulator is configured to ensure that the DC component of the load voltage, V_load, will not go to the supply voltage of the system (e.g., Vdd, Vss, or some other supply voltage). The DC component of the load voltage, V_load, and considering the load to be a capacitive type load, then the DC component of the load voltage, V_load, will remain the same as the DC reference voltage. Note that the AC component of the load voltage, V_load, will be able to pass through as input to the ADC 3920, but not the DC component of the load voltage, V_load.

In certain examples, one or more processing modules 42 is configured to process the data out (digital) signal. Such processing by the one or more processing modules 42 includes determining the impedance of the load, Z_load, based on information regarding the known sinusoidal current reference signal, Iref, and the detected and digitally sampled load voltage, V_load, and/or a scaled version thereof, which corresponds to the data out (digital) signal.

FIG. 43B is a schematic block diagram of another embodiment 4302 of a drive sense circuit in accordance with the present invention. This diagram has similarities to certain previous diagrams in that a current source provides a sinusoidal current reference signal, Iref, to the load and is thereby configured to generate a load voltage, V_load, is that generated based on the impedance of the load, Z_load, and the sinusoidal current reference signal, Iref, that is provided from the current source.

However, in this diagram, a very large resistor, R, is implemented in place of the high impedance voltage regulator of the previous diagram. Examples of such a very large resistor, R, may include a resistor having a value of 10 kilo-Ohms, 100 kilo-Ohms, 1 mega-Ohms, 10 mega-Ohms, etc. generally speaking, other high impedance valued resistors may alternatively be used. In an example of operation and implementation, if there is no DC current flowing through this very large resistor, R, then there will be no DC voltage drop across that very large resistor, R, and the DC component of the load voltage, V_load, will be same as the DC reference voltage thereby regulating the DC component of the load voltage, V_load, to a particular value. In certain applications, this particular implementation of using a very large resistor, R, is preferable to facilitate improved operation including reduction of complexity, cost, etc. of the overall circuit.

Also, even if there is a small DC component in the sinusoidal current reference signal, Iref, then that small DC component will flow through the very large resistor, R, and the voltage drop across the very large resistor, R, will be very small, and the overall circuit will still be able to maintain the DC component of the load voltage, V_load, to be very close to the DC reference voltage thereby regulating the DC component of the load voltage, V_load, to a particular value. For example, consider the DC component in the sinusoidal current reference signal, Iref, to be one micro amp, and consider the very large resistor, R, have a value of 10 kilo-Ohms, then this will cause a 10 mV drop across the 10 kilo-Ohms resistor. As such, then the DC component of the load voltage, V_load, will be 10 mV less or more than the DC reference voltage. This depends on the clarity of the DC component within the sinusoidal current reference signal, Iref. In certain examples, a voltage difference between the DC component of the load voltage, V_load, and the DC reference voltage is tolerable. For example, consider a 10 mV or 100 mV or some other small voltage difference. In certain moment take in, such a small voltage difference can be tolerated while still providing for effective operation of the overall circuit including digital sampling of the load voltage, V_load, by the ADC 3920.

In certain examples, one or more processing modules 42 is configured to process the data out (digital) signal. Such processing by the one or more processing modules 42 includes determining the impedance of the load, Z_load, based on information regarding the known sinusoidal current reference signal, Iref, and the detected and digitally sampled load voltage, V_load, and/or a scaled version thereof, which corresponds to the data out (digital) signal.

Figure 44:
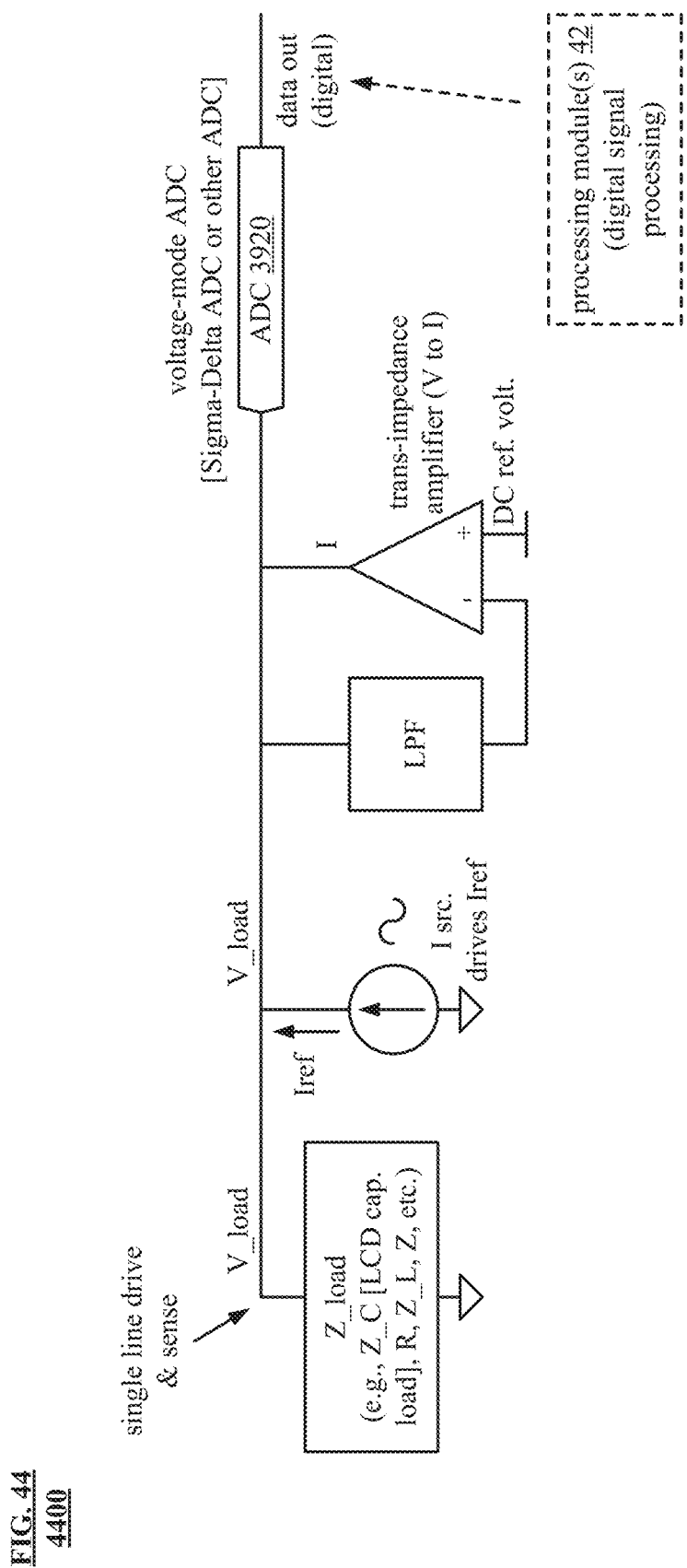
FIG. 44 is a schematic block diagram of another embodiment of a drive sense circuit in accordance with the present invention.

FIG. 44 is a schematic block diagram of another embodiment 4400 of a drive sense circuit in accordance with the present invention. This diagram has similarities to certain previous diagrams in that a current source provides a sinusoidal current reference signal, Iref, to the load and is thereby configured to generate a load voltage, V_load, is that generated based on the impedance of the load, Z_load, and the sinusoidal current reference signal, Iref, that is provided from the current source.

However, in this diagram, a low pass filter (LPF) is configured to sense the DC component of the load voltage, V_load. In certain examples, the load voltage, V_load, will be primarily AC in nature, though it may have some DC component. The LPF is configured to output the DC component of the load voltage, V_load, when it is present. A trans-impedance amplifier is configured to receive this DC component of the load voltage, V_load, and also DC reference voltage and to compare them. Based on the comparison of the DC component of the load voltage, V_load, to the DC reference voltage, the transimpedance amplifier is configured to drive a current signal, I, that is based on the difference between the DC component of the load voltage, V_load, and the DC reference voltage. For example, a voltage to current converter circuit (V to I) is configured to convert the difference between the DC component of the load voltage, V_load, and the DC reference voltage, to a current signal, I, that may be a scaled representation of the difference between the DC component of the load voltage, V_load, and the DC reference voltage. By providing this current signal, I, the DC component of the load voltage, V_load, is maintained to be the same as the DC reference voltage.

In an example of operation and implementation, such a transimpedance amplifier in operation with an LPF any feedback loop is configured to regulate the DC component of the load voltage, V_load, to be same as ADC reference voltage that is also provided to the transimpedance amplifier. The LPF is configured to reject all of the AC component in the load voltage, V_load, and to retain only the DC component of the load voltage, V_load. The transimpedance amplifier is configured to compare the DC component of the load voltage, V_load, that is output from the LPF to the DC reference voltage and to correct for any DC component of the load voltage, V_load, by supplying a current signal, I, that is operative to ensure that the DC component of the load voltage, V_load, is maintained to be the same as the DC reference voltage.

In certain examples, one or more processing modules 42 is configured to process the data out (digital) signal. Such processing by the one or more processing modules 42 includes determining the impedance of the load, Z_load, based on information regarding the known sinusoidal current reference signal, Iref, and the detected and digitally sampled load voltage, V_load, and/or a scaled version thereof, which corresponds to the data out (digital) signal.

In addition, note that while many examples provided herein include a sinusoidal current reference signal, Iref, or a sinusoidal voltage reference signal, Vref, note that alternative implementations may be made using non-sinusoidal signals for the current reference signal, Iref, and/or voltage reference signal, Vref. Generally speaking, the reference signals may be implemented using any desired type of signal including waveform type, frequency, phase, shape, and/or other characteristics as well. For example, instead of a sinusoidal signal, in alternative implementations, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component) is employed for the current reference signal, Iref, and/or voltage reference signal, Vref.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A current reference operative drive-sense circuit (DSC) comprising:
   a current source operably coupled to a load, wherein when enabled, the current source configured to drive a sinusoidal current reference signal to the load thereby generating a load voltage that is based on the sinusoidal current reference signal and an impedance of the load; and
   a voltage-mode analog to digital converter (ADC) operably coupled the load and to the current source, wherein when enabled, the voltage-mode ADC configured to perform digital sampling of the load voltage and to generate a digital signal that is representative of the load voltage.

2. The current reference operative DSC of claim 1, wherein the voltage-mode ADC is a sigma delta ADC.

3. The current reference operative DSC of claim 1, wherein the load voltage is a product of the sinusoidal current reference signal multiplied by the impedance of the load.

4. The current reference operative DSC of claim 1 further comprising:
   memory that stores operational instructions; and
   one or more processing modules operably coupled to the voltage-mode ADC and to the memory, wherein, when enabled, the one or more processing modules configured to execute the operational instructions to:
      process the digital signal that is representative of the load voltage to determine the load voltage; and
      determine the impedance of the load based on the load voltage and the sinusoidal current reference signal.

5. The current reference operative DSC of claim 1, wherein the load is a liquid crystal display (LCD) capacitive load.

6. The current reference operative DSC of claim 1, wherein the load is a sensor or an actuator.

7. The current reference operative DSC of claim 1, wherein the load is a touch screen capacitive load.

8. The current reference operative DSC of claim 7, wherein user interaction with the touch screen capacitive load causes a change of the impedance of the touch screen capacitive load.

9. The current reference operative DSC of claim 1, a change of the impedance of the load causes a change of the load voltage.

10. The current reference operative DSC of claim 9 further comprising:
    memory that stores operational instructions; and
    one or more processing modules operably coupled to the voltage-mode ADC and to the memory, wherein, when enabled, the one or more processing modules configured to execute the operational instructions to:
       before the change of the impedance of the load, process the digital signal that is representative of the load voltage to determine a first value of load voltage;
       after the change of the impedance of the load, process the digital signal that is representative of the load voltage to determine a second value of load voltage that is based on the change of the impedance of the load; and
       determine the change of the impedance of the load based on the first value of load voltage, the second value of load voltage, and the sinusoidal current reference signal.

11. A current reference operative drive-sense circuit (DSC) comprising:
    a current source operably coupled to a load, wherein when enabled, the current source configured to drive a sinusoidal current reference signal to the load thereby generating a load voltage that is based on the sinusoidal current reference signal and an impedance of the load;
    a voltage-mode sigma delta analog to digital converter (ADC) operably coupled the load and to the current source, wherein when enabled, the voltage-mode sigma delta ADC configured to perform digital sampling of the load voltage and to generate a digital signal that is representative of the load voltage;
    memory that stores operational instructions; and
    one or more processing modules operably coupled to the voltage-mode sigma delta ADC and to the memory, wherein, when enabled, the one or more processing modules configured to execute the operational instructions to:
       process the digital signal that is representative of the load voltage to determine the load voltage; and
       determine the impedance of the load based on the load voltage and the sinusoidal current reference signal.

12. The current reference operative DSC of claim 11, wherein the load voltage is a product of the sinusoidal current reference signal multiplied by the impedance of the load.

13. The current reference operative DSC of claim 11, wherein the load is a sensor or an actuator.

14. The current reference operative DSC of claim 11, a change of the impedance of the load causes a change of the load voltage.

15. The current reference operative DSC of claim 14, wherein, when enabled, the one or more processing modules is further configured to execute the operational instructions to:
    before the change of the impedance of the load, process the digital signal that is representative of the load voltage to determine a first value of load voltage;
    after the change of the impedance of the load, process the digital signal that is representative of the load voltage to determine a second value of load voltage that is based on the change of the impedance of the load; and
    determine the change of the impedance of the load based on the first value of load voltage, the second value of load voltage, and the sinusoidal current reference signal.

16. A current reference operative drive-sense circuit (DSC) comprising:
    a current source operably coupled to a touch screen capacitive load, wherein when enabled, the current source configured to drive a sinusoidal current reference signal to the touch screen capacitive load thereby generating a load voltage that is based on the sinusoidal current reference signal and an impedance of the touch screen capacitive load;
    a voltage-mode analog to digital converter (ADC) operably coupled the touch screen capacitive load and to the current source, wherein when enabled, the voltage-mode ADC configured to perform digital sampling of the load voltage and to generate a digital signal that is representative of the load voltage;
    memory that stores operational instructions; and one or more processing modules operably coupled to the voltage-mode ADC and to the memory, wherein, when enabled, the one or more processing modules configured to execute the operational instructions to:
process the digital signal that is representative of the load voltage to determine the load voltage; and
determine the impedance of the touch screen capacitive load based on the load voltage and the sinusoidal current reference signal.

17. The current reference operative DSC of claim 16, wherein the load voltage is a product of the sinusoidal current reference signal multiplied by the impedance of the touch screen capacitive load.

18. The current reference operative DSC of claim 16, wherein user interaction with the touch screen capacitive load causes a change of the impedance of the touch screen capacitive load.

19. The current reference operative DSC of claim 16, a change of the impedance of the touch screen capacitive load causes a change of the load voltage.

20. The current reference operative DSC of claim 19, wherein, when enabled, the one or more processing modules is further configured to execute the operational instructions to:
before the change of the impedance of the touch screen capacitive load, process the digital signal that is representative of the load voltage to determine a first value of load voltage;
after the change of the impedance of the touch screen capacitive load, process the digital signal that is representative of the load voltage to determine a second value of load voltage that is based on the change of the impedance of the touch screen capacitive load; and
determine the change of the impedance of the touch screen capacitive load based on the first value of load voltage, the second value of load voltage, and the sinusoidal current reference signal.

\* \* \* \* \*